US011152524B2

United States Patent
Oh et al.

(10) Patent No.: US 11,152,524 B2
(45) Date of Patent: Oct. 19, 2021

(54) SOLAR CELL PANEL, AND APPARATUS AND METHOD FOR ATTACHING INTERCONNECTOR OF A SOLAR CELL PANEL

(71) Applicant: LG ELECTRONICS INC., Seoul (KR)

(72) Inventors: Donghae Oh, Seoul (KR); Jinsung Kim, Seoul (KR); Dongju Kang, Seoul (KR); Jangho Kim, Seoul (KR); Woojoong Kang, Seoul (KR); Kyuhyeok Sim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/781,462

(22) Filed: Feb. 4, 2020

(65) Prior Publication Data
US 2020/0227580 A1  Jul. 16, 2020

Related U.S. Application Data

(62) Division of application No. 15/353,398, filed on Nov. 16, 2016, now Pat. No. 10,586,882.

(30) Foreign Application Priority Data

Nov. 17, 2015 (KR) .................. 10-2015-0161009
Dec. 23, 2015 (KR) .................. 10-2015-0184583

(51) Int. Cl.
*H01L 31/05* (2014.01)
*H01L 31/02* (2006.01)
(Continued)

(52) U.S. Cl.
CPC .... *H01L 31/0508* (2013.01); *H01L 21/67138* (2013.01); *H01L 31/02008* (2013.01);
(Continued)

(58) Field of Classification Search
CPC .............. H01L 31/0508; Y10T 29/417; Y10T 29/49355
See application file for complete search history.

(56) References Cited

U.S. PATENT DOCUMENTS 2,999,654 A   9/1961  Fuller
5,151,373 A   9/1992  Deguchi et al.
(Continued)

FOREIGN PATENT DOCUMENTS

CN   102939667 A    2/2013
CN   104137271 A   11/2014
(Continued)

OTHER PUBLICATIONS

English translation CN103946993 (Year: 2014).*
(Continued)

*Primary Examiner* — Jason L Vaughan
*Assistant Examiner* — Amanda Kreiling
(74) *Attorney, Agent, or Firm* — Birch, Stewart, Kolasch & Birch, LLP

(57) ABSTRACT

An apparatus for attaching an interconnector of a solar cell panel, includes an interconnector supply unit for unwinding the interconnector wound around a winding roll and moving the interconnector in a processing direction; and an attachment unit for attaching the interconnector to a solar cell, wherein the interconnector supply unit includes the winding roll, around which the interconnector is wound; and an unwinding control member for unwinding the interconnector from the winding roll, and wherein the unwinding control member allows the interconnector to be unwound so as to pass through one end of the winding roll in a longitudinal direction.

15 Claims, 26 Drawing Sheets

(51) Int. Cl.
*H01L 21/67* (2006.01)
*H01L 31/18* (2006.01)
(52) U.S. Cl.
CPC ........ *H01L 31/0504* (2013.01); *H01L 31/188* (2013.01); *Y02E 10/50* (2013.01)

(56) References Cited

U.S. PATENT DOCUMENTS

| | | | |
|---|---|---|---|
| 2010/0000602 A1 | 1/2010 | Gray et al. | |
| 2010/0078073 A1 | 4/2010 | Krause et al. | |
| 2013/0164863 A1 | 6/2013 | Miyake et al. | |

FOREIGN PATENT DOCUMENTS

| | | | | |
|---|---|---|---|---|
| CN | 104919603 A | | 9/2015 | |
| EP | 2224493 A2 | | 9/2010 | |
| EP | 2924740 A1 | | 9/2015 | |
| FR | 464914 A | * | 4/1914 | ............ B65H 57/18 |
| JP | 41-1399 | | 2/1966 | |
| JP | 47-28732 U | | 12/1972 | |
| JP | 47-48793 B | | 12/1972 | |
| JP | 49-4083-01 U | | 1/1974 | |
| JP | 57-25421 U | | 2/1982 | |
| JP | 59-169028 U | | 11/1984 | |
| JP | 2-115362 U | | 9/1990 | |
| JP | 6-63547 U | | 9/1994 | |
| JP | 10-279179 A | | 10/1998 | |
| JP | 2006-49666 A | | 2/2006 | |
| JP | 2007-173618 A | | 7/2007 | |
| JP | 2007-173619 A | | 7/2007 | |
| JP | 2009-164212 A | | 7/2009 | |
| JP | 2011-181779 A | | 9/2011 | |
| JP | 2013-541205 | | 11/2013 | |
| KR | 10-2014-0040844 A | | 4/2014 | |
| KR | 10-2016-0049450 A | | 5/2016 | |
| WO | WO 2012/029813 A1 | | 3/2012 | |
| WO | WO 2012/111185 A1 | | 8/2012 | |
| WO | WO 2013/077111 A1 | | 5/2013 | |
| WO | WO-2013077111 A1 | * | 5/2013 | ............ H01L 31/05 |
| WO | WO 2016/068487 A1 | | 5/2016 | |

OTHER PUBLICATIONS

English Translation FR464914 (Year: 1914).*
English translation CN 103346393 (Year: 2013).
Kang et al. (Year: 2014).

* cited by examiner

FIG. 11
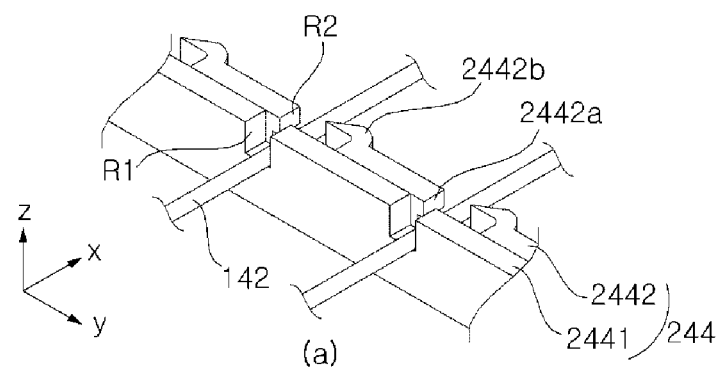
(a)
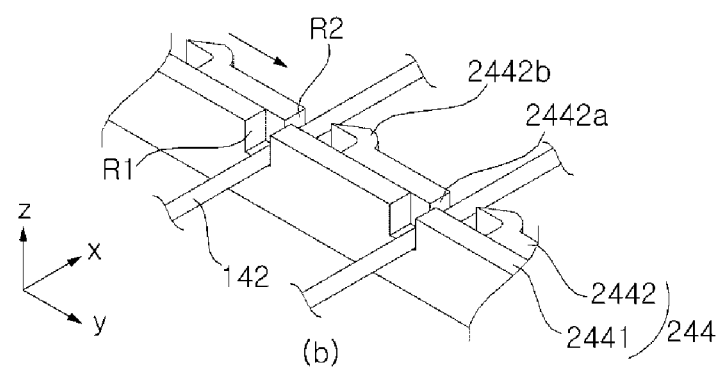
(b)
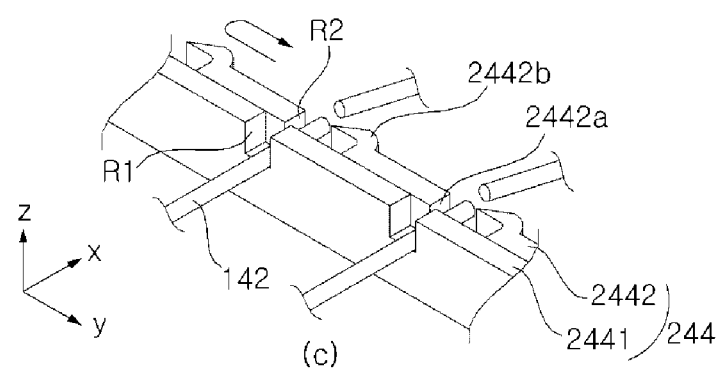
(c)

FIG. 25
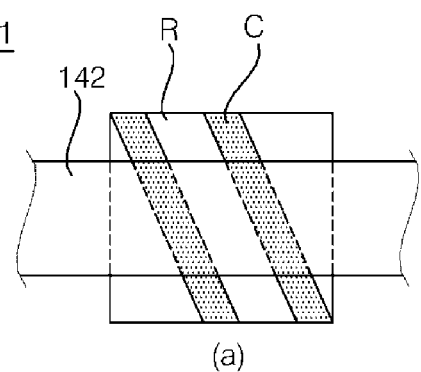
(a)
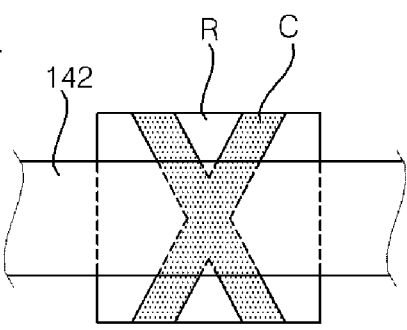
(b)
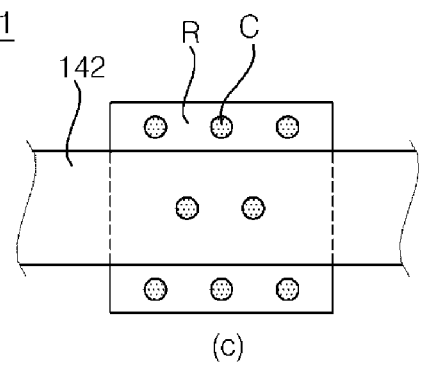
(c)
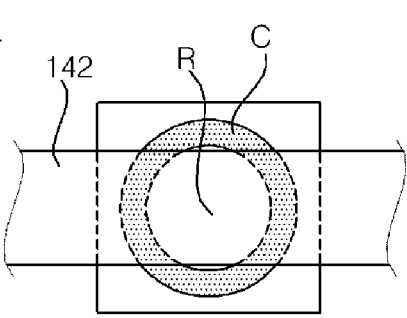
(d)

SOLAR CELL PANEL, AND APPARATUS AND METHOD FOR ATTACHING INTERCONNECTOR OF A SOLAR CELL PANEL

CROSS-REFERENCE TO RELATED APPLICATIONS

This application is a Divisional of U.S. patent application Ser. No. 15/353,398, filed on Nov. 16, 20016, which claims the priority benefit of Korean Patent Applications No. 10-2015-0161009, filed on Nov. 17, 2015 and No. 10-2015-0184583, filed on Dec. 23, 2015 in the Korean Intellectual Property Office, all of these applications are incorporated herein by reference into the present application.

BACKGROUND OF THE INVENTION

Field of the Invention

The present inventive concept relates to a solar cell panel, and an apparatus and a method for attaching interconnectors of a solar cell panel, and more particularly, to a solar cell panel having interconnectors that interconnect a plurality of solar cells, and an apparatus and a method for attaching interconnectors of a solar cell panel.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

A plurality of solar cells are connected to each other in series or in parallel using ribbons, and are manufactured into a solar cell panel via packaging, which is a process for protecting the solar cells. The solar cell panel needs to perform electricity generation for a long term in various environments, thus requiring considerable long-term reliability. At this time, the solar cells are conventionally connected to one another using the ribbons.

However, an apparatus and method for attaching the ribbons may be complex, thus causing deterioration in productivity. In addition, when interconnectors, which have a structure that is different from that of the ribbons, are used instead of the ribbons, no apparatus or method for attaching the interconnectors has been proposed.

SUMMARY OF THE INVENTION

Therefore, the present inventive concept has been made in view of the above problems, and it is one object of the present inventive concept to provide an apparatus and method for attaching interconnectors of solar cell panels, which may improve productivity by attaching the interconnectors to solar cells using an automated system.

It is another object of the present inventive concept to provide a solar cell panel having stability and reliability.

According to an aspect of the present inventive concept, the above and other objects can be accomplished by the provision of a method for attaching an interconnector of a solar cell panel, the method including moving the interconnector, unwound from a winding roll, in a processing direction, and attaching the interconnector to a solar cell. In the moving, the interconnector, which is wound around the winding roll, is unwound so as to pass through one end of the winding roll in a longitudinal direction.

According to an aspect of the present inventive concept, there is provided an apparatus for attaching an interconnector of a solar cell panel, the apparatus including an interconnector supply unit for unwinding the interconnector wound around a winding roll and moving the interconnector in a processing direction, and an attachment unit for attaching the interconnector to a solar cell. The interconnector supply unit includes the winding roll, around which the interconnector is wound, and an unwinding control member for unwinding the interconnector from the winding roll. The unwinding control member allows the interconnector to be unwound so as to pass through one end of the winding roll in a longitudinal direction.

According to a an aspect of the present inventive concept, there is provided a solar cell panel including a plurality of solar cells each including a photoelectric converter and first and second electrodes connected to the photoelectric converter, and a plurality of interconnectors for interconnecting the first electrode of one solar cell among the solar cells and the second electrode of a neighboring solar cell. Each electrode includes a plurality of finger lines formed in a first direction so as to be parallel to one another, and six or more bus-bar lines formed in a second direction crossing the first direction. The interconnectors have a diameter or width ranging from 250 um to 500 um and are connected to the bus-bar lines so that six or more interconnectors are arranged on one surface of each solar cell. Each of the interconnectors has a yield strength of 110 MPa or less.

BRIEF DESCRIPTION OF THE DRAWINGS

The above and other objects, features and other advantages of the present inventive concept will be more clearly understood from the following detailed description taken in conjunction with the accompanying drawings, in which:

FIG. 11 is a view illustrating an operation of a cutter included in the interconnector attachment apparatus of FIG. 6;

FIG. 25 is a side view illustrating the first contact portion and the interconnector in the interconnector attachment apparatus for the solar cell panel according to various alternative embodiments of the present inventive concept.

DETAILED DESCRIPTION OF THE PREFERRED EMBODIMENTS

Figure 1:
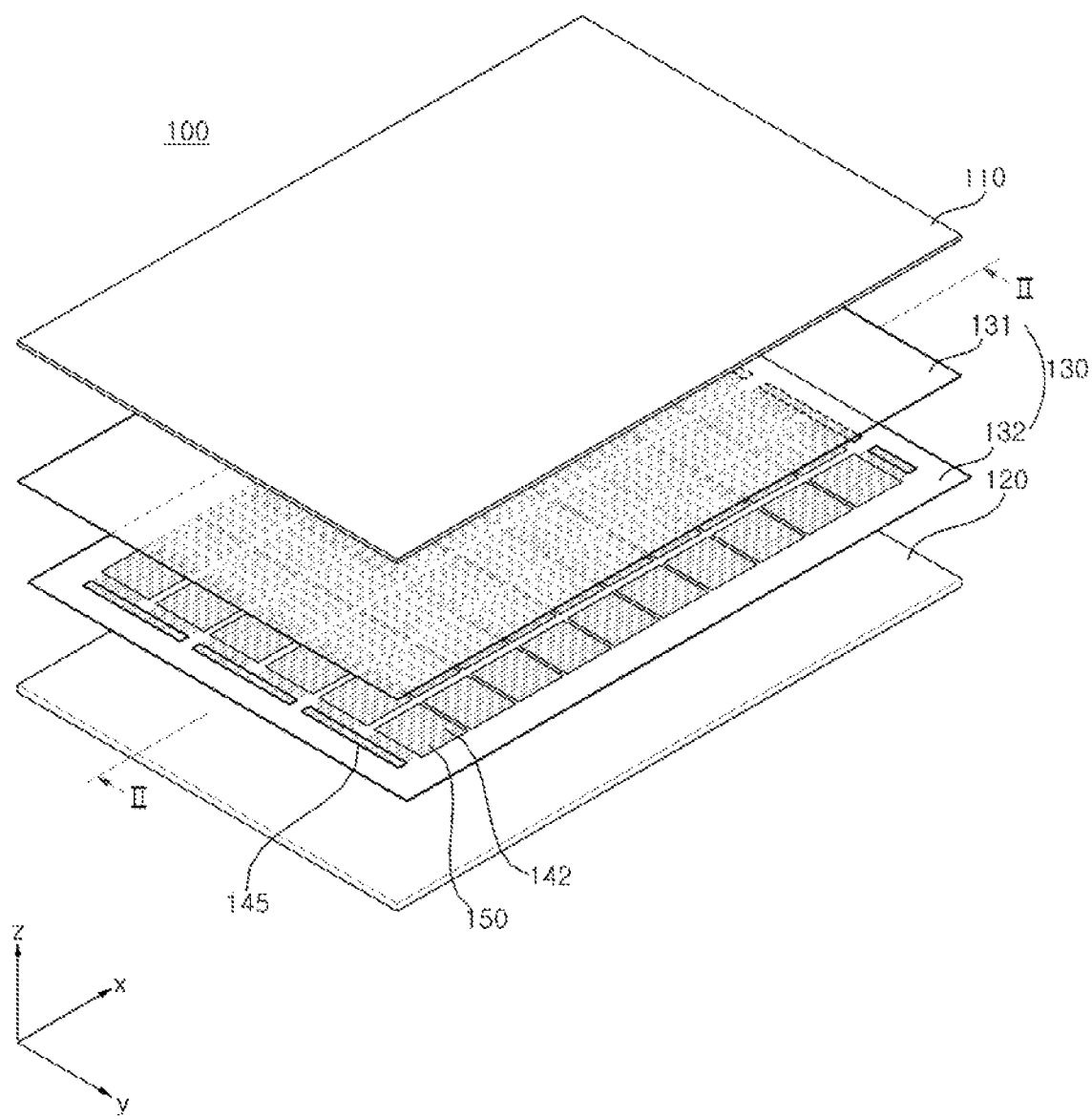
FIG. 1 is a perspective view illustrating a solar cell panel according to an embodiment of the present inventive concept.

Reference will now be made in detail to the embodiments of the present inventive concept, examples of which are illustrated in the accompanying drawings. However, it will be understood that the present inventive concept should not be limited to the embodiments and may be modified in various ways.

In the drawings, to clearly and briefly explain the present inventive concept, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the present inventive concept are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell panel, and an apparatus and method for attaching interconnectors for a solar cell panel according to an embodiment of the present inventive concept will be described with reference to the accompanying drawings. For clear description, a solar cell panel, which includes interconnectors attached by the apparatus and method for attaching interconnectors for the solar cell panel according to the present embodiment, will first be described, and thereafter, the apparatus and method for attaching interconnectors for the solar cell panel according to the present embodiment will be described. In the following description, the terms "first", "second", etc. are merely used in order to distinguish elements from each other, and the present inventive concept is not limited thereto.

Figure 2:
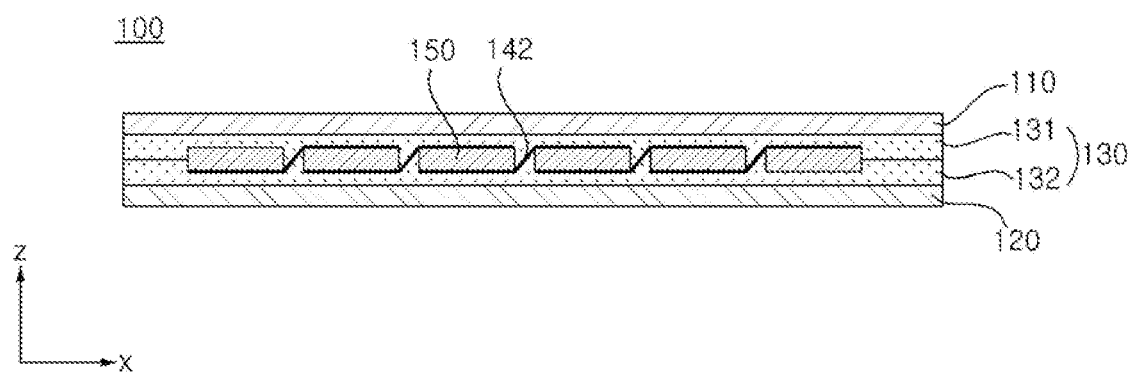
FIG. 2 is a sectional view taken along line II-II of FIG. 1.

FIG. 1 is a perspective view illustrating a solar cell panel according to an embodiment of the present inventive concept, and FIG. 2 is a sectional view taken along line II-II of FIG. 1.

Referring to FIGS. 1 and 2, the solar cell panel according to the present embodiment, designated by reference numeral 100, includes a plurality of solar cells 150 and interconnectors 142 for electrically interconnecting the solar cells 150. In addition, the solar cell panel 100 includes a sealing member 130 for surrounding and sealing the solar cells 150 and the interconnectors 142 for interconnecting the solar cells 150, a front substrate 110 disposed on the front surface of the solar cells 150 above the sealing member 130, and a back substrate 120 disposed on the back surface of the solar cells 150 above the sealing member 130. This will be described below in more detail.

First, each of the solar cells 150 may include a photoelectric converter for converting sunlight into electrical energy, and an electrode electrically connected to the photoelectric converter for collecting and transferring current. The solar cells 150 may be electrically interconnected in series and/or in parallel by the interconnectors 142. Specifically, the interconnectors 142 may electrically interconnect two neighboring solar cells 150 among the solar cells 150.

In addition, bus ribbons 145 interconnect alternate ends of the interconnectors 142, which interconnect the solar cells 150 in columns (in other words, solar cell strings). The bus ribbons 145 may be located on the ends of the solar cell strings so as to cross the solar cell strings. The bus ribbons 145 may interconnect the solar cell strings adjacent to each other, or may connect the solar cell string(s) to a junction box, which prevents the backflow of current. The material, shape, connection structure, and the like of the bus ribbons 145 may be altered in various ways, and the present inventive concept is not limited as to them.

The sealing member 130 may include a first sealing member 131 disposed on the front surface of the solar cells 150 interconnected by the interconnectors 142, and a second sealing member 132 disposed on the back surface of the solar cells 150. The first sealing member 131 and the second sealing member 132 prevent the introduction of moisture and oxygen, and realize a chemical bond between respective elements of the solar cell panel 100. The first and second sealing members 131 and 132 may be formed of an insulation material having light-transmissive and adhesive properties. In one example, the first sealing member 131 and the second sealing member 132 may be formed of ethylene vinyl acetate (EVA) copolymer resin, polyvinyl butyral, silicone resin, ester-based resin, or olefin-based resin. The back substrate 120, the second sealing member 132, the solar cells 150, the first sealing member 131, and the front substrate 110 may be integrated with one another so as to construct the solar cell panel 100 via, for example, a lamination process using the first and second sealing members 131 and 132.

The front substrate 110 is disposed on the first sealing member 131 and configures the front surface of the solar cell panel 100. The back substrate 120 is disposed on the second sealing member 132 and configures the back surface of the solar cell panel 100. Each of the front substrate 110 and the back substrate 120 may be formed of an insulation material capable of protecting the solar cells 150 from external shocks, moisture, ultraviolet light, and the like. In addition, the front substrate 110 may be formed of a light-transmitting material capable of transmitting light, and the back substrate 120 may be configured as a sheet formed of a light-transmitting material, a material not transmitting light, or a material reflecting light. In one example, the front substrate 110 may be configured as a glass substrate, and the back substrate 120 may be a Tedlar/PET/Tedlar (TPT) substrate, or may include a polyvinylidene fluoride (PVDF) resin layer formed on at least one surface of a base film (e.g. a polyethylene terephthlate (PET) film).

However, the present inventive concept is not limited thereto. Thus, the first and second sealing members 131 and 132, the front substrate 110, or the back substrate 120 may include any of various materials excluding the above-described materials, and may have any of various shapes. For example, the front substrate 110 or the back substrate 120 may have any of various shapes (e.g. a substrate, film, or sheet), or may include any of various materials.

An example of the solar cells and the interconnectors connected thereto, which are included in the solar cell panel according to the embodiment of the present inventive concept, will be described below in more detail with reference to FIG. 3.

Figure 3:
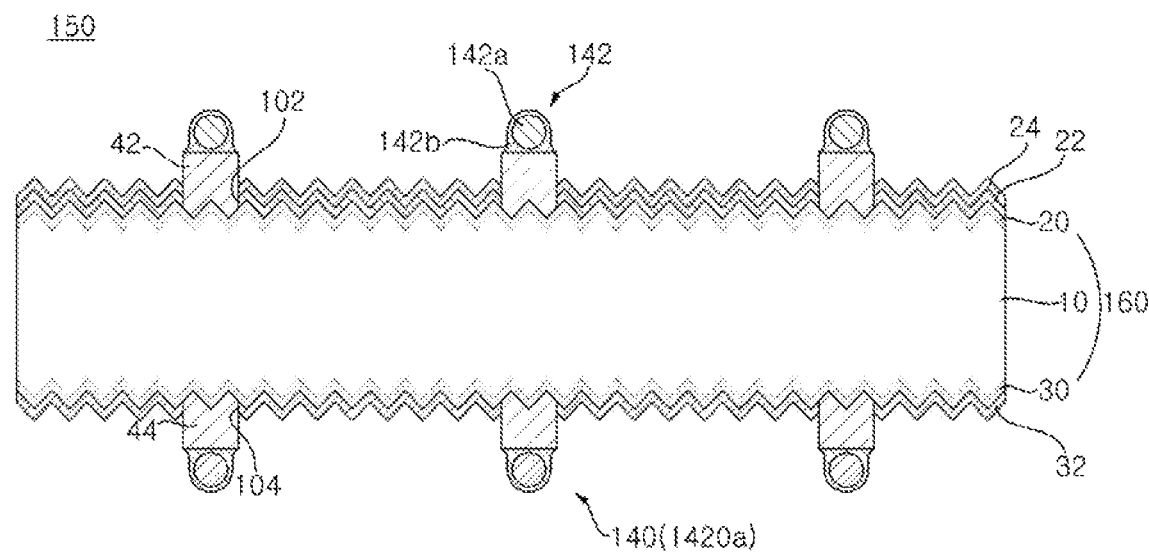
FIG. 3 is a partial sectional view illustrating an example of a solar cell and interconnectors connected thereto, which are included in the solar cell panel of FIG. 1.

FIG. 3 is a partial sectional view illustrating an example of the solar cells and the interconnectors connected thereto, which are included in the solar cell panel of FIG. 1.

Referring to FIG. 3, each solar cell 150 includes a semiconductor substrate 160, conductive areas 20 and 30 formed on or over the semiconductor substrate 160, and electrodes 42 and 44 connected to the conductive areas 20 and 30. The conductive areas 20 and 30 may include a first conductive area 20 of a first conductive type and a second conductive area 30 of a second conductive type. The electrodes 42 and 44 may include a first electrode 42 connected to the first conductive area 20, and a second electrode 44 connected to the second conductive area 30. The solar cell 150 may further include, for example, first and second passivation films 22 and 32, and an anti-reflection film 24.

The semiconductor substrate 160 may be formed of crystalline semiconductors including a single semiconductor material (e.g. group-IV elements). In one example, the semiconductor substrate 160 may be formed of monocrystalline or polycrystalline semiconductors (e.g. monocrystalline or polycrystalline silicon). More particularly, the semiconductor substrate 160 may be formed of monocrystalline semiconductors (e.g. a monocrystalline semiconductor wafer, and for example, a monocrystalline silicon wafer). As such, the solar cell 150 is based on the semiconductor substrate 160, which is formed of monocrystalline semiconductors having high crystallinity and thus low defects. Accordingly, the solar cell 150 may have excellent electrical properties.

The front surface and/or the back surface of the semiconductor substrate 160 may be subjected to texturing so as to have protrusions. The protrusions may take the form of pyramids having irregular sizes, and the outer surface of the protrusions may be (111) faces of the semiconductor substrate 160. When the roughness of the front surface of the semiconductor substrate 160 is increased by the protrusions formed on the front surface via texturing, the reflectance of light introduced through the front surface of the semiconductor substrate 160 may be reduced. Accordingly, the quantity of light, which reaches the pn junction formed by a base area 10 and the first or second conductive area 20 or 30, may be increased, which may minimize shading loss. The present embodiment illustrates that protrusions are formed on each of the front surface and the back surface of the semiconductor substrate 160. However, the present inventive concept is not limited thereto. Accordingly, protrusions may be formed on at least one of the back surface and the front surface of the semiconductor substrate 160, and may not be formed on the front surface and the back surface of the semiconductor substrate 160.

In the present embodiment, the semiconductor substrate 160 includes the base area 10, which includes a first or second conductive dopant at a relatively low doping density, thus being of a first or second conductive type. At this time, the base area 10 of the semiconductor substrate 160 may have a lower doping density, higher resistance, or lower carrier density than one of the first and second conductive areas 20 and 30, which is of the same conductive type as the base area 10. In one example, in the present embodiment, the base area 10 may be of a second conductive type.

In addition, the semiconductor substrate 160 may include the first conductive area 20 and the second conductive area 30. In the present embodiment, the base area 10 and the conductive areas 20 and 30, which constitute the semiconductor substrate 160, have the crystalline structure of the semiconductor substrate 160, are of different conductive types, and have different doping densities. For example, an area of the semiconductor substrate 160, which includes a first conductive dopant and thus is of a first conductive type, may be defined as the first conductive area 20, an area of the semiconductor substrate 160, which includes a second conductive dopant at a low doping density and thus is of a second conductive type, may be defined as the base area 10, and an area of the semiconductor substrate 160, which includes the second conductive dopant at a higher doping density than that in the base area 10 and thus is of the second conductive type, may be defined as the second conductive area 30.

The first and second conductive areas 20 and 30 may be formed respectively throughout the front surface and the back surface of the semiconductor substrate 160. Here, "formed throughout" includes not only physically complete formation, but also formation with inevitably excluded parts. In this way, the first and second conductive areas 20 and 30 may be formed to have a sufficient area without separate patterning.

The first conductive area 20 may configure an emitter area, which forms a pn junction with the base area 10. The second conductive area 30 may configure a back-surface field area, which forms a back-surface field. The back-surface field area serves to prevent the loss of carriers due to recombination on the surface of the semiconductor substrate 160 (for example, the back surface of the semiconductor substrate 160).

In the present embodiment, the conductive areas 20 and 30 are doped areas, which are formed by doping some inner areas of the semiconductor substrate 160 with dopants, thus constituting a portion of the semiconductor substrate 160. However, the present inventive concept is not limited thereto. Accordingly, at least one of the first conductive area 20 and the second conductive area 30 may be configured as an amorphous, microcrystalline or polycrystalline semiconductor layer, which is a separate layer over the semiconductor substrate 160. Various other alterations are possible.

In addition, the present embodiment illustrates that the first conductive area 20 and the second conductive area 30 have a homogeneous structure having a uniform doping density. However, the present inventive concept is not limited thereto. Thus, in another embodiment, at least one of the first conductive area 20 and the second conductive area 30 may have a selective structure. In the selective structure, a portion of the conductive areas 20 and 30 proximate to the electrodes 42 and 44 may have a high doping density and low resistance, and the remaining portion may have a low doping density and high resistance. In another embodiment, the second conductive area 30 may have a local structure. In the local structure, the second conductive area 30 may be locally formed so as to correspond to a portion at which the second electrode 44 is formed.

The first conductive dopant, included in the first conductive area 20, may be an n-type or p-type dopant, and the second conductive dopant, included in the base area 10 and the second conductive area 30, may be a p-type or n-type dopant. The p-type dopant may be a group-III element, such as boron (B), aluminum (Al), gallium (Ga), or indium (In), and the n-type dopant may be a group-V element, such as phosphorus (P), arsenic (As), bismuth (Bi), or antimony (Sb). The second conductive dopant in the base area 10 and the second conductive dopant in the second conductive area 30 may be the same material, or may be different materials.

In one example, the first conductive area 20 may be of a p-type, and the base area 10 and the second conductive area 30 may be of an n-type. When light is emitted to the pn junction formed by the first conductive area 20 and the base area 10, electrons generated by photoelectric conversion move to the back surface of the semiconductor substrate 160 to thereby be collected by the second electrode 44, and holes move to the front surface of the semiconductor substrate 160 to thereby be collected by the first electrode 42. Thereby, electricity is generated. When holes, which move more slowly than electrons, move to the front surface of the semiconductor substrate 160, rather than the back surface, the conversion efficiency may be improved. However, the present inventive concept is not limited thereto, and the base area 10 and the second conductive area 30 may be of a p-type, and the first conductive area 20 may be of an n-type.

Insulation films, such as, for example, the first and second passivation films 22 and 32 and the anti-reflection film 24, may be formed over the surfaces of the semiconductor substrate 160. The insulation films may be configured as undoped insulation films, which include no dopant.

For example, the first passivation film 22 may be formed over (e.g. in contact with) the front surface of the semiconductor substrate 160, for example, over the first conductive area 20 formed on the semiconductor substrate 160, and the anti-reflection film 24 may be formed over (e.g. in contact with) the first passivation film 22. In addition, the second passivation film 32 may be formed over (e.g. in contact with) the back surface of the semiconductor substrate 160, for example, over the second conductive area 30 formed on the semiconductor substrate 160.

The first passivation film 22 and the anti-reflection film 24 may substantially be formed throughout the front surface of the semiconductor substrate 160 excluding a portion corresponding to the first electrode 42 (for example, a portion provided with a first opening 102). Similarly, the second passivation film 32 may substantially be formed throughout the back surface of the semiconductor substrate 160 excluding a portion corresponding to the second electrode 44 (for example, a portion provided with a second opening 104).

The first and second passivation films 22 and 32 come into contact with the first and second conductive areas 20 and 30 for passivation of defects present in the surface or the bulk of the conductive areas 20 and 30. As such, it is possible to increase the open-circuit voltage Voc of the solar cell 150 by removing recombination sites of minority carriers. The anti-reflection film 24 reduces the reflectance of light introduced into the front surface of the semiconductor substrate 160. This may increase the quantity of light, which reaches the pn junction formed at the interface of the base area 10 and the first conductive area 20. Thereby, the short-circuit current Isc of the solar cell 150 may be increased. In conclusion, the passivation films 22 and 32 and the anti-reflection film 24 may increase the open-circuit voltage and the short-circuit current of the solar cell 150, thereby improving the efficiency of the solar cell 150.

In one example, the passivation films 22 and 32 or the anti-reflection film 24 may include a single film or multiple films in the form of a combination of two or more films selected from the group consisting of a silicon nitride film, silicon nitride film containing hydrogen, silicon oxide film, silicon oxide nitride film, aluminum oxide film, $MgF_2$, ZnS, $TiO_2$, and $CeO_2$. In one example, the first or second passivation film 22 or 32 may include a silicon oxide film or silicon nitride film having a fixed positive charge when the conductive area 20 or 30 is of an n-type, and may include an aluminum oxide film having a fixed negative charge when the conductive area 20 or 30 is of a p-type. In one example, the anti-reflection film 24 may include a silicon nitride.

However, the present inventive concept is not limited thereto, and the passivation films 22 and 32 and the anti-reflection film 24 may include various materials. In addition, the stacking structure of the insulation films stacked over the front surface and/or the back surface of the semiconductor substrate 160 may be altered in various ways. For example, the insulation films may be stacked one above another in a stacking sequence different from the above-described stacking sequence. Alternatively, at least one of the first and second passivation films 22 and 32 and the anti-reflection film 24 may be omitted, or other insulation films excluding the first and second passivation films 22 and 32 and the anti-reflection film 24 may be provided. Various other alterations are possible.

The first electrode 42 is electrically connected to the first conductive area 20 through the first opening 102, which is formed in the insulation films disposed on the front surface of the semiconductor substrate 160 (e.g. the first passivation film 22 and the anti-reflection film 24). The second electrode 44 is electrically connected to the second conductive area 30 through the second opening 104, which is formed in the insulation film disposed on the back surface of the semiconductor substrate 160 (e.g. the second passivation film 32). In one example, the first electrode 42 may come into contact with the first conductive area 20, and the second electrode 44 may come into contact with the second conductive area 30.

The first and second electrodes 42 and 44 may be formed of various materials (e.g. metal materials) so as to have various shapes. The shapes of the first and second electrodes 42 and 44 will be described later.

As such, in the present embodiment, the first and second electrodes 42 of the solar cell 150 may have a predetermined pattern so that the solar cell 150 has a bi-facial structure to allow light to be introduced into the front surface and the back surface of the semiconductor substrate 160. Thereby, the quantity of light used in the solar cell 150 may be increased, which may contribute to improvement in the efficiency of the solar cell 150.

However, the present inventive concept is not limited thereto, and the second electrode 44 may be formed throughout the back surface of the semiconductor substrate 160. In addition, all of the first and second conductive areas 20 and 30 and the first and second electrodes 42 and 44 may be arranged on the same surface (e.g. the back surface) of the semiconductor substrate 160, or at least one of the first and second conductive areas 20 and 30 may be formed over both the surfaces of the semiconductor substrate 160. That is, the above-described solar cell 150 is merely given by way of example, and the present inventive concept is not limited thereto.

The solar cell 150 described above is electrically connected to a neighboring solar cell 150 by the interconnector 142, which is located over (e.g. in contact with) the first electrode 42 or the second electrode 44. This will be described below in more detail with reference to FIG. 4 in conjunction with FIGS. 1 to 3.

Figure 4:
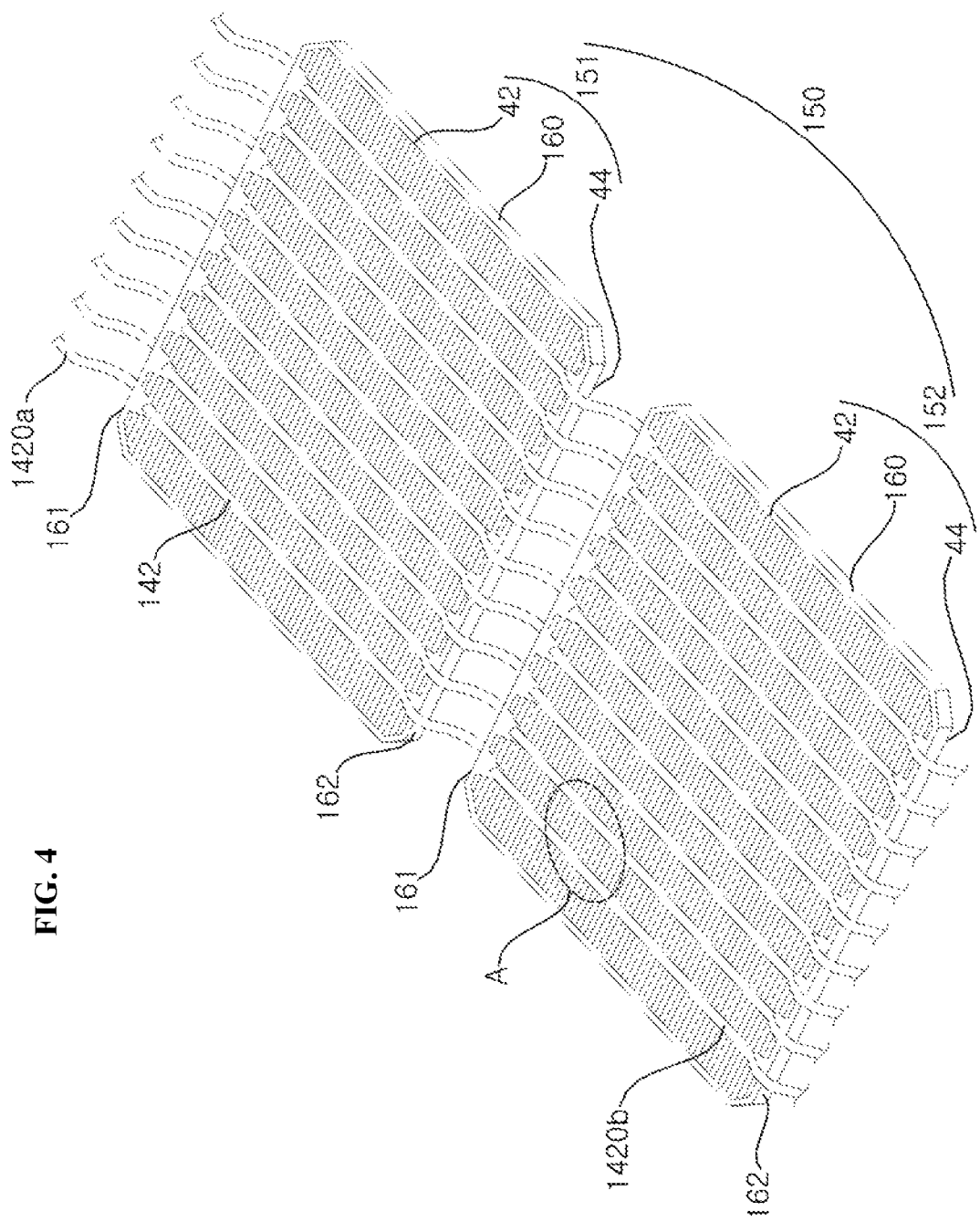
FIG. 4 is a perspective view schematically illustrating a first solar cell and a second solar cell, which are included in the solar cell panel of FIG. 1 and are interconnected via interconnectors.

FIG. 4 is a perspective view schematically illustrating a first solar cell 151 and a second solar cell 152, which are included in the solar cell panel 100 of FIG. 1 and are interconnected via the interconnector 142. In FIG. 4, the first and second solar cells 151 and 152 are schematically illustrated, and the illustration is focused on the semiconductor substrate 160 and the electrodes 42 and 44.

As illustrated in FIG. 4, two neighboring solar cells 150 (e.g. the first solar cell 151 and the second solar cell 152) among the solar cells 150 may be interconnected by the interconnector 142. At this time, the interconnector 142 interconnects the first electrode 42, which is disposed on the front surface of the first solar cell 151, and the second electrode 44, which is disposed on the back surface of the second solar cell 152, which is located on one side (the left lower side in FIG. 4) of the first solar cell 151. In addition, another interconnector 1420a interconnects the second electrode 44, which is disposed on the back surface of the first solar cell 151, and the first electrode 42, which is disposed on the front surface of another solar cell, which may be located on the other side (the right upper side in FIG. 4) of the first solar cell 151. In addition, another interconnector 1420b interconnects the first electrode 42, which is disposed on the front surface of the second solar cell 152, and the second electrode 44, which is disposed on the back surface of another solar cell, which may be located on one side (the left lower side in FIG. 4) of the second solar cell 152. In this way, the multiple solar cells 150 may be interconnected to form a single column by the interconnectors 142, 1420a and 1420b. A following description related to the interconnector 142 may be applied to all of the interconnectors 142, 1420a and 1420b, each of which interconnects two neighboring solar cells 150.

In the present embodiment, the interconnector 142 may include a first portion, a second portion, and a third portion. The first portion is connected to the first electrode 42 (for example, a bus-bar line (see reference numeral 42b in FIG. 5) of the first electrode 42) on the front surface of the first solar cell 151 and extends a long length from a first edge 161 to a second edge 162, which is at the opposite side of the first edge 161. The second portion is connected to the second electrode 44 (for example, a bus-bar line of the second electrode 44) on the back surface of the second solar cell 152 and extends a long length from the first edge 161 to the second edge 162, which is at the opposite side of the first edge 161. The third portion extends from the front surface of the second edge 162 of the first solar cell 151 to the back surface of the second solar cell 152 so as to connect the first portion and the second portion to each other. As such, the interconnector 142 may cross a portion of the first solar cell 151, and then may cross a portion of the second solar cell 152. When the interconnector 142 has a width smaller than the first and second solar cells 151 and 152 and is formed so as to correspond to the aforementioned portions of the first and second solar cells 151 and 152 (e.g. the bus-bar line 42b), the interconnector 142 may effectively interconnect the first and second solar cells 151 and 152 despite a small area thereof.

In one example, the interconnector 142 may come into contact with the bus-bar line 42b of the first and second electrodes 42 and 44 so as to extend a long length along the bus-bar line 42b. Thereby, the interconnector 142 and the first and second electrodes 42 and 44 may continuously come into contact with each other, which may improve electrical properties. However, the present inventive concept is not limited thereto. The first electrode 42 may have no bus-bar line 42b, and in this case, the interconnector 142 may be in contact with and be connected to a plurality of finger lines (see reference numeral 42a in FIG. 5) so as to cross the finger lines 42a. However, the present inventive concept is not limited thereto.

When viewing one surface of each solar cell 150, the multiple interconnectors 142 may be provided to improve the electrical connection between neighboring solar cells 150. In particular, in the present embodiment, the interconnector 142 is configured as a wire, which has a width smaller than a conventional ribbon having a relatively large width (e.g. within a range from 1 mm to 2 mm). As such, a greater number of interconnectors 142 than the conventional ribbons (e.g. two to five ribbons) are used on one surface of each solar cell 150.

In one example, each interconnector 142 may include a core layer 142a, which is formed of a metal, and a solder layer 142b, which is coated over the surface of the core layer 142a at a small thickness and includes a solder material so as to enable soldering with the electrodes 42 and 44. In one example, the core layer 142a may include Ni, Cu, Ag or Al as a main material (e.g. a material included in an amount of 50 wt % or more, for example, 90 wt % or more). The solder layer 142b may include, for example, Pb, Sn, SnIn, SnBi, SnPb, SnPbAg, SnCuAg or SnCu as a main material. However, the present inventive concept is not limited thereto, and the core layer 142a and the solder layer 142b may include various other materials.

When the wire, which has a width smaller than the conventional ribbon, is used as the interconnector 142, material costs may be considerably reduced. In addition, because the interconnector 142 has a width smaller than the ribbon, a sufficient number of interconnector 142 may be provided to minimize the movement distance of carriers, which may enhance the output of the solar cell panel 100.

In addition, the wire, which configures the interconnector 142 according to the present embodiment, may include a rounded portion. That is, the wire, which configures the interconnector 142, may have a circular, oval, or curvilinear cross section, or a rounded cross section. Thereby, the interconnector 142 may cause reflection or diffused reflection. In this way, light reflected from the rounded surface of the wire, which configures the interconnector 142, may be reflected or totally reflected by the front substrate 110 or the back substrate 120, which is disposed on the front surface or the back surface of the solar cell 150, to thereby be reintroduced into the solar cell 150. This may effectively enhance the output of the solar cell panel 100. However, the present inventive concept is not limited thereto. Accordingly, the wire, which configures the interconnector 142, may have a polygonal shape, such as a rectangular shape, or may have any of various other shapes.

In the present embodiment, the width (or the diameter) of the interconnector 142 may range from 250 um to 500 um. For reference, in the present embodiment, because the thickness of the solder layer 142b may be very small and may have any of various values depending on the position of the interconnector 142, the width of the interconnector 142 may be the width of the core layer 142a. Alternatively, the width of the interconnector 142 may be the width that is measured at the center of the interconnector 142 above a line portion (see reference numeral 421 in FIG. 5). The interconnector 142, which has the above-described width and takes the form of a wire, may efficiently transfer current, generated in the solar cell 150, to an external circuit (e.g. a bus ribbon or a bypass diode of a junction box) or another solar cell 150. In the present embodiment, the interconnectors 142 may be individually positioned over and fixed to the electrodes 42 and 44 of the solar cell 150 without being inserted into, for example, a separate layer or film. When the width of the interconnector 142 is below 250 um, the strength of the interconnector 142 may be insufficient and the connection area between the interconnector 142 and the electrodes 42 and 44 may be very small, which may result in poor electrical connection and low attachment force. When the width of the interconnector 142 exceeds 500 um, the cost of the interconnector 142 may increase, and the interconnector 142 may prevent light from being introduced into the front surface of the solar cell 150, thereby increasing shading loss. In addition, the interconnector 142 may receive force so as to be spaced apart from the electrodes 42 and 44, which may cause low attachment force between the interconnector 142 and the electrodes 42 and 44 and may generate cracks in the electrodes 42 and 44 or the semiconductor substrate 160. In one example, the width of the interconnector 142 may range from 350 um to 450 um (more particularly, from 350 um to 400 um). With this range, the interconnector 142 may achieve increased attachment force for the electrodes 42 and 44 and may enhance the output of the solar cell 150.

At this time, six to thirty-three interconnectors 142 may be provided on one surface of the solar cell 150. For example, when the width of the interconnectors 142 is 250 um or more and below 300 um, the number of interconnectors 142 may range from 15 to 33. When the width of the interconnectors 142 is 300 um or more and below 350 um, the number of interconnectors 142 may range from 10 to 33. When the width of the interconnectors 142 is 350 um or more and below 400 um, the number of interconnectors 142 may range from 8 to 33. When the width of the interconnectors 142 ranges from 400 um to 500 um, the number of interconnectors 142 may range from 6 to 33. In addition, when the width of the interconnectors 142 is 350 um or more, the output of the solar cell panel 100 is no longer increased even if the number of interconnectors 142 exceeds 15. In addition, when the number of interconnectors 142 increases, this may increase burden on the solar cell 150. In consideration of this, when the width of the interconnectors 142 is 350 um or more and below 400 um, the number of interconnectors 142 may range from 8 to 15. When the width of the interconnectors 142 ranges from 400 um to 500 um, the number of interconnectors 142 may range from 6 to 15. At this time, in order to further enhance the output of the solar cell panel 100, the number of interconnectors 142 may be 10 or more (e.g. 12 or 13). However, the present inventive concept is not limited thereto, and the number of interconnectors 142 and the number of bus-bar lines 42b may have various other values.

At this time, the pitch of the interconnectors 142 (or the pitch of the bus-bar lines 42b) may range from 4.75 mm to 26.13 mm. This is acquired in consideration of the width and the number of interconnectors 142. For example, when the width of the interconnectors 142 is 250 um or more and below 300 um, the pitch of the interconnectors 142 may range from 4.75 mm to 10.45 mm. When the width of the interconnectors 142 is 300 um or more and below 350 um, the pitch of the interconnectors 142 may range from 4.75 mm to 15.68 mm. When the width W of the interconnectors 142 is 350 um or more and below 400 um, the pitch of the interconnectors 142 may range from 4.75 mm to 19.59 mm. When the width of the interconnectors 142 ranges from 400 um to 500 um, the pitch of the interconnectors 142 may range from 4.75 mm to 26.13 mm. For example, when the width of the interconnectors 142 is 350 um or more and below 400 um, the pitch of the interconnectors 142 may range from 10.45 mm to 19.59 mm. When the width of the interconnectors 142 ranges from 400 um to 500 um, the pitch of the interconnectors 142 may range from 10.45 mm to 26.13 mm. However, the present inventive concept is not limited thereto, and the pitch of the interconnectors 142 and the pitch of the bus-bar lines 42b may have various other values.

In the present embodiment, the first electrode 42 (or the second electrode 44), the interconnector 142, and an electrode area (see reference character EA in FIG. 5) may be symmetrically arranged in the first direction (e.g. the direction parallel to the finger lines 42a) and the second direction (e.g. the direction parallel to the bus-bar lines 42b or the interconnectors 142). Thereby, the flow of current may be stabilized. However, the present inventive concept is not limited thereto.

An example of the electrodes 42 and 44 of the solar cell 150, to which the interconnectors 142 according to the embodiment of the present inventive concept may be attached, will be described below in detail with reference to FIG. 5 in conjunction with FIGS. 1 to 4. Hereinafter, the first electrode 42 will be described in detail with reference to FIG. 5, and then the second electrode 44 will be described.

Figure 5:
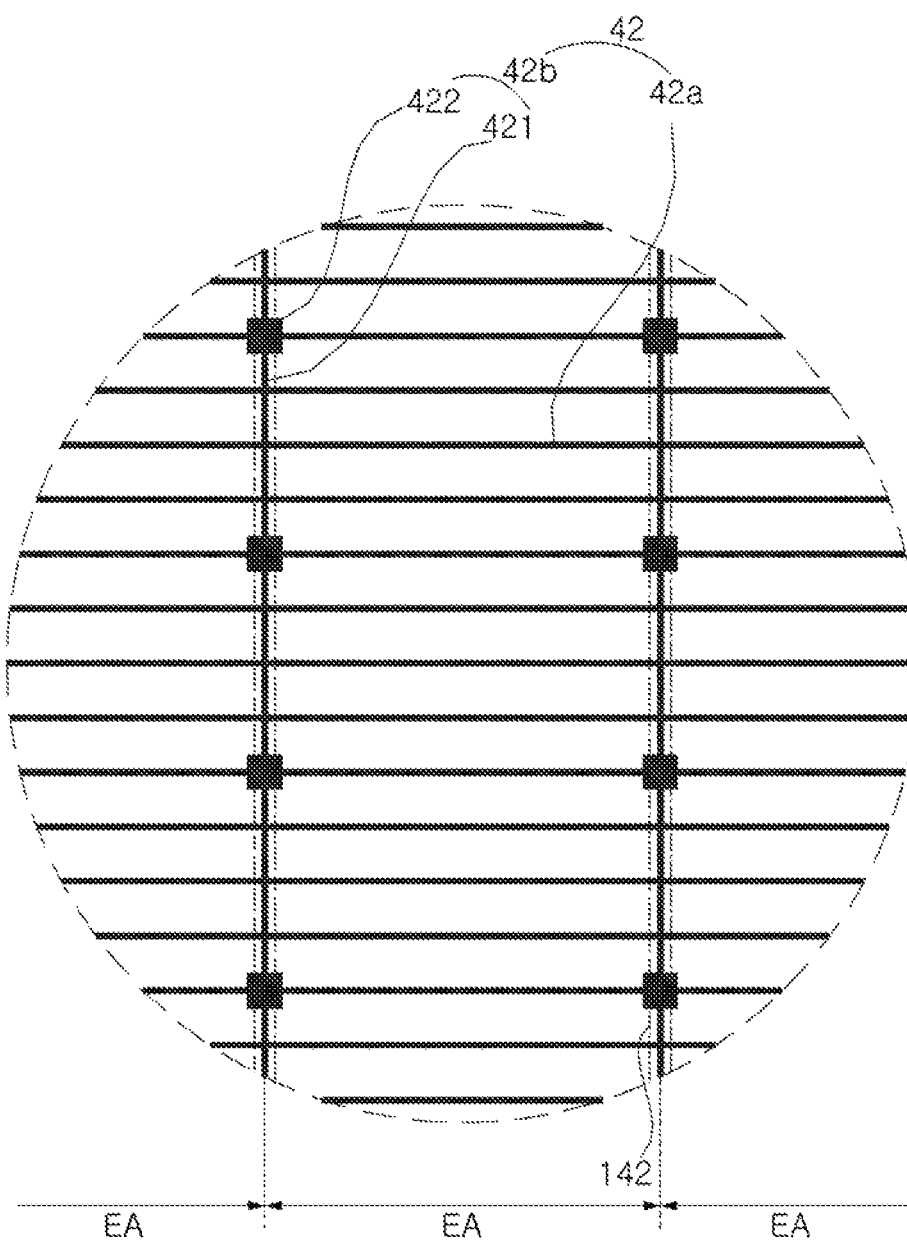
FIG. 5 is an enlarged partial plan view of portion A of FIG. 4.

FIG. 5 is an enlarged partial plan view illustrating portion A of FIG. 4.

Referring to FIGS. 1 to 5, in the present embodiment, the first electrode 42 includes the finger lines 42a, which extend in the first direction (e.g. the horizontal direction in the drawings) and are arranged parallel to each other. The first electrode 42 may further include the bus-bar lines 42b, which extend in the second direction (e.g. the vertical direction in the drawings) crossing (e.g. perpendicular to) the finger lines 42a and are connected or attached to the interconnectors 142. Because the bus-bar lines 42b may be arranged so as to correspond to the interconnectors 142, the description related to the number and the pitch of the interconnectors 142 may be directly applied to the number and the pitch of the bus-bar lines 42b. Hereinafter, an area between two neighboring bus-bar lines 42b among the bus-bar lines 42b is referred to as the electrode area EA. In the present embodiment, because the multiple (e.g. six or more) interconnectors 142 are provided on one surface of the solar cell 150, a plurality of electrode areas EA (provided in the number less than the number of interconnectors 142 by one) may be provided.

The finger lines 42a may have a consistent width, and may be spaced apart from one another at a consistent pitch. Although FIG. 5 illustrates that the finger lines 42a are formed parallel to each other in the first direction and are parallel to the main edges (more particularly, the first and second edges 161 and 162) of the solar cell 150, the present inventive concept is not limited thereto.

In one example, the finger lines 42a of the first electrode 42 may have the width ranging from 35 um to 120 um and may have the pitch ranging from 1.2 mm to 2.8 mm, and the number of finger lines 42a may range from 55 to 130 in the direction crossing the finger lines 42a. The width and the pitch of the finger lines 42a may be determined based on easy process conditions, and may be limited to minimize shading loss due to the finger lines 42a while ensuring the effective collection of current generated via photoelectric conversion. The thickness of the finger lines 42a may be within the range in which the finger lines 42a may be formed via an easy process and may have a desired specific resistance. However, the present inventive concept is not limited thereto, and the width and the pitch of the finger lines 42a may be changed in various ways depending on, for example, variation in process conditions, the size of the solar cell 150, and the constituent material of the finger lines 42a.

At this time, the width of the interconnectors 142 may be smaller than the pitch of the finger lines 42a, and may be greater than the width of the finger lines 42a. However, the present inventive concept is not limited thereto, and various alterations are possible.

In one example, the bus-bar lines 42b may be successively formed from the position proximate to the first edge 161 to the position proximate to the second edge 162 in the electrode area EA. As mentioned above, the bus-bar lines 42b may be located so as to correspond to the interconnectors 142, which are used to connect the respective neighboring solar cells 150. The bus-bar lines 42b may correspond to the interconnectors 142 in a one-to-one ratio. As such, in the present embodiment, the number of bus-bar lines 42b may be the same as the number of interconnectors 142 on one surface of the solar cell 150.

Each bus-bar line 42b may include a line portion 421, which has a relatively small width and extends a long length in the direction in which it is connected to the interconnector 142 within the electrode area EA, and a pad portion 422, which has a width greater than the line portion 421 so as to increase the area of connection for the interconnector 142. The line portion 421 having a small width may minimize the area by which light is blocked so as not to be introduced into the solar cell 150, and the pad portion 422 having a large width may increase the attachment force between the interconnector 142 and the bus-bar line 42b and may reduce contact resistance. The pad portion 422 has a width greater than the line portion 421, and thus substantially serves as a portion for the attachment of the interconnector 142. The interconnector 142 may be attached to the line portion 421, or may be simply placed on the line portion 421 without being attached thereto.

The width of the pad portion 422, measured in the first direction, may be greater than the width of each of the line portion 421 and the finger line 42a.

The present embodiment illustrates that the line portion 421 of the bus-bar line 42b is provided so as to correspond to the interconnector 142. For example, although a bus-bar electrode, which is significantly wider than the finger line 42a, is provided to correspond to the interconnector 142 in the related art, in the present embodiment, the line portion 421 of the bus-bar line 42b, which has a width significantly smaller than the bus-bar electrode, is provided. In the present embodiment, the line portion 421 may connect the finger lines 42a to one another so as to provide a bypass path for carriers when some finger lines 42a are disconnected.

In this specification, the bus-bar electrode refers to an electrode portion, which is formed in the direction crossing the finger lines so as to correspond to the interconnector 142 and has a width twelve times or more (usually, fifteen times or more) the width of the finger lines. Two or three bus-bar electrodes are usually provided because the bus-bar electrodes have a relatively large width. In addition, in the present embodiment, the line portion 421 of the bus-bar line 42b may refer to an electrode portion, which is formed in the direction crossing the finger lines 42a so as to correspond to the interconnector 142 and has a width ten times or less the width of the finger line 42a.

In one example, the width of the line portion 421 may range from 0.5 times to 10 times the width of the finger line 42a. When the ratio is below 0.5 times, the width of the line portion 421 may be too small to allow the line portion 421 to exert sufficient effects. When the ratio exceeds 10 times, the width of the line portion 421 may be excessive, causing increased shading loss. In particular, in the present embodiment, because a great number of interconnectors 142 are provided, the line portions 421 are also provided in a great number, which may further increase shading loss. For example, the width of the line portion 421 may range from 0.5 times to 7 times the width of the finger line 42a. When the ratio is 7 times or less, shading loss may further be reduced. In one example, in terms of shading loss, the width of the line portion 421 may range from 0.5 times to 4 times the width of the finger line 42a. For example, the width of the line portion 421 may range from 0.5 times to 2 times the width of the finger line 42a. With this range, the efficiency of the solar cell 150 may be greatly increased.

Alternatively, the width of the line portion 421 may be equal to or smaller than the width of the interconnector 142. This is because the width or area by which the lower surface of the interconnector 142 comes into contact with the line portion 421 is not large when the interconnector 142 has a circular, oval or rounded shape. When the line portion 421 has a relatively small width, the area of the first electrode may be reduced, resulting in a reduction in the manufacturing costs of the first electrode 42.

In one example, the ratio of the width of the interconnector 142 to the width of the line portion 421 may be greater than 1:0.07 and less than 1:1. When the ratio is below 1:0.07, the width of the line portion 421 is excessively small, causing deterioration in electrical properties. When the ratio exceeds 1:1, the area of the first electrode 42 is increased, causing increased shading loss and material costs without considerable improvement in the contact between the interconnector 142 and the line portion 421. In one example, the ratio may range from 1:01 to 1:0.5 (for example, from 1:0.1 to 1:0.3) when further considering the shading loss and the material costs.

Alternatively, the width of the line portion 421 may range from 35 um to 350 um. When the width of the line portion 421 is below 35 um, the width of the line portion 421 is excessively small, causing deterioration in electrical properties. When the width of the line portion 421 exceeds 350 um, the area of the first electrode 42 is excessive, causing increased shading loss and material costs without considerable improvement in the contact between the interconnector 142 and the line portion 421. In one example, the width of the line portion 421 may range from 35 um to 200 um (for example, from 35 um to 120 um) when further considering the shading loss and the material costs.

However, the present inventive concept is not limited thereto. Accordingly, the width of the line portion 421 may be changed in various ways within the range in which the line portion 421 effectively transfers current generated via photoelectric conversion and minimizes shading loss.

In addition, the width of the pad portion 422 may be greater than the width of the line portion 421, and may be equal to or greater than the width of the interconnector 142. Because the pad portion 422 serves to increase force for the attachment of the interconnector 142 by increasing the contact area of the interconnector 142, the width of the pad portion 422 may be greater than the width of the line portion 421, and may be equal to or greater than the width of the interconnector 142.

In one example, the ratio of the width of the interconnector 142 to the width of the pad portion 422 may range from 1:1 to 1:5. When the ratio is below 1:1, the width of the pad portion 422 may be insufficient, causing insufficient attachment force between the pad portion 422 and the interconnector 142. When the ratio exceeds 1:5, the area by which the pad portion 422 causes shading loss may be increased, resulting in greater shading loss. The ratio may range from 1:2 to 1:4 (for example, 1:2.5 to 1:4) when further considering the attachment force and the shading loss.

Alternatively, in one example, the width of the pad portion 422 may range from 0.25 mm to 2.5 mm. When the width of the pad portion 422 is below 0.25 mm, the contact area between the pad portion 422 and the interconnector 142 may be insufficient, and consequently, the attachment force between the pad portion 422 and the interconnector 142 may be insufficient. When the width of the pad portion 422 exceeds 2.5 mm, the area by which the pad portion 422 causes shading loss may be increased, resulting in greater shading loss. In one example, the width of the pad portion 422 may range from 0.8 mm to 1.5 mm.

In addition, the length of the pad portion 422 may be greater than the width of the finger line 42*a*. For example, the length of the pad portion 422 may range from 0.035 mm to 30 mm. When the length of the pad portion 422 is below 0.035 mm, the contact area between the pad portion 422 and the interconnector 142 may be insufficient, and consequently, the attachment force between the pad portion 422 and the interconnector 142 may be insufficient. When the length of the pad portion 422 exceeds 30 mm, the area by which the pad portion 422 causes shading loss may be increased, resulting in greater shading loss.

Alternatively, in one example, the ratio of the width of the finger line 42*a* to the length of the pad portion 422 may range from 1:1.1 to 1:20. With this range, the area for attachment between the pad portion 422 and the interconnector 142 may be increased, and consequently, the attachment force between the pad portion 422 and the interconnector 142 may be increased.

Alternatively, in one example, the ratio of the width of the interconnector 142 to the length of the pad portion 422 may range from 1:1 to 1:10. When the ratio is below 1:1, the length of the pad portion 422 may be insufficient, causing insufficient attachment force between the pad portion 422 and the interconnector 142. When the ratio exceeds 1:10, the area by which the pad portion 422 causes shading loss may be increased, resulting in greater shading loss. The ratio may range from 1:3 to 1:6 when further considering the attachment force and the shading loss.

One bus-bar line 42*b* may include six to twenty-four pad portions 422 (e.g. twelve to twenty-two pad portions). The pad portions 422 may be spaced apart from one another. In one example, one pad portion 422 may be allotted to two to ten finger lines 42*a*. Thereby, the portion in which the contact area between the bus-bar line 42*b* and the interconnector 142 is increased is provided at a regular interval so as to increase the attachment force between the bus-bar line 42*b* and the interconnector 142. Alternatively, the pad portions 422 may be arranged so that distances between the respective two pad portions 422 have different values. In particular, the pad portions 422 may be arranged at a high density on the end of the bus-bar line 42*b*, to which greater force is applied than in the other portion (e.g. the central portion of the bus-bar line 42*b*). Various other alterations are possible.

The above description has been focused on the first electrode 42 with reference to FIG. 5. The second electrode 44 may include finger lines and bus-bar lines, which correspond respectively to the finger lines 42*a* and the bus-bar lines 42*b* of the first electrode 42. The description related to the finger lines 42*a* and the bus-bar lines 42*b* of the first electrode 42 may be applied to the finger lines and the bus-bar lines of the second electrode 44. At this time, the description of the first conductive area 20 in relation to the first electrode 42 may be the same as the description of the second conductive area 30 in relation to the second electrode 44. In addition, the description of the first passivation film 22, the anti-reflection film 24 and the opening 102 in relation to the first electrode 42 may be the description of the second passivation film 30 and the opening 104 in relation to the second electrode 44.

At this time, the widths, the pitch, and the number of finger lines 42*a* of the first electrode 42 and the line portion 421 and the pad portion 422 of each bus-bar line 42*b* may be equal to the widths, the pitch, and the number of finger lines of the second electrode 44 and the line portion and the pad portion of each bus-bar line. Alternatively, the widths, the pitch, and the number of finger lines 42*a* of the first electrode 42 and the line portion 421 and the pad portion 422 of each bus-bar line 42*b* may differ from the widths, the pitch, and the number of finger lines of the second electrode 44 and the line portion and the pad portion of each bus-bar line. In one example, the electrode portion of the second electrode 44, into which a relatively small amount of light is introduced, may have a width greater than the width of the electrode portion of the first electrode 42 corresponding thereto, and the pitch between the finger lines of the second electrode 44 may be less than the pitch of the finger lines 42a of the first electrode corresponding thereto. Various other alterations are possible. However, the number and the pitch of the bus-bar lines 42b of the first electrode 42 may be the same as to the number and the pitch of the bus-bar lines of the second electrode 44. In addition, the first electrode 42 and the second electrode 44 may have different planar shapes. For example, the second electrode 44 may be formed throughout the back surface of the semiconductor substrate 160. Various other alterations are possible.

According to the present embodiment, shading loss due to, for example, diffused reflection may be minimized through the use of the interconnector 142 in the form of a wire, and the movement path of carriers may be reduced by increasing the number of interconnectors 142 and reducing the pitch of the interconnectors 142. Thereby, the efficiency of the solar cell 150 and the output of the solar cell panel 100 may be enhanced. As described above, a great number of the interconnectors 142, which takes the form of a wire that has, for example, a circular cross-sectional shape and a small width, need to be attached to the solar cell 150. Accordingly, there is a demand for an interconnector attachment apparatus, which may attach the interconnector 142 to the solar cell 150 with high attachment force despite a wire shape thereof and may attach a great number of the interconnectors 142 at the same time so as to enhance productivity.

Meanwhile, in the present embodiment, the yield strength of the interconnectors 142 attached to the solar cell 150 may be 110 MPa or less (e.g. within a range from 67 MPa to 110 Mpa). This is because the interconnectors 142 are attached using an interconnector attachment apparatus and an attachment method using the same according to the present embodiment. The interconnector attachment apparatus and the attachment method using the same according to the present embodiment will be described below in detail with reference to FIGS. 6 to 16.

Figure 6:
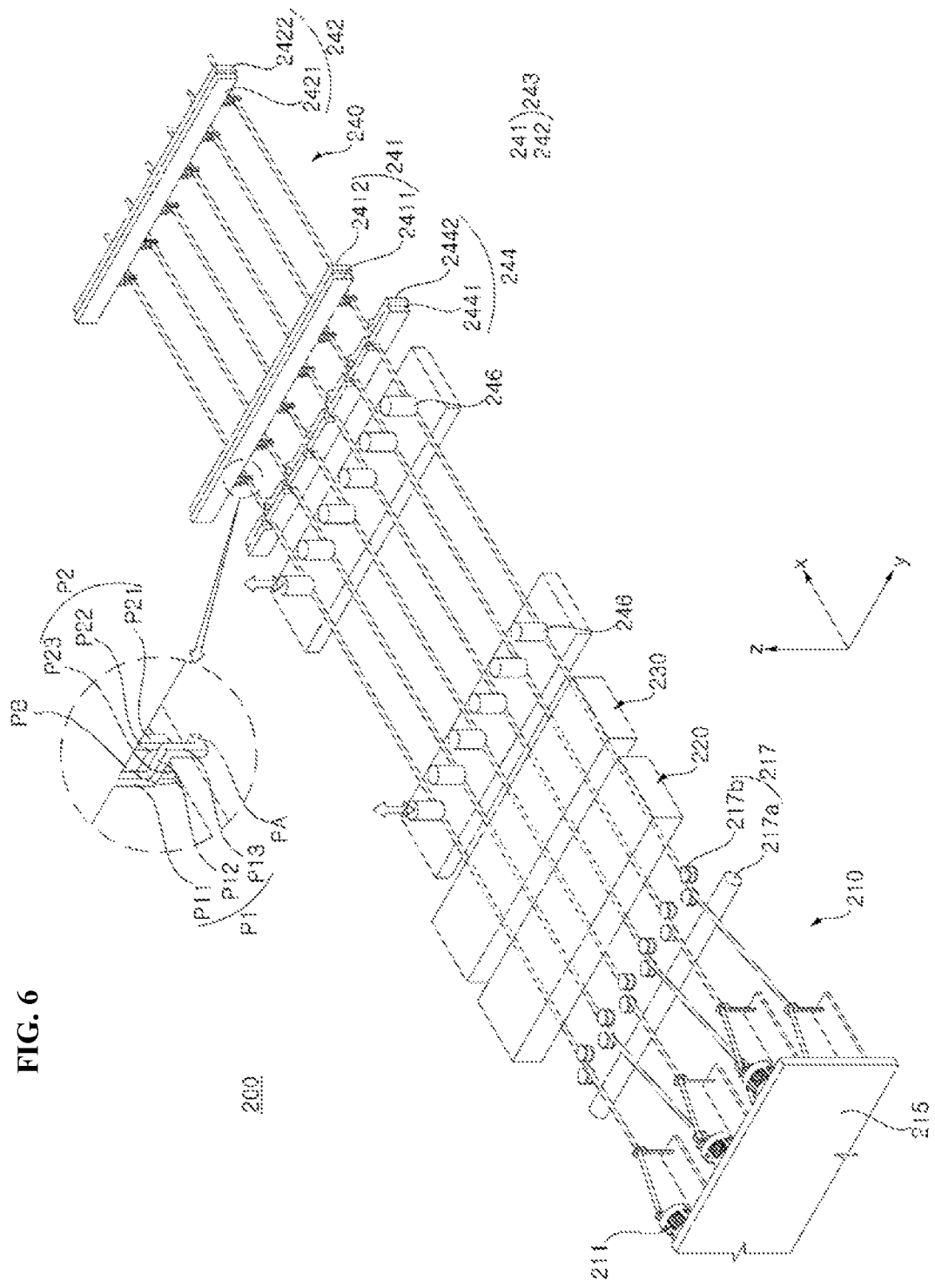
FIG. 6 is a view schematically illustrating the configuration of part of an interconnector attachment apparatus for a solar cell panel according to an embodiment of the present inventive concept.
Figure 7:
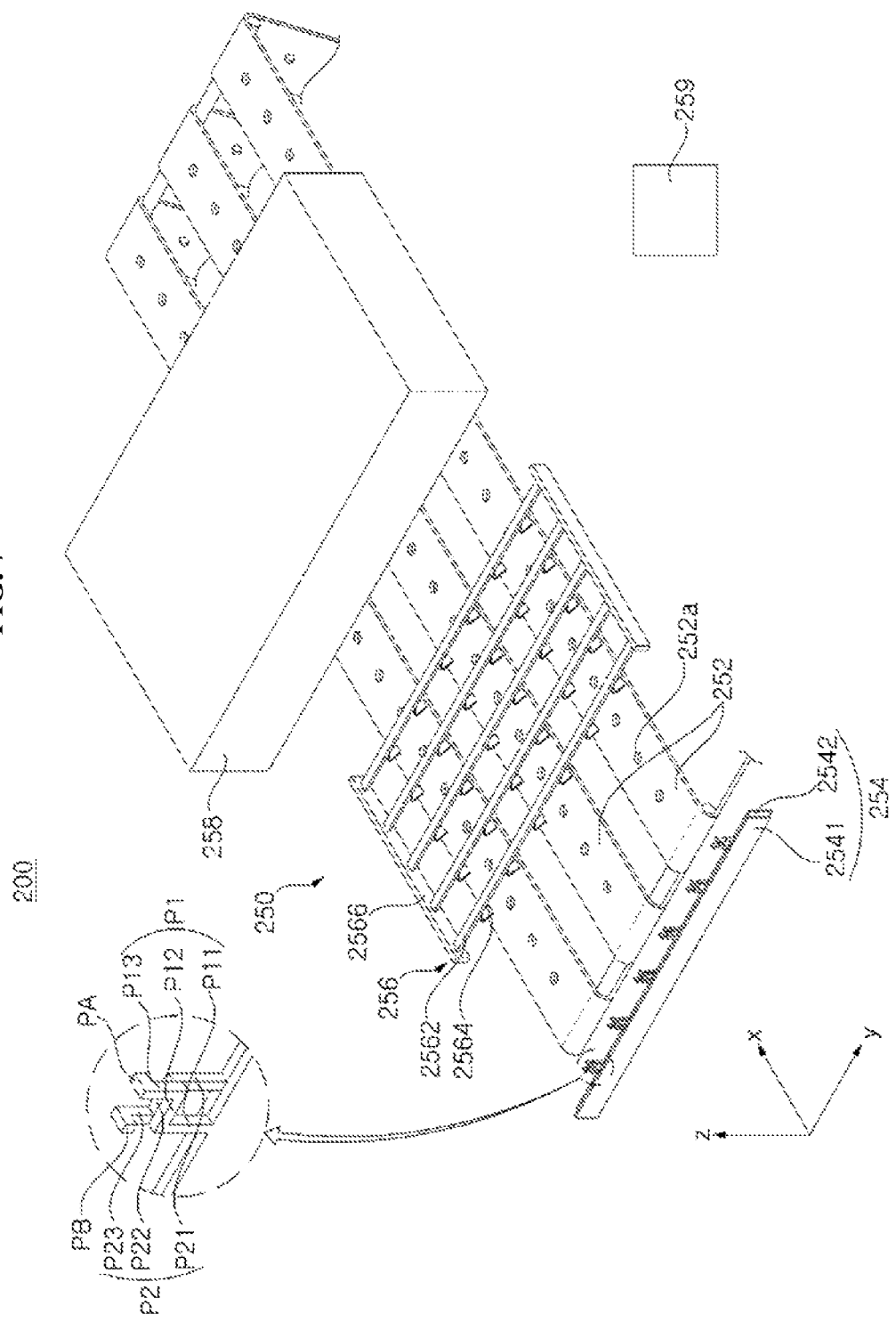
FIG. 7 is a view schematically illustrating the configuration of another part of the interconnector attachment apparatus for the solar cell panel according to the embodiment of the present inventive concept.
Figure 8:
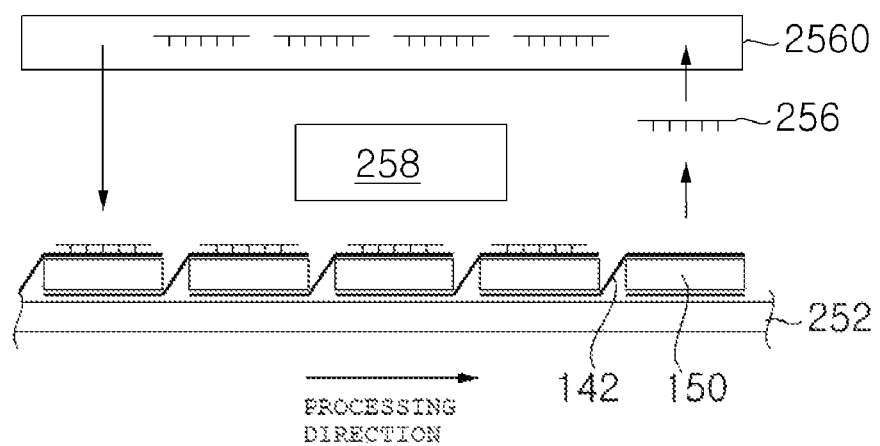
FIG. 8 is a conceptual view schematically illustrating a working table, a heat source, and an upper fixing member supply unit included in the interconnector attachment apparatus for the solar cell panel according to the embodiment of the present inventive concept.

FIG. 6 is a view schematically illustrating the configuration of part of an interconnector attachment apparatus for a solar cell panel according to an embodiment of the present inventive concept. FIG. 7 is a view schematically illustrating the configuration of another part of the interconnector attachment apparatus for the solar cell panel according to the embodiment of the present inventive concept. In addition, FIG. 8 is a conceptual view schematically illustrating a working table, a heat source, and an upper fixing member supply unit of the interconnector attachment apparatus for the solar cell panel according to the embodiment of the present inventive concept. For simplified illustration, in FIG. 7, the upper fixing member supply unit and a solar cell supply unit are omitted.

Referring to FIGS. 6 to 8, the interconnector attachment apparatus for the solar cell panel according to the present embodiment (hereinafter referred to as "interconnector attachment apparatus"), designated by reference numeral 200, may include an interconnector supply unit 210 for unwinding the interconnector 142 from a winding roll 211 and supplying the interconnector 142 in the processing direction, a flux unit 220 for applying flux to the supplied interconnector 142, a drying unit 230 for drying the flux, an interconnector fixing unit 240 for fixing the interconnector 142 to a jig 243, and an attachment unit 250 for attaching the interconnector 142 to the solar cell 150.

As such, the interconnector supply unit 210 performs the step of unwinding the interconnector 142 from the winding roll 211, and moving the interconnector 142 in the processing direction so as to pass through the flux unit 220, the drying unit 230, the interconnector fixing unit 240, and the attachment unit 250. The flux unit 220, the drying unit 230, the interconnector fixing unit 240, and the attachment unit 250 perform the step of fixing the interconnector 142 to the solar cell 150. This will be described below in more detail.

The winding roll 211 may take the form of a cylinder. The interconnector 142 is wound in the circumferential direction of the cylinder. The interconnector 142, wound around the winding roll 211, is unwound from the winding roll 211 and is supplied in the processing direction. In the present embodiment, a plurality of winding rolls 211, which is the same in number as the number of interconnectors 142 to be disposed on one surface of the solar cell 150, may be provided. The winding rolls 211 may be arranged at a constant interval in the horizontal direction and/or the vertical direction, and the interconnectors 142 unwound from the winding rolls 211 may be aligned and moved by an alignment member 217 such that they are spaced apart from one another by the distance (pitch) at which they are to be arranged on the same surface of the solar cell 150.

When the interconnectors 142 are moved while being arranged parallel to each other as described above, the multiple interconnectors 142 to be attached to one surface of each solar cell 150 may be subjected to a desired process at the same time, and may be attached to the solar cell 150 at the same time, which may simplify the process. However, the present inventive concept is not limited thereto, and various other alterations are possible.

In the present embodiment, the interconnector 142 is unwound and aligned so as to pass through the end of the winding roll 211 in the longitudinal direction (e.g. along the x-axis of FIG. 6). Here, the longitudinal direction may be the direction perpendicular to or almost perpendicular to (e.g. tilted at an angle ranging from 80 degrees to 100 degrees relative to) the surface (e.g. the circumferential surface) around which the interconnector 142 is wound, or may be the direction in which opposite ends of the winding roll 211, which are located with the surface, around which the interconnector 142 is wound, interposed therebetween, are connected to each other. This will be described below in more detail with reference to FIG. 9 in conjunction with FIG. 6.

Figure 9:
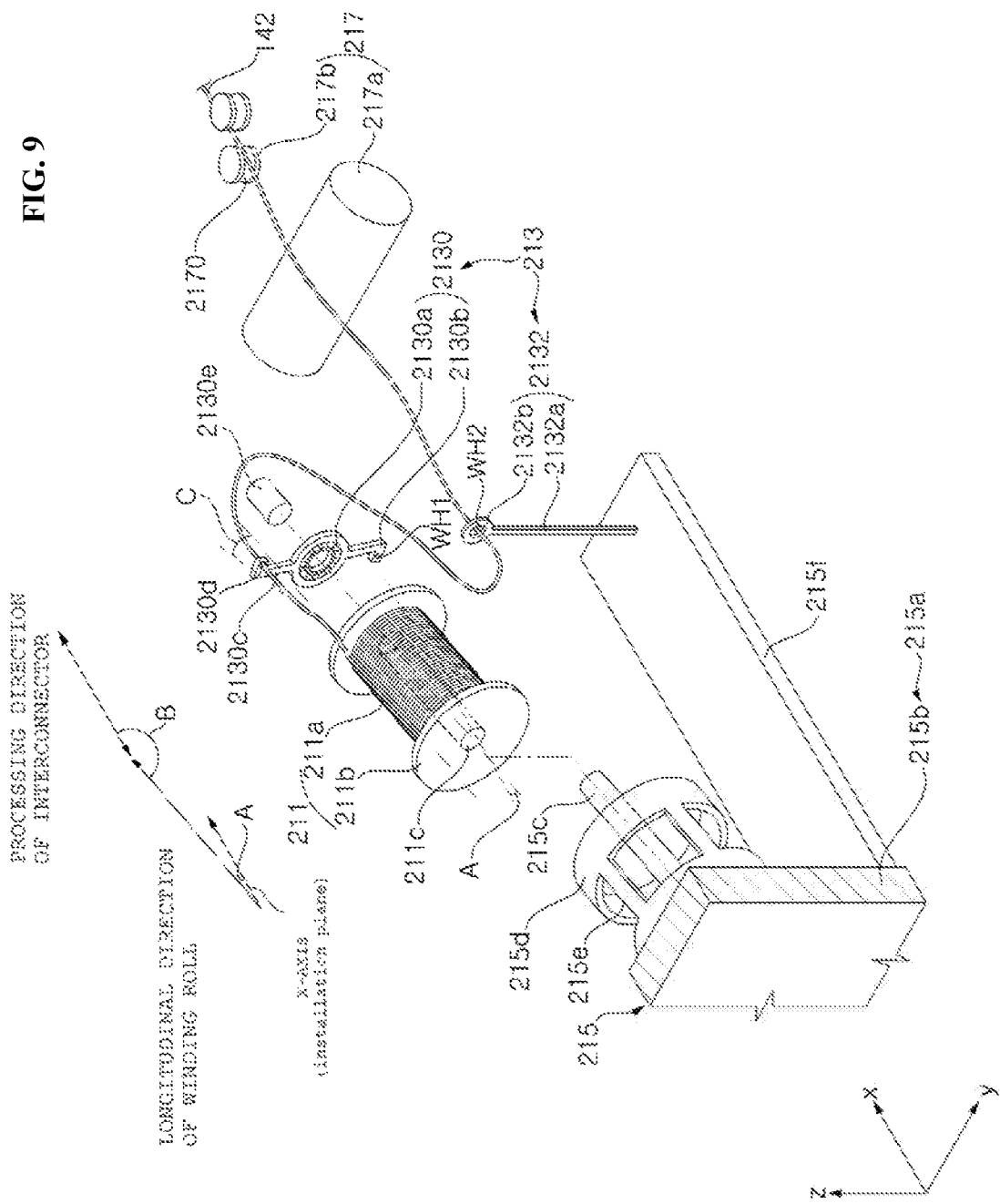
FIG. 9 is an enlarged, exploded perspective view illustrating part of an interconnector supply unit illustrated in FIG. 6 corresponding to a single winding roll.

FIG. 9 is an enlarged, exploded perspective view illustrating part of the interconnector supply unit 210 illustrated in FIG. 6 corresponding to a single winding roll 211.

Referring to FIG. 9, the interconnector supply unit 210 may include the winding roll 211, around which the interconnector 142 is wound, and an unwinding control member 213, which is located to correspond to each winding roll 211 so as to allow the interconnector 142, wound around the winding roll 211, to be stably unwound in a desired direction. In the present embodiment, the unwinding control member 213 may unwind the interconnector 142 from the winding roll 211 so as to pass one end of the winding roll 211 in the longitudinal direction, thereby minimizing variation in the yield strength of the interconnector 142.

In the present embodiment, the winding roll 211 may include a main body portion 211a, on which the interconnector 142 is located, and an end portion 211b, which is located on each of opposite ends of the main body portion 211a and prevents the interconnector 142 from being separated outward from the main body portion 211a. The main body portion 211a may have a cylindrical shape in order to prevent, for example, damage to or deformation of the interconnector 142, and the end portion 211b may be shaped so as to extend outward a predetermined length from each end of the main body portion 211a. The present embodiment illustrates that the end portion 211b has a greater area than the main body portion 211a, thereby preventing the separation of the interconnector 142. As such, the separation of the interconnector 142 may be effectively prevented with a simplified structure. In addition, the winding roll 211 may be hollow so as to have a bore 211c, which penetrates the winding roll 211 in the longitudinal direction, thus having a reduced weight and manufacturing costs. The bore 211c may also allow the winding roll 211 to be easily seated on a fixing frame 215. However, the present inventive concept is not limited thereto, and, for example, the shape and structure of the winding roll 211 may be altered in various ways.

The interconnector 142 may be wound around the main body portion 211a in the approximately circumferential direction of the main body portion 211a or in the direction crossing (e.g. perpendicular to) the longitudinal direction of the winding roll 211. This is because the interconnector 142 may be densely wound to the maximum extent without damage or deformation thereof when the interconnector 142 is wound in this direction. However, the present inventive concept is not limited thereto.

The winding roll 211 may be fixed to the fixing frame 215. For example, the fixing frame 215 may include a frame portion 215a having a fixing plate 215b, which serves as a support body to which the multiple winding rolls 211 are fixed together. The frame portion 215a may adopt any of various materials and any of various structures, in order to stably support the winding rolls 211.

The fixing plate 215b may be provided with a fixing rod 215c, onto which the winding roll 211 may be fitted and fixed. When the winding roll 211 is positioned so that the fixing rod 215c is located in the bore 211c in the winding roll 211, the winding roll 211 may be easily and stably fixed to the fixing plate 215a. In addition, the winding roll 211 may be easily separated from the fixing rod 215c simply by being pulled out, which may enable the easy replacement of the winding roll 211. At this time, the winding roll 211c may be fixed to the fixing rod 215c such that it is not rotatable. The fixing rod 215c may be formed so as to correspond to the shape of the bore 211c in the winding roll 211 in order to allow the winding roll 211 to be stably fixed thereto. In the present embodiment, for example, the fixing rod 215c may take the form of bar having a cylindrical shape or a circular cross section.

In addition, the fixing frame 215 may further include an outer fixing piece 215d configured to surround the outer circumference of each winding roll 211. The outer fixing piece 215d may be prefabricated separately from the frame portion 215a and may then be fixed to the fixing plate 215b.

The outer fixing piece 215d may be located around the winding roll 211 so as to prevent damage to the interconnector 142 wound around the winding roll 211 due to, for example, external shocks. The outer fixing piece 215d may have a cylindrical shape having a space therein so as to surround the outer circumference of each winding roll 211, and an aperture 215e may be located in the side surface of the outer fixing piece 215d. Because the outer fixing piece 215d includes the aperture 215e, whether the interconnector 142 is properly unwound from the winding roll 211 may be visually checked. The outer fixing piece 215d may be shorter than the winding roll 211 so that one end portion 211d of the winding roll 211, from which the interconnector 142 is unwound, is located outside the outer fixing piece 215d. This may maximally prevent the outer fixing piece 215 from interfering with the unwinding of the interconnector 142. However, the outer fixing piece 215d may have a length equal to or greater than the length of the winding roll 211.

However, the present inventive concept is not limited thereto, and, for example, the structure and method for fixing the winding roll 211 may be altered in various ways.

In the present embodiment, the longitudinal direction of the winding roll 211 fixed to the fixing frame 215 may be parallel to or tilted by a predetermined inclination angle relative to the installation plane (e.g. the xy plane). In particular, the longitudinal direction of the winding roll 211 fixed to the fixing frame 215 may form an acute angle A with the installation plane. For example, the winding roll 211 fixed to the fixing frame 215 may be tilted relative to the installation plane so that one end portion 211b, from which the interconnector 142 is unwound, is located higher than the other end portion 211b at the opposite side. In addition, the interconnector 142, which passes through the flux unit 220, the drying unit 230, the fixing unit 240, and the attachment unit 250, is located higher than the farthest portion of the winding roll 211 from the installation plane (e.g. the top of the end portion 211b, from which the interconnector 142 is unwound). As such, the force applied to the winding roll 211 and the interconnector 142 when the interconnector 142 is unwound from the winding roll 211 may be minimized, which may allow the interconnector 142 to be easily unwound without deformation.

In the present embodiment, the winding rolls 211 may be arranged in a plurality of rows. This serves to minimize the installation space of the interconnector supply unit 210 and the movement distance of the interconnector 142 because six or more interconnectors 142 need to be supplied to one surface of a single solar cell 150. When the winding rolls 211 are arranged in a single row, the installation space of the interconnector supply unit 210 needs to be increased, and the movement path of the interconnector 142 supplied from the farthest winding roll 211 needs to be increased, which may cause, for example, twisting of the interconnector 142 or variation in the properties of the interconnector 142 during movement. Although FIG. 6 illustrates that the winding rolls 211 are arranged in two rows, the winding rolls 211 may be arranged in three or more rows depending on the number of interconnectors 142 required for the solar cell 150.

In addition, FIG. 6 illustrates that all of the winding rolls 211 are tilted by an acute angle A relative to the installation plane. This may allow the interconnector 142 to be easily unwound from each winding roll 211. However, the present inventive concept is not limited thereto. For example, all of the winding rolls 211 may be arranged parallel to the installation plane. In addition, when, for example, the number and installation positions of the winding rolls 211 change, for example, the angle between the winding rolls 211 and the installation plane may be differently adjusted. This will be described later with reference to FIG. 20.

The processing direction of the interconnector 142, which passes through the flux unit 220, the drying unit 230, the fixing unit 240, and the attachment unit 250, may be parallel to the installation plane (e.g. the xy plane of FIG. 6). This may increase the structural stability of the flux unit 220, the drying unit 230, the fixing unit 240, and the attachment unit 250. Thereby, the longitudinal direction of the winding roll 211 may be parallel to or tilted by an obtuse angle (inclination angle) B relative to the processing direction of the interconnector 142. In particular, the longitudinal direction of the winding roll 211 may be tilted by the obtuse angle B relative to the processing direction of the interconnector 142. Thereby, the interconnector 142 may be stably unwound from the winding roll 211 and may move in the processing direction. However, the present inventive concept is not limited thereto, and the processing direction of the interconnector 142, which passes through the flux unit 220, the drying unit 230, the fixing unit 240 and the attachment unit 250, may be different from the above description.

The unwinding control member 213 serves to unwind the interconnector 142 from the winding roll 211 and to cause the interconnector 142 to reach the alignment member 217. The unwinding control member 213 is located toward one end portion 211*b* of the winding roll 211, from which the interconnector 142 is unwound, thereby allowing the interconnector 142 to be unwound so as to pass through the end portion 211*b* of the winding roll 211 and to reach the alignment member 217.

For example, the unwinding control member 213 may allow the interconnector 142 to be unwound in the direction parallel to or tilted by an acute angle (inclination angle) C relative to the longitudinal direction of the winding roll 211 when passing through one end portion 211*b* of the winding roll 211. That is, although the angle between the interconnector 142 unwound from the winding roll 211 and the longitudinal direction of the winding roll 211 may change until the interconnector 142 reaches the alignment member 217, all of the portion of the interconnector 142 that is located between the winding roll 211 and the alignment member 217 may be parallel to or tilted by the acute angle C relative to the longitudinal direction of the winding roll 211.

In the present embodiment, when the interconnector 142 is unwound by the unwinding control member 213, the winding roll 211 may be fixed without being rotated. Here, that the winding roll 211 is not rotated means that the winding roll 211 is intended to be not rotated, and includes the case where the winding roll 211 unintentionally vibrates somewhat or rotates slightly due to vibration during a process.

In the present embodiment, the unwinding control member 213 may include a rotating member 2130, which is located on one end portion 211*b* of the winding roll 211. In one example, the rotating member 2130 may be rotatably fixed to the fixing rod 215*c* at a position close to the end portion 211*b* of the winding roll 211. The rotating member 2130 may rotate in a direction opposite the direction in which the interconnector 142 is wound onto the winding roll 211, whereby the interconnector 142 is unwound in the direction opposite the direction in which the interconnector 142 is wound.

In one example, the rotating member 2130 may include a rotatable fixing portion 2130*a*, which forms a center portion and is rotatably fixed to the fixing rod 215*c*, and an extension 2130*b*, which protrudes outward from the rotatable fixing portion 2130*a* and has an interconnector passage hole WH1, through which the interconnector 142 passes.

In one example, the rotatable fixing portion 2130*a* may include a ball bearing, which minimize kinetic friction resistance using balls located between an inner-diameter portion and an outer-diameter portion. When the fixing rod 215*c* is inserted into and fixed to the inner-diameter portion of the rotatable fixing portion 2130*a*, the rotating member 2130 may be rotatably fixed to the fixing rod 215*c*. Any of various known structures may be applied to the ball bearing, and thus, a detailed description thereof is omitted.

The extension 2130*b* may include an extending portion 2130*c*, which has a relatively small width and extends in the direction parallel to the diametric direction of the winding roll 211, and a bent portion 2130*d*, which is bent at the end of the extending portion 2130*c* in the direction crossing the end or to the circumferential direction. The interconnector passage hole WH1, through which the interconnector 142 passes, may be located in the end of the extending portion 2130*c* or the bent portion 2130*d*. Thereby, the interconnector passage hole WH1 may be located at a sufficiently long distance from the fixing portion 2130*a*, which may allow the interconnector 142 wound on the outer circumferential surface of the main body portion 211*a* to be smoothly unwound without interference from the end portion 211*b*. In one example, the interconnector passage hole WH1 may be located outside the outer edge of the end portion 211*b* of the winding roll 211*b*. The bent portion 2130*d* may assist the rotating member 2130 in rotating more smoothly. Although FIG. 9 illustrates that two extensions 2130*b* are symmetrically provided, one extension 2130*b* or three or more extensions 2130*b* may be provided.

In addition, the unwinding control member 213 may further include a drive unit 2130*e* for rotating the rotating member 2130. The drive unit 2130*e* may adopt, for example, any of various structures and methods, such as a motor. As illustrated in FIG. 9, the drive unit 2130*e* is located at the side of one end portion 211*b* of the winding roll 211 with the rotating member 2130 interposed therebetween. However, the present inventive concept is not limited thereto, and the drive unit 2130*e* may be located at any of various positions at which it may rotate the rotating member 2130. In addition, the unwinding control member 213 may further include, for example, a separate fixing member for fixing the rotating member 2130.

In the present embodiment, the unwinding control member 213 may further include a guide member 2132, which corresponds to the rotating member 2130 and guides the path along which the interconnector 142 moves. Although FIG. 9 illustrates that one guide member 2132 is provided so as to correspond to each unwinding control member 213, a plurality of guide members 2132 may be provided at required positions.

In one example, the present embodiment illustrates that the guide member 2132 is located between the rotating member 2130 and the alignment member 217 so as to corresponds to the rotating member 2130 in a one-to-one ratio. The guide member 2132 may have any of various structures including an interconnector passage hole WH2, through which the interconnector 142 passes. As illustrated in FIG. 9, the guide member 2132 includes a vertical portion 2132*a*, which is fixed to a guide fixing portion 215*f* protruding from the fixing plate 215*b* of the fixing frame 215 and extends upward perpendicular to the installation plane, and a passage portion 2132*b*, which is immovably located on the top of the vertical portion 2132*a* and has the interconnector passage hole WH2 therein. In one example, the vertical portion 2132*a* and the passage portion 2132*b* may configure a single body.

Figure 10:
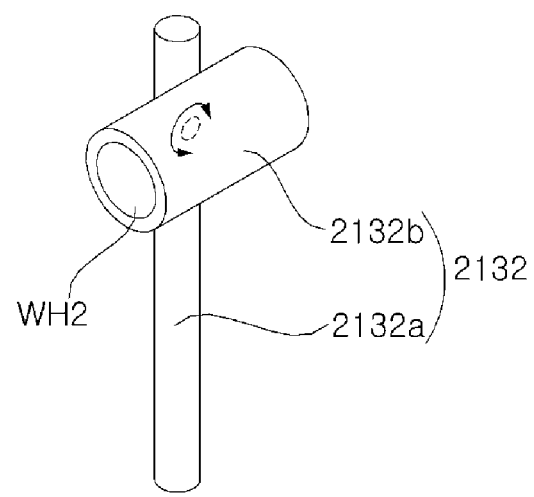
FIG. 10 is a perspective view illustrating another example of a guide member included in the interconnector attachment apparatus according to the embodiment of the present inventive concept.

However, the present inventive concept is not limited thereto. Referring to FIG. 10 illustrating an alternative embodiment of the guide member 2132, the passage portion 2132*b* having the interconnector passage hole WH2 may be rotatably located on the vertical portion 2132*a*. As such, even when the position of the interconnector 142, at which the interconnector 142 is unwound from the winding roll 211, changes, the passage portion 2132*b* may be rotated to a position at which it does not prevent the movement of the interconnector 142, which may ensure smoother movement of the interconnector 142.

Referring again to FIGS. 6 and 9, the guide member 2132 may be spaced apart from the rotating member 2130 by a predetermined distance. In one example, the guide member 2132 may be spaced apart from the rotating member 2130 by a distance ranging from 10 mm to 1000 mm. When the distance between the guide member 2132 and the rotating member 2130 is below 10 mm, the interconnector 142 may undergo drastic angular variation during movement, which may prevent the smooth movement of the interconnector 142. When the distance between the guide member 2132 and the rotating member 2130 exceeds 1000 mm, the size of the interconnector supply unit 210 may increase. However, the present inventive concept is not limited to the above range.

The multiple interconnectors 142, each guided by the guide member 2132, may be aligned by the alignment member 217 so as to be spaced apart from one another in the same plane by the same pitch as the pitch at which the interconnectors 142 are attached to the solar cell 150. As described above, the multiple winding rolls 211 may not be located in the same plane, and the pitch between the winding rolls 211 may differ from the pitch between the interconnectors 142 attached to the solar cell 150 even if the winding rolls 211 are located in the same plane. The alignment member 217 is located in consideration of this so as to align the multiple interconnectors 142 to be arranged at a constant interval in the same plane.

In the present embodiment, the alignment member 217 may include a transfer roll 217a, which rotates while supporting the interconnectors 142 placed thereon to allow the interconnectors 142 to be arranged in the same plane, and a plurality of spacers 217b, which adjusts the distance between the interconnectors 142 so that the interconnectors 142 that have passed through the transfer roll 217a are spaced apart from one another by a desired distance. In the present embodiment, each spacer 217b may be provided in the side surface thereof with a path 2170, through which the interconnector 142 passes. The transfer roll 217a and the spacers 217b may rotate in order to prevent the interconnector 142 from escaping from the path 2170 during movement, or to prevent even slight damage to the interconnector 142. However, the present inventive concept is not limited thereto, and the transfer roll 217a and the spacers 217b may not be rotated.

At this time, the spacers 217b may be arranged to form a plurality of columns in the processing direction of the interconnectors 142, and may be arranged so that each interconnector 142 passes through one side of the spacer 217b, which forms one column and then passes through the other side of the spacer 217b, which forms the next column. That is, the spacer 217b that forms one column and the spacer 217b that forms the next column are located so that the centers thereof are eccentric, which enables precise control of the position of the interconnector 142. However, the present inventive concept is not limited thereto, and, for example, various structures and shapes may be applied to the spacers 217b.

As described above, in the present embodiment, the interconnector 142 may take the form of a wire having a small width (e.g. a width within a range from 250 um to 500 um). When the interconnector 142 is unwound to pass through one end portion 211b of the winding roll 211 as in the present embodiment, the force to be applied to the interconnector 142 to unwind the interconnector 142 may be minimized. Thereby, the portion of the interconnector 142 that is wound around the winding roll 211 and the portion of the interconnector 142 that has been unwound from the winding roll 211 to thereby be provided to, for example, the flux unit 220 may have the same or similar yield strengths. For example, the portion of the interconnector 142 that is wound around the winding roll 211 may have a yield strength within a range from 67 MPa to 93 MPa, and the portion of the interconnector 142 that has been unwound from the winding roll 211 to thereby be provided to, for example, the flux unit 220 may have a yield strength within a range from 67 MPa to 102 MPa (e.g. encompassing the range from 67 MPa to 93 MPa). Alternatively, in the present embodiment, the yield strengths of the portion of the interconnector 142 that is wound around the winding roll 211 and the portion of the interconnector 142 that has been unwound from the winding roll 211 to thereby be provided to, for example, the flux unit 220 may have a difference within 10% (e.g. may be within a range from 100% to 110%). When the interconnectors 142 having this yield strength are attached to the solar cell 150, the yield strength of the interconnectors 142 may be 110 MPa or less (e.g. within a range from 67 MPa to 110 MPa) after being attached to the solar cell 150. This may minimize the stress applied to the solar cell 150 by the interconnectors 142, thereby improving the structural stability and reliability of the solar cell panel 100. In addition, deformation, cutting or the like of the interconnectors 142 may be prevented, which may enhance mass-productivity.

For reference, the yield strength of the interconnectors 142 may be measured using various apparatuses. In one example, the yield strength may be measured using a universal testing machine. However, for example, the concrete value of the yield strength of the interconnectors 142 may be changed by, for example, the material and width of the interconnectors 142, and thus the present inventive concept is not limited to the aforementioned numerical values.

On the other hand, unlike the present embodiment, when the interconnector 142 is unwound in a direction that is almost parallel to the direction in which the interconnector 142 is wound around the winding roll 211 (e.g. in the direction in which the interconnector 142 does not pass through the end portion 211b of the winding roll 211), force equal to the weight of the winding roll 211 is applied to the interconnector 142. Thereby, in the process of unwinding the interconnector 142, the interconnector 142 may experience a change in the yield strength thereof or may be deformed, and in the worst case, may be broken. In one example, the yield strength of the portion of the interconnector 142 that is wound around the winding roll 211 and the portion of the interconnector 142 that has been unwound from the winding roll 211 to thereby be provided to, for example, the flux unit 220 may have a great difference (e.g. a difference exceeding 10%). As such, because the yield strength of the interconnector 142 attached to the solar cell 150 is 120 MPA or more, the interconnector 142 may apply stress to the solar cell 150, causing the solar cell 150 to be easily damaged by, for example, external shocks.

Referring again to FIG. 6, the interconnectors 142, which are unwound from the winding rolls 211 and are aligned, pass through the flux unit 220. The flux unit 220 applies flux to outer surfaces of the interconnectors 142. At this time, the flux may be applied to the outer surfaces of the interconnectors 142 via any of various methods, such as, for example, dipping, spraying, or coating.

The flux, applied to the interconnectors 142 that have passed through the flux unit 220, is hardened while passing through the drying unit 230, thereby forming a flux layer around the outer circumferential surface of each interconnector 142. The drying unit 230 may have any of various structures for drying the flux. In one example, the drying unit 230 may dry the flux using wind, heat or the like. The present inventive concept is not limited as to the structure, method and the like of the drying unit 230.

For simplified and clear illustration, the detailed structures of the flux unit 230 and the drying unit 230 are not illustrated, and various structures may be applied thereto. The flux unit 220 and the drying unit 230 may be located within a single body. However, the present inventive concept is not limited thereto. The arrangement and the like of the flux unit 220 and the drying unit 230 may be altered in various ways.

The interconnectors 142 that have passed through the drying unit 230 are fixed to the jig 243 in the interconnector fixing unit 240.

The jig 243 is provided in the interconnector fixing unit 240, and includes first and second fixing parts 241 and 242, which fix the interconnectors 142 respectively on one side and the other side of the interconnectors 142. At this time, the interconnectors 142 are cut by a cutter 244 so that they have a length suitable for interconnecting two neighboring solar cells 150 or interconnecting the solar cell 150 and the bus ribbon (see reference numeral 145 in FIG. 1) when they are fixed to the jig 243.

In the present embodiment, the jig 243 may include the first fixing part 241, which is formed, on one side of the interconnectors 142, in the direction crossing the direction in which the interconnectors 142 extend so as to fix the interconnectors 142, and the second fixing part 242, which is formed, on the other side of the interconnectors 142, in the direction crossing the direction in which the interconnectors 142 extend so as to fix the interconnectors 142. In one example, each of the first fixing part 241 and the second fixing part 242 may have a linear shape and may extend a long length. In the jig 243 connected to the interconnectors 142, the first fixing part 241 and the second fixing part 242 are spaced apart from each other by a constant distance so as to continuously pull the interconnectors 142 interposed therebetween. Because the interconnectors 142 are configured as, for example, wires having a small width, when the first fixing part 241 and the second fixing part 242 continuously pull the interconnectors 142 as described above, the interconnectors 142 are plastically deformed and thus are no longer deformed. In the present embodiment, because the jig 243 includes the first and second fixing parts 241 and 242 for fixing opposite sides of the interconnectors 142, the interconnectors 142 may have a simplifies structure that maintains a predetermined yield strength. However, the present inventive concept is not limited thereto, and the structure of the jig 243 may be altered in various ways.

In one example, the first fixing part 241, which is located on one side of the jig 243 (e.g. the entrance side), is movable along three axes (the x-axis, the y-axis, and the z-axis of FIG. 6), which cross one another by an angle at least as large as a right angle, and the second fixing part 242, which is located on the other side of the jig 243 (e.g. the exit side), is movable along three axes (the x-axis, the y-axis, and the z-axis of FIG. 6), which cross one another by an angle at least as large as a right angle. The first and second fixing parts 241 and 242 may be moved to desired positions using various known structures or methods. In addition, the cutter 244 may be located on one side of the jig 243 (e.g. the entrance side) before the first fixing part 241.

The cutter 244 may adopt any of various structures and any of various methods for allowing free movement of the interconnectors 142, or for fixing the interconnectors 142 at predetermined positions or cutting the interconnectors 142 at the fixed positions. The structure of the cutter 244 will be described below in more detail with reference to FIG. 11.

FIG. 11 is a view illustrating an operation of the cutter 244 included in the interconnector attachment apparatus 200 of FIG. 6.

Referring to FIG. 11, in the present embodiment, the cutter 244 may include a first part 2441 and a second part 2442, and the second part 2442 may move relative to the first part 2441 in the left-and-right direction (e.g. the y-axis in FIG. 11), which is perpendicular to the processing direction of the interconnectors 142. The first part 2441 may include a plurality of first recesses (or first concave portions) R1, through which the respective interconnectors 142 may pass, and the second part 2442 may include a plurality of second recesses (or second concave portions) R2, through which the respective interconnectors 142 may pass. Both side surfaces of the first recess R1 of the first part 2441 may be configured as flat surfaces 2442a that are not sharp, so as to fix the interconnector 142 thereto without damage thereto. In addition, one side surface of the second recess R2 of the second part 2442 may be configured as the flat surface 2442a that is not sharp, so as to fix the interconnector 142 thereto without damage thereto, and the other side surface may be provided with a sharp cutting blade 2442b for cutting the interconnector 142. The cutting blade 2442b may protrude further than one surface of the second part 2442 in the processing direction so as to cut the interconnector 142 at the protruding position. Thereby, the interconnector 142, cut by the cutter 244, may be fixed in the cutter 244 at the position at which the interconnector 142 protrudes further than the surface of the second part 2442 of the cutter 244.

As described above, because the second part 2442 may move relative to the first part 2441 in the left-and-right direction, the width that the first recess R1 and the second recess R2 overlap each other may be freely adjusted. As illustrated in (a) of FIG. 11, when the width that the first recess R1 and the second recess R2 overlap each other is greater than the width of the interconnector 142, the interconnector 142 may freely move. As illustrated in (b) of FIG. 11, when the width that the first recess R1 and the second recess R2 overlap each other is equal to the width of the interconnector 142, the interconnector 142 may be fixed by the first part 2441 and the second part 2442. In addition, as illustrated in (c) of FIG. 11, when the cutting blade 2442b moves across the interconnector 142 and subsequently moves so that the width that the first recess R1 and the second recess R2 overlap each other becomes equal to the width of the interconnector 142, the interconnector 142 may be cut by the cutting blade 2442b and the remaining interconnector 142 may remain fixed in the cutter 244.

The structure and method of the cutter 244, as illustrated in FIG. 11 and described above, show that the cutter 244 is formed so as to guide and fix the interconnectors 142 to and at predetermined positions and to perform cutting thereon. However, the present inventive concept is not limited thereto, and the cutter 244 may adopt any of various structures and any of methods for cutting the interconnectors 142 to a predetermined length before or after the interconnectors 142 are fixed to the jig 243.

In addition, the first fixing part 241 may adopt any of various structures and any of various methods for fixing the interconnectors 142 at predetermined positions or moving the interconnectors 142. For example, the first fixing part 241 may clamp the interconnectors 142 so that the interconnectors 142 are fitted into and fixed to the first fixing part 241.

In one example, in the present embodiment, the first fixing part 241 may include a first part 2411 and a second part 2412, and the second part 2412 may move relative to the first part 2411 in the left-and-right direction (e.g. along the y-axis in FIG. 11), which is perpendicular to the processing direction of the interconnectors 142. The first part 2411 includes a first clamp PA, which corresponds to each interconnector 142 and is located on and comes into contact with one side of the interconnector 142 so as to extend toward the second part 2412 in the longitudinal direction of the interconnector 142, and the second part 2412 includes a second clamp PB, which corresponds to each interconnector 142 and is located on and comes into contact with the other side of the interconnector 142 so as to extend toward the first part 2411 in the longitudinal direction of the interconnector 142. As such, the interconnector 142 may be clamped and stably fixed in the longitudinal direction between the first clamp PA and the second clamp PB.

In one example, as illustrated, the first part 2411 may include a first protruding portion P11, which protrudes downward from the other side of the interconnector 142, a second portion P12, which protrudes from the first protruding portion P11 in the longitudinal direction of the first part 2411 so as to extend to one side of the interconnector 142, and a third protruding portion P13, which protrudes downward from the second portion P12. At this time, the first clamp PA may be located on the third protruding portion P13. Similarly, the second part 2412 may include a second fixing piece P2 including a first protruding portion P21, which protrudes downward from one side of the interconnector 142, a second portion P22, which protrudes from the first protruding portion P21 in the longitudinal direction of the second part 2412 so as to extend to the other side of the interconnector 142, and a third protruding portion P23, which protrudes downward from the second portion P22. At this time, the second clamp PB may be located on the third protruding portion P23. With this structure, the interconnector 142 may be stably clamped.

In the state in which the interconnector 142 is located between the first clamp PA and the second clamp PB, when the second part 2412 moves relative to the first part 2411 so that the distance between the first clamp PA and the second clamp PB is reduced until the first clamp PA and the second clamp PB come into close contact with respective opposite sides of the interconnector 142, the interconnector 142 may be stably fixed between the first clamp PA and the second clamp PB. Contrary, when the second part 2412 moves relative to the first part 2411 so that the distance between the first clamp PA and the second clamp PB is increased until the distance between the first clamp PA and the second clamp PB becomes greater than the width of the interconnector 142, the interconnector 142 may be stably separated or released from the first clamp PA and the second clamp PB.

Similarly, the second fixing part 242 may include a first part 2421, which includes a first clamp PA and a first fixing piece P1 (e.g. the first to third protruding portions P11, P12 and P13), and a second part 2422, which includes a second clamp PB and a second fixing piece P2 (e.g. the first to third protruding portions P21, P22 and P23). The description related to the first fixing part 241 may be directly applied to the second fixing part 242, and thus a detailed description thereof will be omitted.

Although the first and second parts 2411 and 2412 and 2421 and 2422, provided with the clamps PA and PB, move relative to each other so as to clamp the interconnector 142 in the present embodiment, the present inventive concept is not limited thereto. That is, various other structures may be applied to the structure of the clamps PA and PB, the structure of the first and second fixing pieces P1 and P2, and the structure of the first and second fixing parts 241 and 242.

In addition, the fixing unit 240 may further include a fixing member 246, located before the cutter 244, for fixing the interconnectors 142 during cutting. In one example, the present embodiment illustrates that the fixing member 246 has elements corresponding to the interconnectors 142 in a one-to-one ratio and is configured to push and fix the interconnector 142 when the interconnectors 142 are fixed without movement. A plurality of fixing members 246 may be spaced apart from one another at a constant distance. As such, when the interconnectors 142 are moved, cut, or fixed to the jig 243, the interconnectors 142 may be stably moved or fixed via control of the driving of the fixing members 246. Although FIG. 6 illustrates that two fixing members 246 are provided so that a minimum number of fixing members 246 stably perform the movement or fixing of the interconnector 142, the present inventive concept is not limited thereto. Various other structures may be applied to the structure of the fixing members 246, and the present inventive concept is not limited as to the number of fixing members 246.

The jig 243, to which the interconnectors 142 have been fixed, (e.g. the jig-interconnector coupling), moves to the attachment unit 250. In one example, the first and second fixing parts 241 and 242 may be driven in various directions (e.g. along the x-axis, the y-axis and the z-axis of the drawings) while maintaining a constant distance therebetween. Accordingly, the interconnectors 142 move to the attachment unit 250 while remaining fixed to the jig 243 so as not to be unintentionally deformed.

Various known structures may be applied as the structure for moving the first and second fixing parts 241 and 242 to a desired position. In addition, various structures may be applied as the structure for fixing the interconnectors 142 by the first and second fixing parts 241 and 242.

Referring to FIG. 7, the attachment unit 250 attaches the interconnectors 142 to the solar cell 150 by applying heat thereto via a heat source 258 in the state in which pressure is applied to fix the interconnectors 142 and the solar cell 150 to each other. At this time, in the present embodiment, the jig 243 is separated from the interconnectors 142 after fixing the interconnectors 142 and the solar cell 150 to each other, and the interconnectors 142 and the solar cell 150 pass through the heat source 258 in the absence of the jig 243.

In the present embodiment, the jig 243 is removed in the state in which the interconnectors 142 and the solar cell 150 are pressed together using exhaust adsorption. That is, in the state in which the interconnectors 142 and the solar cell 150 are attracted by and fixed to each other via exhaust without the jig 243, the interconnectors 142 and the solar cell 150 pass through the heat source 258. Thereby, the interconnectors 142 and the solar cell 150 may be stably fixed to each other via a simple method. In addition, because the jig 243 may be returned to the interconnector fixing unit 240 after transferring the interconnectors 142 to the attachment unit 250, the number of jigs 243 to be operated in the interconnector attachment apparatus 200 may be very small. Productivity may be considerably increased when the number of jigs 243 to be operated is reduced.

An exhaust device (or a vacuum device) 259 for discharging air for exhaust adsorption may be provided. A pump, a compressor or the like may be used as the exhaust device 259, but devices that adopt various other structures, methods, and shapes may be used. Although the exhaust device 259 may be conceptually illustrated below the right side of the attachment unit 250 of FIG. 7 in order to assist understanding, the exhaust device 259 may be located outside the attachment unit 250 so as to be connected to the attachment unit 250 in practice.

At this time, a working table may be configured as a conveyor belt 252 so as to ensure easy exhaust adsorption and easy movement of the interconnectors 142 and the solar cell 150 to the heat source 258. In the present embodiment, a plurality of conveyor belts 252 may be spaced apart from one another. Thereby, the interconnectors 142 and the solar cell 150 may be more easily pressed together because the discharge of air is possible between the conveyor belts 252. In addition, the conveyor belts 252 may have a small width, and thus may be easily driven.

Each conveyor belt 252 may have an exhaust hole 252a therein. Thereby, the solar cell 150 and the interconnectors 142 may be effectively pressed together when the exhaust device 259 performs the discharge of air through the exhaust hole 252a. The exhaust device 259 may have a structure for discharging air through the exhaust hole 252a.

In one example, opposite edge portions of each conveyor belt 252 may be provided with the respective interconnectors 142, and a center portion of the conveyor belt 252 may be provided with a plurality of exhaust holes 252a, which are spaced apart from one another by a constant distance in the longitudinal direction of the conveyor belt 252. As such, the interconnectors 142 and the solar cell 150 may be effectively pressed together via the discharge of air between the two adjacent conveyor belts 252 as well as the discharge of air through the exhaust holes 252a in the respective conveyor belts 252. Thereby, the fixing stability of the interconnectors 142 and the solar cell 150 may be improved.

At this time, a third fixing part 254 may be located on one side of the conveyor belts 252 (before the beginning portion of the conveyor belts 252) to prevent deviation in the positions of the interconnectors 142 and the solar cell 150 when the interconnectors 142 and the solar cell 150 are fixed using exhaust adsorption. The third fixing part 254 remains fixed at a constant position relative to the conveyor belts 252.

The third fixing part 254 may adopt any of various structures and any of various methods for fixing the interconnectors 142 at constant positions or moving the interconnectors 142. In one example, in the present embodiment, the third fixing part 254 may include a first part 2541 and a second part 2542, and the second part 2542 may move relative to the first part 2541 in the left-and-right direction (e.g. in the y-axis in the drawings), which is perpendicular to the direction in which the interconnectors 142 extend.

The first part 2541 includes a first clamp PA, which is formed in the longitudinal direction of the interconnector 142 so as to come into close contact with one side of the interconnector 142, and a second clamp PB, which is formed in the longitudinal direction of the interconnector 142 so as to come into close contact with the other side of the interconnector 142. In addition, the first part 2541 may include a first fixing piece P1, which includes a first protruding portion P11 protruding upward from the other side of the interconnector 142, a second portion P12 extending from the first protruding portion P11 to one side of the interconnector 142 in the longitudinal direction of the first part 2541, and a third protruding portion P13 protruding upward from the second portion P12. At this time, the first clamp PA may be located on the third protruding portion P13. Similarly, the second portion 2542 may include a second fixing piece P2, which includes a first protruding portion P21 protruding upward from one side of the interconnector 142, a second portion P22 extending from the first protruding portion P21 to the other side of the interconnector 142 in the longitudinal direction of the second part 2542, and a third protruding portion P23 protruding upward from the second portion P22. At this time, the second clamp PB may be located on the third protruding portion P23. With this structure, the interconnector 142 may be stably clamped.

The interconnector 142 may be stably fixed without interfering with the first fixing part 241 because the first clamp PA, the first fixing piece P1, the second clamp PB and the second fixing piece P2 of the third fixing part 254 protrude upward, unlike the first and second fixing parts 241 and 242. With the exception that the first clamp PA, the first fixing piece P1, the second clamp PB and the second fixing piece P2 protrude upward, rather than downward, the first clamp PA, the first fixing piece P1, the second clamp PB and the second fixing piece P2 are the same as those of the first or second fixing part 241 or 242, and thus, the above description related to those of the first or second fixing part 241 or 242 may be directly applied thereto.

Although the present embodiment illustrates that the first and second parts 2541 and 2542 having the clamps PA and PB move relative to each other so as to clamp the interconnector 142, the present inventive concept is not limited thereto. That is, various other structures may be applied as the structure of the clamps PA and PB, the structure of the first and second fixing pieces P1 and P2, and the structure of the first and second fixing parts 241 and 242.

A solar cell supply unit (see reference numeral 251 in FIG. 13) for supplying the solar cell 150 may be provided above the conveyor belts 252. The solar cell supply unit 251 may not be connected to the working table 252, to the heat source 258, or to an upper fixing member supply unit 2560, may be driven by an individual drive unit, and may serve to supply the solar cell 150 to the working table 252. Various known structures and methods may be applied to the solar cell supply unit 251.

The upper fixing member supply unit 2560 may be located above the conveyor belts 252 and may serve to provide an upper fixing member 256, which may fix the interconnectors 142 over the solar cell 150.

Referring to FIG. 8, the upper fixing member 256, supplied from the upper fixing member supply unit 2560, fixes the interconnectors 142 over the solar cell 150, prior to being introduced into the heat source 258. Then, the upper fixing member 256, which fixes the interconnectors 142 over the solar cell 150, passes through the heat source 258 along with the interconnectors 142 and the solar cell 150. The solar cell 150 and the interconnectors 142 are attached to each other while the upper fixing member 256 passes through the heat source 258. After passing through the heat source 258, the upper fixing member 256 may be separated from the solar cell 150 and the interconnectors 142, and may be returned to the upper fixing member supply unit 2560. At this time, the upper fixing member supply unit 2560 may be driven by an individual drive unit without being connected to the working table 252, to the heat source 258 or the like, and may serve to provide the upper fixing member 256 to the upper side of the solar cell 150 and the interconnectors 142.

In one example, the upper fixing member supply unit 2560 may be located so as to extend from a position before the heat source 258 to a position after the heat source 258, thereby easily supplying the upper fixing member 256 to the upper side of the interconnectors 142 and the solar cell 150 and easily collecting the upper fixing member 256 that has passed through the heat source 258 at the position after the heat source 258. However, the present inventive concept is not limited thereto.

The upper fixing member supply unit 2560 may include a plurality of upper fixing members 256. As such, while one upper fixing member 256 is passing through the heat source 258, another upper fixing member 256 may fix the solar cell 150 and the interconnectors 142 located after the heat source 258. In this way, a process of successively attaching the solar cells 150 may be performed.

In the present embodiment, the upper fixing member 256 may include a frame unit 2562; 2566, and a plurality of fixing pieces 2564 fixed to the frame unit 2562; 2566 so as to fix the interconnectors 142. The upper fixing member 256 will be described below in detail with reference to FIG. 12.

Figure 12:
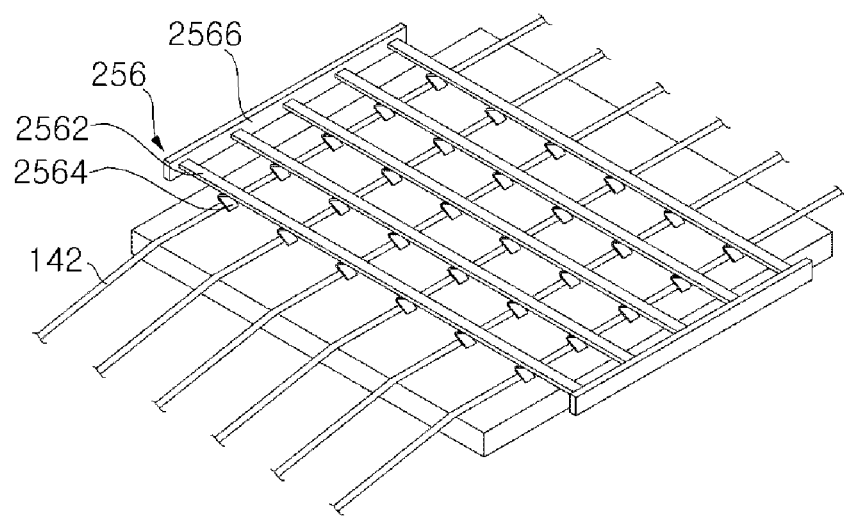
FIG. 12 is a perspective view illustrating the state in which the solar cell and the interconnectors disposed thereon are fixed using an upper fixing member included in the interconnector attachment apparatus of FIG. 7.

FIG. 12 is a perspective view illustrating the state in which the solar cell 150 and interconnectors 142 disposed thereon are fixed using the upper fixing member 256 included in the interconnector attachment apparatus 200 of FIG. 7.

Referring to FIGS. 7 and 12, the frame unit 2562 and 2566 may have any of various shapes for fixing the fixing pieces 2564. In one example, the frame unit may include a plurality of first parts 2562 arranged in the direction crossing the direction in which the interconnectors 142 extend, and second parts 2566 for connecting the first parts 2562 to one another at opposite sides thereof. As such, the structure of the upper fixing member 256 may be simplified and the fixing pieces 2564 may be stably fixed.

The fixing pieces 2564 may be located on the first parts 2562 at positions corresponding to the respective interconnectors 142. The fixing pieces 2564 may be located on the respective first parts 2562 so that one interconnector 142 is fixed by the multiple fixing pieces 2464.

Each fixing piece 2564 may have any of various structures for pushing and fixing the interconnector 142. For example, the fixing piece 2564 may be formed of an elastic member. In one example, the fixing piece 2564 may have an obliquely bent portion. As such, when the interconnector 142 is located below the bent portion of the fixing piece 2564, the bent portion of the fixing piece 2564 may elastically push the interconnector 142 so as to apply pressure thereto. However, the present inventive concept is not limited thereto, and the structure, method and the like of the upper fixing member 256 may be altered in various ways.

The heat source 258 applies heat to the solar cell 150 at the upper side or the lower side of the conveyor belts 252. The interconnectors 142 may be attached to the electrodes 42 and 44 of the solar cell 150 (more particularly, the pad portions 424) as the solder layers 142b of the interconnectors 142 are melted and soldered by heat supplied from the heat source 258. In the present embodiment, because the heat source 258 directly applies heat, the time of the attachment process may be reduced and the attachment property may be improved. In one example, the heat source 258 may be an infrared lamp. However, the present inventive concept is not limited thereto, and the heat source 258 may adopt any of various structures and any of various methods for supplying heat.

Figure 13:
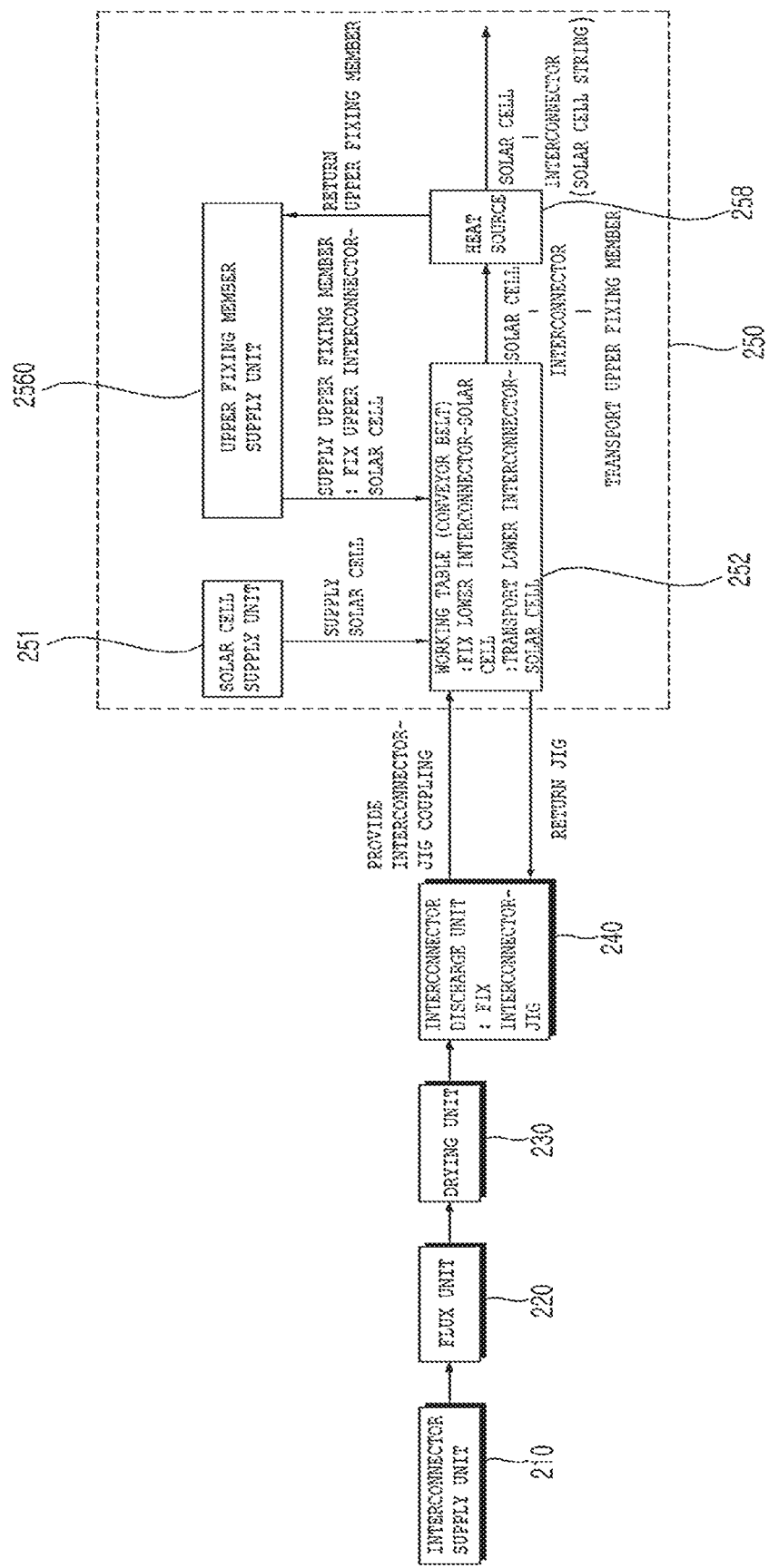
FIG. 13 is a block diagram schematically illustrating the interconnector attachment apparatus according to the embodiment of the present inventive concept.

FIG. 13 is a block diagram schematically illustrating the interconnector attachment apparatus 200 according to the embodiment of the present inventive concept.

Referring to FIG. 13 as well as FIGS. 6 to 8, the interconnectors 142, supplied from the interconnector supply unit 210, are provided to the interconnector fixing unit 240 after passing through the flux unit 220 and the drying unit 230. In the interconnector fixing unit 240, only the interconnectors 142 are fixed to the jig 243 so as to form an interconnector-jig coupling, separately from the solar cell 150.

The formed interconnector-jig coupling is provided to the working table 252. In addition, the solar cell 150 is provided from the solar cell supply unit 251 to the working table 252. At this time, the solar cell 150 and the interconnectors 142 located therebelow are fixed to each other on the working table 252 via adsorption, and the solar cell 150 and the interconnectors 142 located thereabove are fixed to each other by the upper fixing member 256, which is located above them. Once the solar cell 150 and the interconnectors 142 are fixed to each other by the working table 252 or the upper fixing member 256, the jig 243, which has fixed to the interconnectors 142, is separated from the interconnectors 142 and is returned to the interconnector fixing unit 240. As such, the working table 252 serves not only to transport the interconnectors 142 and the solar cell 150, but also to fix the solar cell 150 and the interconnectors 142 located therebelow at predetermined aligned positions to each other.

Then, as the solar cell 150, the interconnectors 142, and the upper fixing member 256 together pass through the heat source 258, the solar cell 150 and the interconnectors 142 are attached to each other so as to form solar cell strings. The upper fixing member 256 that has passed through the heat source 258 is separated from the solar cell 150 and the interconnectors 142 and is returned to the upper fixing member supply unit 2560.

The operation of the interconnector attachment apparatus 200 and the interconnector attachment method according to the present embodiment will be described below in more detail with reference to FIGS. 6 to 12 and FIGS. 14A to 14G.

FIGS. 14A to 14G are views for explaining the operation of the attachment unit 250 included in the interconnector attachment apparatus 200 of FIG. 7.

The multiple interconnectors 142 (for example, first interconnectors 1421), which are aligned so as to be spaced apart from one another in the same plane, are provided to the flux unit 220 and the drying unit 230 by the interconnector supply unit 210. Thereby, flux layers are formed on the outer surfaces of the first interconnectors 1421a so as to improve the attachment property of the first interconnectors 1421. For reference, in the present embodiment, the interconnectors 142 that are initially located only below the first solar cell 151 and are attached thereto are referred to as the first interconnectors 1421, and the interconnectors 142 that interconnect the first solar cell 151 and the second solar cell 152 are referred to as second interconnectors 1422. However, the terms "the first interconnectors 1421" and "the second interconnectors 1422" are used only for distinction therebetween, and the present inventive concept is not limited thereto.

The first interconnectors 1421, fixed to the cutter 244 and the fixing member 246, are located so as to protrude further than the flat surface of the second part 2442 of the cutter 244. In this state, the second fixing part 242 moves in the direction opposite the processing direction (e.g. in the negative x-axis direction in the drawings) until it reaches the position at which the first interconnectors 1421 protruding from the cutter 244 are located. At this time, the first fixing part 241 moves upward or downward so that it does not prevent the second fixing part 242 from reaching the first interconnectors 1421, which protrude from the cutter 244. In addition, when the second part 2422 of the second fixing part 242 moves in the left-and-right direction (the y-axis) to adjust the distance between the third recess R3 and the fourth recess R4, the first interconnectors 1421 that are fixed to the cutter 244 are fixed to the second fixing part 242.

Subsequently, the fixing member 246 moves to the position at which it does not fix the first interconnectors 1421, and the cutter 244 is released so as not to fix the first interconnectors 1421 as illustrated in (a) of FIG. 11. Thereby, the first interconnector 1421 may be freely movable, rather than being fixed to the cutter 244.

Subsequently, the second fixing part 242 moves in the processing direction (e.g. in the positive x-axis direction in the drawings) by the desired length of the first interconnectors 1421, and the first fixing part 241 moves to the position at which it may fix the first interconnectors 1421 so as to fix one side of the first interconnectors 1421 at the position close to the cutter 244. In addition, the fixing member 246 pushes the first interconnectors 1421 so as to fix the positions of the first interconnectors 1421.

In this state, the cutter 244 operates as illustrated in (c) of FIG. 11 so as to cut the first interconnectors 1421 at the same time. Thereby, all of the first interconnectors 1421, having been cut to the desired length, are fixed to the jig 243 so as to form a first jig-interconnector coupling. At this time, the first interconnectors 1421, fixed between the first fixing part 241 and the second fixing part 242, are plastically deformed upon receiving longitudinal tensile force, and after being plastically deformed, are no longer deformed between the first fixing part 241 and the second fixing part 242, which are maintained at a constant distance. Thereby, the first interconnectors 1421, fixed to the jig 243, are no longer deformed even if the jig 243 moves.

Figure 14A:
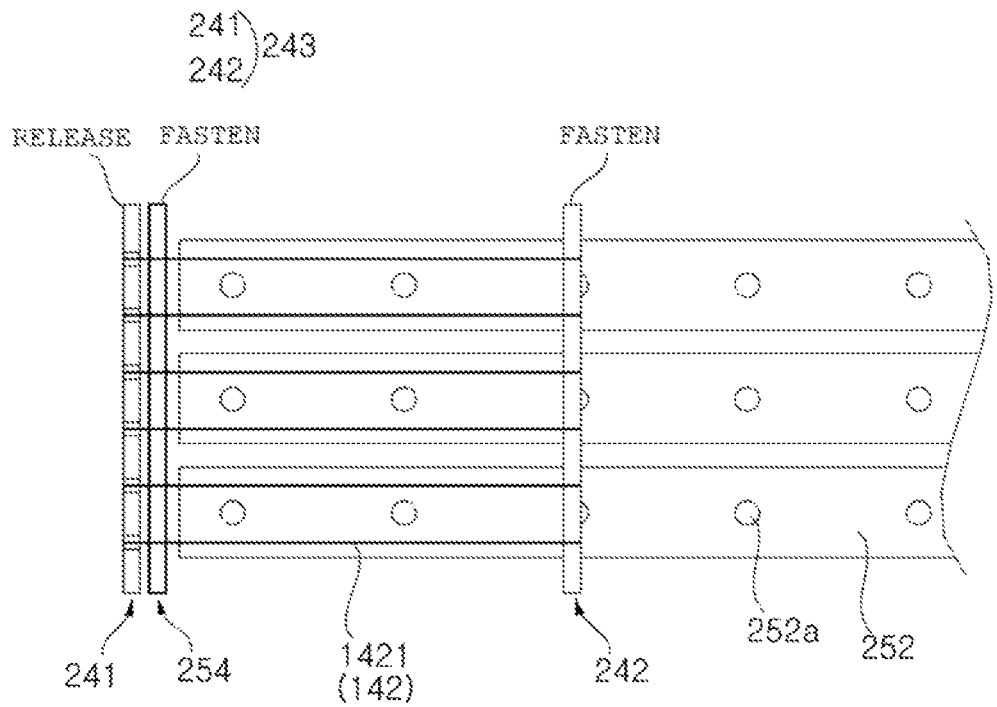
FIGS. 14A to 14G are views for explaining an operation of an attachment unit included in the interconnector attachment apparatus of FIG. 7.
Figure 14B:
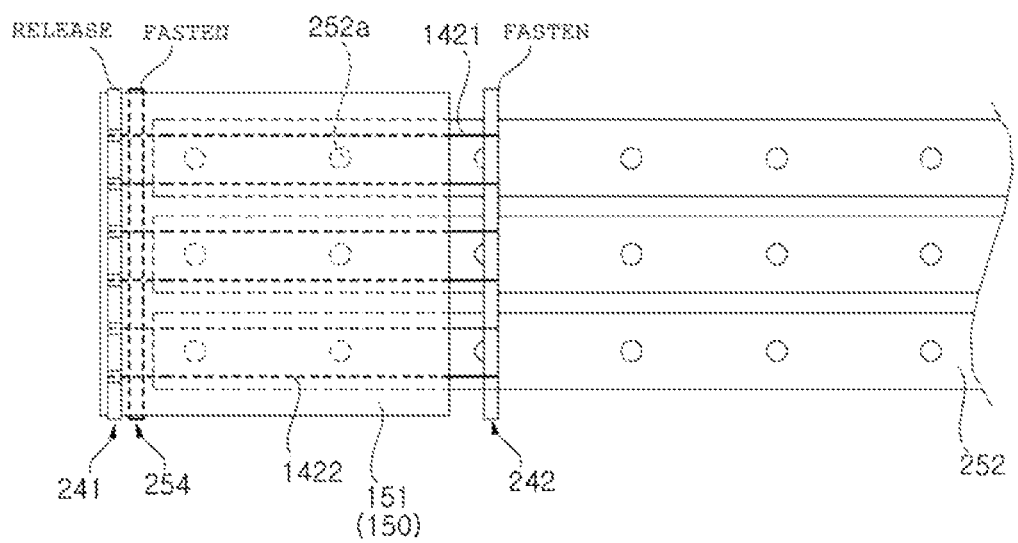

Subsequently, as illustrated in FIGS. 14A and 14B, the jig 243, to which the first interconnectors 1421 are fixed, is placed on the working table, and the first interconnectors 1421 and the first solar cell 151 are fixed to each other.

For example, first, as illustrated in FIG. 14A, the jig 243, to which the first interconnectors 1421 are fixed (e.g. the first interconnector-jig coupling), is placed on the conveyor belts 252 that configure the working table. In this state, the third fixing part 254, which is located on one side of the conveyor belts 252, is fastened to the first interconnectors 1421, which have been fixed to the first fixing part 241, between the first fixing part 241 and the second fixing part 242 so as to catch and fix the first interconnectors 1421, and the first fixing part 241 is released from the first interconnectors 1421. At this time, the first interconnectors 1421 may have a first length, which is slightly longer than the first solar cell 151 and is shorter than the sum of the lengths of the first solar cell 151 and the second solar cell 152, so as to allow the first connectors 1421 to be connected to the bus ribbon (see reference numeral 145 in FIG. 1). When the third fixing part 254 fixes one side of the first interconnectors 1421, the first interconnectors 1421 may be stably fixed to the working table because the third fixing part 254 maintains a constant positional relationship with the working table at one side of the working table.

Then, as illustrated in FIG. 14B, an exhaust operation is performed using the exhaust device 259 in the state in which the first solar cell 151 is placed above the conveyor belts 252 and the first interconnectors 1421. Thereby, the first solar cell 151 is pressed toward and fixed to the first interconnectors 1421. At this time, the first fixing part 241 may be located above the first solar cell 151 so that it does not prevent the first solar cell 151 from being attracted by the working table 252 above the first interconnectors 1421. As described above, because the first interconnectors 1421 have the first length, which is greater than the length of the first solar cell 151, and the second fixing part 242 is spaced apart from the first solar cell 151 by a predetermined distance, the second fixing part 242, which is fastened to the first interconnectors 1421, does not prevent the first solar cell 151 from being adsorbed and fixed to the working table 252.

Figure 14C:
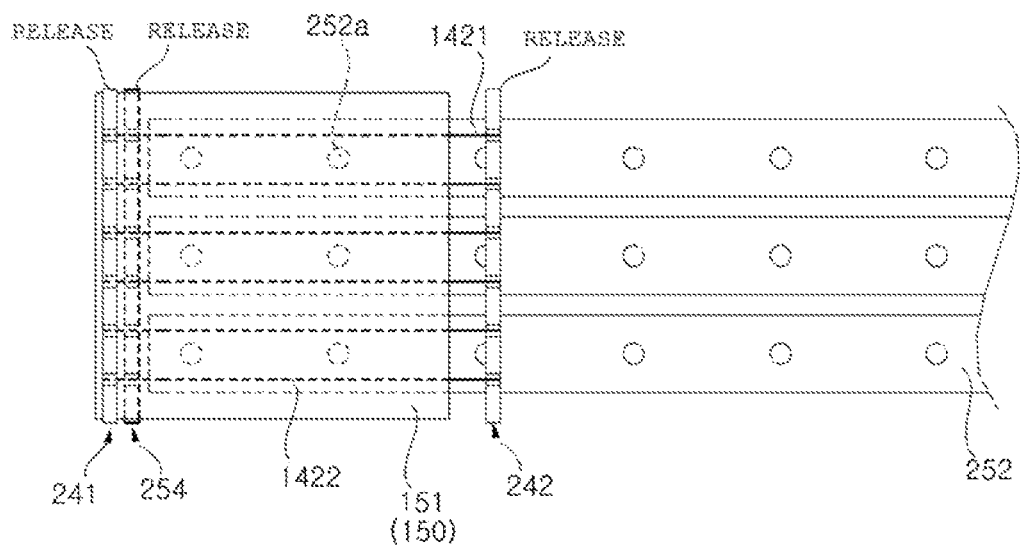

Subsequently, as illustrated in FIG. 14C, the second fixing part 242 is released so that the jig 243 is separated from the first interconnectors 1421. At this time, the third fixing part 243 is released along with the second fixing part 242 so that the first interconnectors 1421 and the first solar cell 151, which are fixed to each other, are movable via movement of the conveyor belts 252. Even if the third fixing part 254 and the second fixing part 242 are released, the conveyor belts 252, the first interconnectors 1421, and the first solar cell 151 are stably fixed to one another via exhaust attraction. In this way, the jig 243 is completely separated from the first interconnectors 1421, and the separated jig 243 is returned to the interconnector fixing unit 240.

Figure 14D:
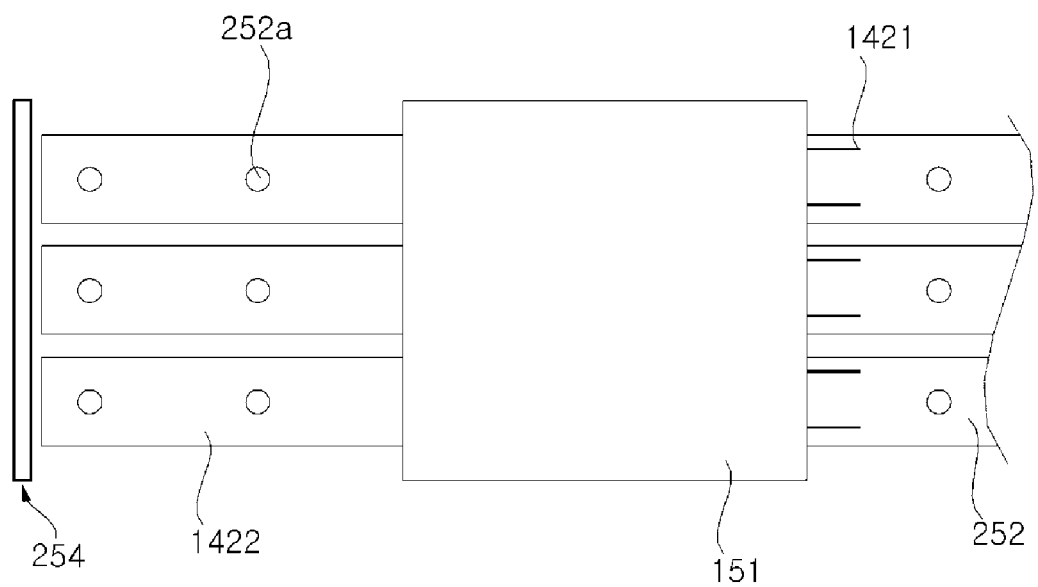

Subsequently, as illustrated in FIG. 14D, the first solar cell 151 and the first interconnectors 142 attached to the lower surface of the first solar cell 151 are moved in the processing direction by the conveyor belts 252.

Figure 14E:
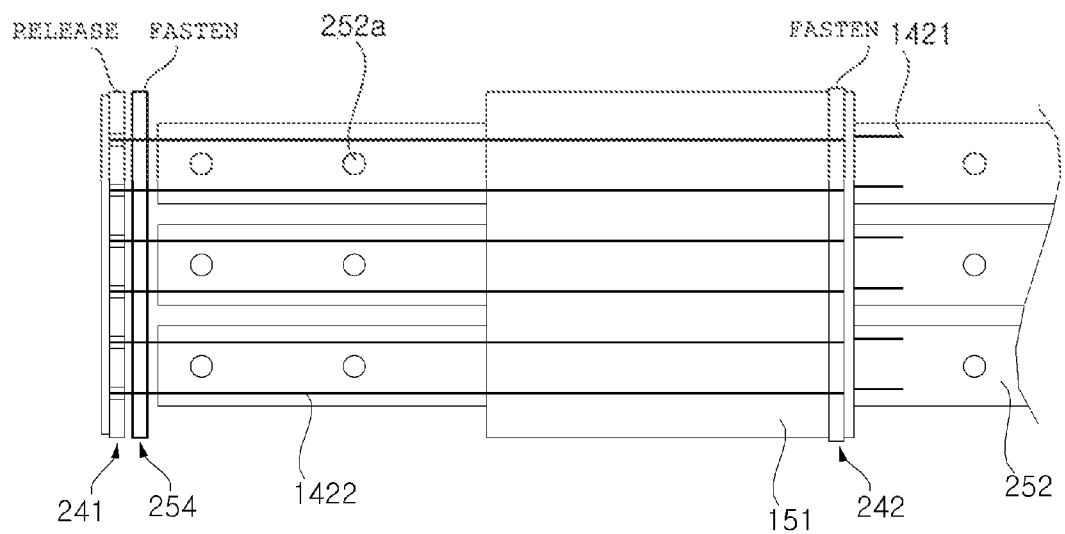
Figure 14F:
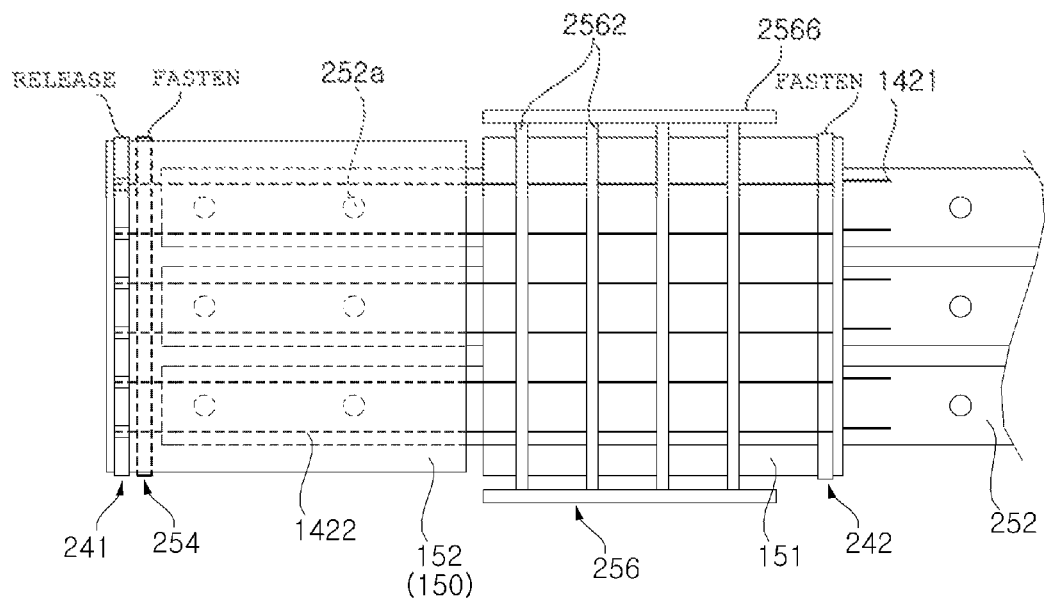

Subsequently, as illustrated in FIGS. 14E and 14F, other interconnectors 142 (e.g. a plurality of second interconnectors 1422) are placed over the first solar cell 151. A portion of each second interconnector 1422 is fixed over the first solar cell 151, and the second solar cell 152 is fixed over another portion of the second interconnector 1422.

That is, as illustrated in FIG. 14E, the jig 243, to which the second interconnectors 1422 are fixed (e.g. a second interconnector-jig coupling), is located so as to move from the third fixing part 254 and pass through the first solar cell 151, which is located over the conveyor belts 252. The second interconnector-jig coupling may be formed via the same method as the method of forming the first interconnector-jig coupling by the interconnector fixing unit 240. The second interconnectors 1422 may have a second length, which is longer than the sum of the lengths of the two solar cells (e.g. the first and second solar cells 151 and 152), so as to interconnect the first and second solar cells 151 and 152.

In this state, the third fixing part 254, which is located on one side of the conveyor belt 252, is fastened to the second interconnectors 1422 so as to catch and fix the second interconnectors 1422, which have been fixed to the first fixing part 241, and the first fixing part 241 is released from the second interconnectors 1422.

Then, as illustrated in FIG. 14F, when the second solar cell 152 is placed over the portions of the second interconnectors 1422 located over the conveyor belts 252, the second interconnectors 1422 are fixed to the second solar cell 152 via exhaust attraction. In addition, the upper fixing member 256 is located on the second interconnectors 1422 located over the first solar cell 151, so that the fixing pieces 254 push and fix the second interconnectors 1422 as illustrated in FIG. 12.

Figure 14G:
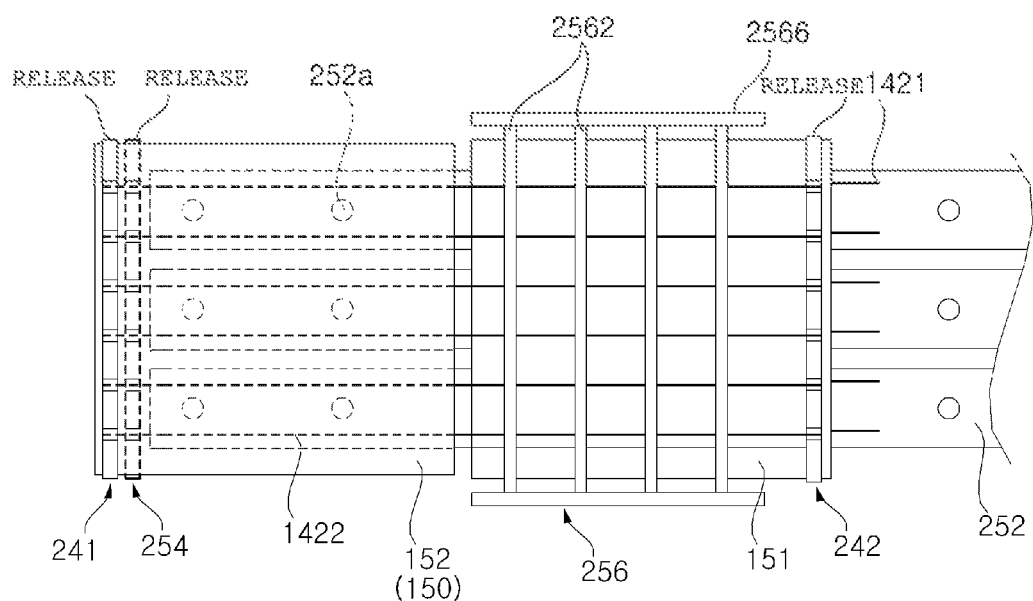

Subsequently, as illustrated in FIG. 14G, the second fixing part 242 is released so that the jig 243 is separated from the second interconnectors 1422. At this time, the third fixing part 254 is released along with the second fixing part 242 so that the second interconnectors 1422 and the second solar cell 152, which are fixed to each other, may move via movement of the conveyor belts 252. Even if the third fixing part 254 and the second fixing part 242 are released, the conveyor belts 252, the second interconnectors 1422 and the first and second solar cells 151 and 152 are stably fixed to one another via exhaust attraction. In this way, the jig 243 is completely separated from the second interconnectors 1422, and the separated jig 243 is returned to the interconnector fixing unit 240.

When the solar cell 150 passes through the heat source 258 in the state in which all of the interconnectors 142 are attached to the upper surface and the lower surface of the solar cell 150, the flux and the solder layers 142b on the interconnectors 142 are melted, causing the interconnectors 142 to be attached to the first or second electrode 42 or 44 of the solar cell 150. For example, the first interconnectors 1421, which are disposed on one surface of the first solar cell 151, and the second interconnectors 1422, which are disposed on the other surface of the first solar cell 151, may be attached to the opposite surfaces of the first solar cell 151 when heat is applied to the first solar cell 151.

In addition, portions of other multiple interconnectors 142 may be placed on a portion of the second solar cell 152, and another solar cell (e.g. a third solar cell) may be placed on other portions of the interconnectors 142. The interconnectors 142 may be attached to the second solar cell 152 by applying heat to the second solar cell 152, on both surfaces of which the interconnectors 142 are placed. A single column of solar cells may be formed by repeating the operation described above. In the state in which the interconnectors 142 having a first length are placed on the last solar cell 150 that constitutes the column of solar cells, heat may be applied to the interconnectors 142, which are fixed using the upper fixing member 256 to attach the interconnectors 142.

According to the present embodiment, the jig 243 is separated from the interconnectors 142 prior to passing through the heat source 258, which may minimize the number of jigs 243 that are operated. Thereby, the structure of the interconnector attachment apparatus 200 may be simplified and productivity may be improved. At this time, when the interconnectors 142 and the solar cell 150 are fixed to each other via exhaust attraction, the interconnectors 142 and the solar cell 150 may be stably fixed to each other without damage thereto. In addition, the interconnectors 142, cut by the cutter 244, are fixed and attached to the solar cell 150, which may simplify the structure and the process of manufacturing the interconnectors 142. In addition, the attachment of the interconnectors 142 may be automated when the interconnectors 142 pass through the heat source 258 by the conveyor belts 252 while being placed on opposite surfaces of the solar cell 150. Thereby, the interconnectors 142, each of which includes a rounded portion and the solder layer 142b, may be attached to the solar cell 150 using an automated system.

For simplified and clear description, only indispensable components of the interconnector attachment apparatus 200 according to the present embodiment have been described above and illustrated in the drawings. The cutter 244, the fixing member 246, the first fixing part 241, the second fixing part 242, the third fixing part 243, the upper fixing member 256 and the like may be provided with a drive member (e.g. a motor) and a portion connected thereto (e.g. an arm or a link) for driving or changing the position thereof. In addition, a controller for operating the drive member in a wired or wireless manner may be provided. Thereby, the interconnector attachment apparatus 200 may be operated in a desired manner. Various known methods or structures may be applied to the above-described drive member, the connection portion, and the controller.

The interconnector attachment apparatus for the solar cell panel and the interconnector attachment method using the same according to another embodiment of the present inventive concept will be described below with reference to the accompanying drawings. A detailed description of the same or similar parts to those of the above-described embodiment will be omitted and only different parts will be described below in detail. In addition, the above-described embodiment and alternative embodiments thereof and the following embodiments and alternative embodiments thereof may be combined with one another, and this combination falls within the scope of the present inventive concept.

Figure 15:
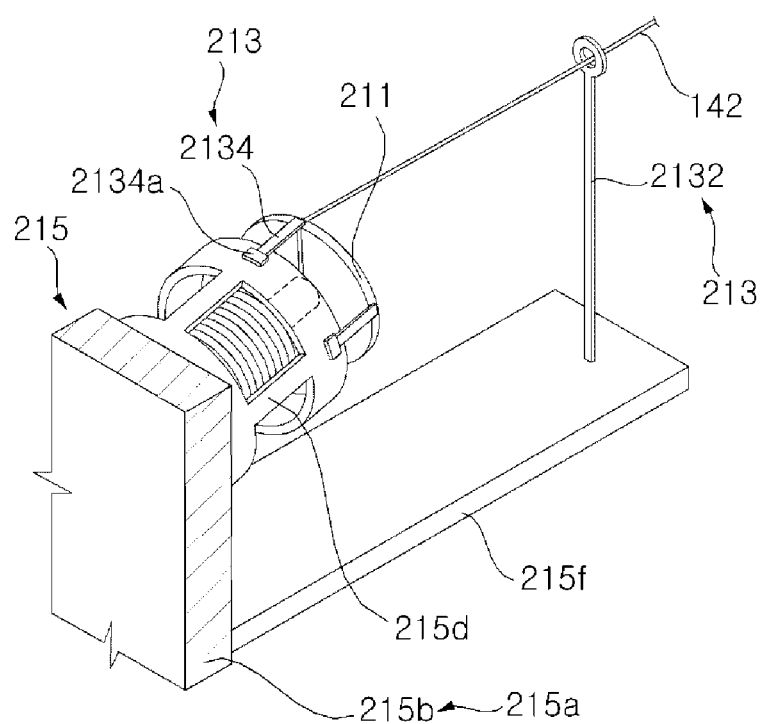
FIG. 15 is an exploded perspective view illustrating part of the interconnector supply unit included in the interconnector attachment apparatus for the solar cell panel according to another embodiment of the present inventive concept.

FIG. 15 is an exploded perspective view illustrating part of the interconnector supply unit included in the interconnector attachment apparatus for the solar cell panel according to another embodiment of the present inventive concept. For clear and simplified illustration, in FIG. 15, parts corresponding to FIG. 9 are illustrated, but the illustration of the alignment member 217 is omitted.

Referring to FIG. 15, in the present embodiment, the unwinding control member 213 may include a stopper member 2134, which is fixed to the outer fixing piece 215d and extends to a position above one end portion 211b, through which the interconnector 142 passes when unwound from the winding roll 211, so as to be placed above the end portion 211b. The stopper member 2134 is fixed to the outer fixing piece 215d, but is placed above the end portion 211b without being fixed thereto. The stopper member 2134 serves to guide the unwinding direction of the interconnector 142 and to prevent the interconnector 142 from becoming tangled during unwinding. That is, the interconnector 142 temporarily stops, rather than being unwound, at the position at which the stopper member 2134 is located, and then is unwound by passing through a gap between the stopper member 2134 and the end portion 211b when force is continuously applied to move the interconnector 142 in the processing direction.

A plurality of stopper members 2134 may be arranged at a constant interval in the circumferential direction of the outer fixing piece 215d so as to effectively prevent the interconnector 142 from becoming tangled. However, the present inventive concept is not limited thereto, and a single stopper member 2134 may be provided.

The stopper member 2134 may include a resin as a main component (e.g. the component included in the largest amount), or may be formed of a material that is slightly elastic, in order to prevent damage to the interconnector 142. Thereby, the interconnector 142 may pass through one end portion 211a and the stopper member 2134 as needed while minimizing damage thereto. Since the outer fixing piece 215d may include, as a main component, a metal so as to stably protect the winding roll 212, the outer fixing piece 215d and the stopper member 2134 may be formed of different materials. As such, the stopper member 2134 may be manufactured separately from the outer fixing piece 215d and may be fixed to the outer fixing piece 215d. In one example, the stopper member 2134 may be fixed by an adhesive member 2134a (e.g. a piece of adhesive tape), which extends from the top of the stopper member 2134 to the outer fixing piece 215d and is located on the outer fixing piece 215d. When the stopper member 2134 is fixed to the outer fixing piece 215d by the adhesive member 2134a, the stopper member 2134 may be fixed via a simplified method.

The unwinding control member 213 may further include the guide member 2132, which is spaced apart from the winding roll 211 by a predetermined distance. The description of FIG. 9 may be directly applied to the guide member 2132, and thus a detailed description of the guide member 2132 is omitted.

Figure 16:
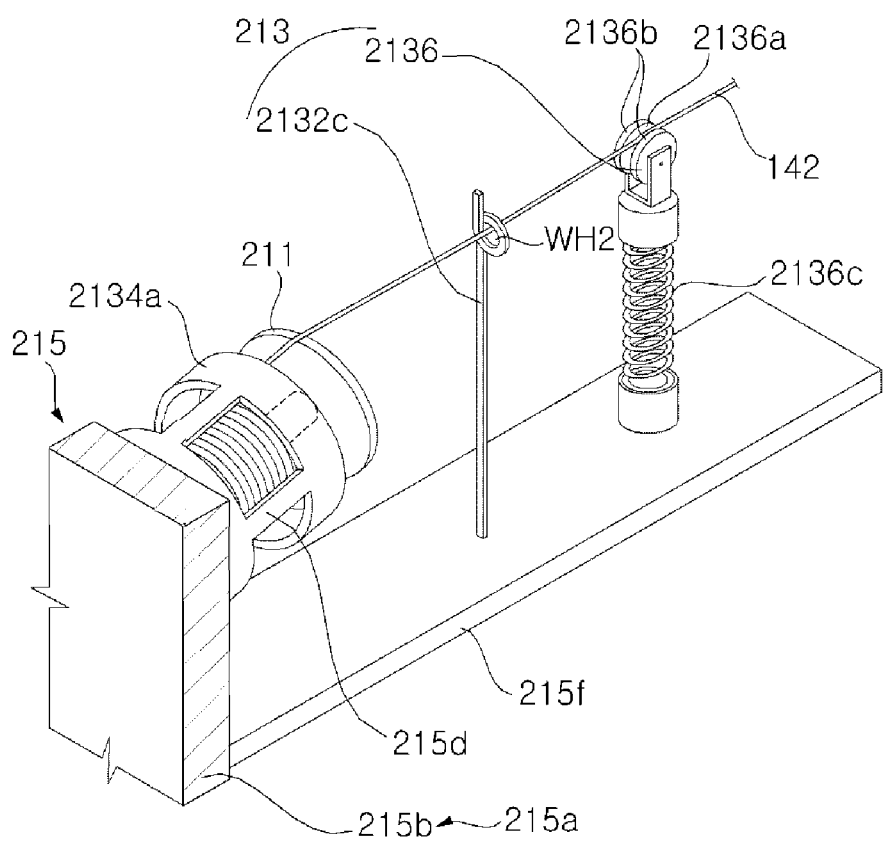
FIG. 16 is an exploded perspective view illustrating part of the interconnector supply unit included in the interconnector attachment apparatus for the solar cell panel according to another embodiment of the present inventive concept.

FIG. 16 is an exploded perspective view illustrating part of the interconnector supply unit included in the interconnector attachment apparatus for the solar cell panel according to another embodiment of the present inventive concept. For clear and simplified illustration, in FIG. 16, parts corresponding to FIG. 9 are illustrated, but the illustration of the alignment member 217 is omitted.

Referring to FIG. 16, in the present embodiment, the unwinding control member 213 may include a guide member 2132c having therein the interconnector passage hole WH2 (hereinafter referred to as a first guide member 2132c for distinction), and a separate guide member 2136 having a path 2136a, through one side of which the interconnector 142 passes (hereinafter referred to as a second guide member 2136 for distinction).

The first guide member 2132 is spaced apart from the winding roll 211 and has the interconnector passage hole WH2 therein. In one example, the present embodiment illustrates that the first guide member 2132 forms the interconnector passage hole WH2, through which the interconnector 142 passes, by bending a portion of a metal bar, a metal wire or the like. However, the present inventive concept is not limited thereto, and the first guide member 2132 may have, for example, any other shape and any other structure.

The second guide member 2136 may include a path portion 2136b, which has a circular plan shape and is provided with the path 2136a formed in a groove shape in the side surface thereof, and a support portion 2136c for supporting the path portion 2136b.

The area of the path portion 2136b may gradually decrease in an inward direction. In one example, the area of the path portion 2136b may gradually decrease moving inward from one outer surface and may then gradually increase toward the other outer surface, and may have the smallest area near the center of the path portion 2136b. In one example, the path portion 2136b may have a bi-conical shape. The path 2136a, in which the interconnector 142 is located, is formed in the portion of the path portion 2136b near the center, which has the smallest area. The path portion 2136b may be rotatably installed so as to be rotated in a given direction by the movement force of the interconnector 142 when the interconnector 142 moves, thereby preventing the interconnector 142 from being separated from the path 2136a and preventing the interconnector 142 from being damaged by the path portion 2136b. However, the present inventive concept is not limited thereto, and the path portion 2136b may not be rotated.

The support portion 2136c may serve to support the path portion 2136b and to fix the path portion 2136b to the guide fixing portion 215f. At this time, the support portion 2136c may be configured as an elastic member (e.g. a spring member) so as to elastically support the path portion 2136b. Thereby, the support portion 2136c may effectively prevent the interconnector 142 from being separated from the path 2136a or prevent the path portion 2136b from damaging the interconnector 142. However, the present inventive concept is not limited thereto, and the support portion 2136c may have no elasticity.

Figure 17:
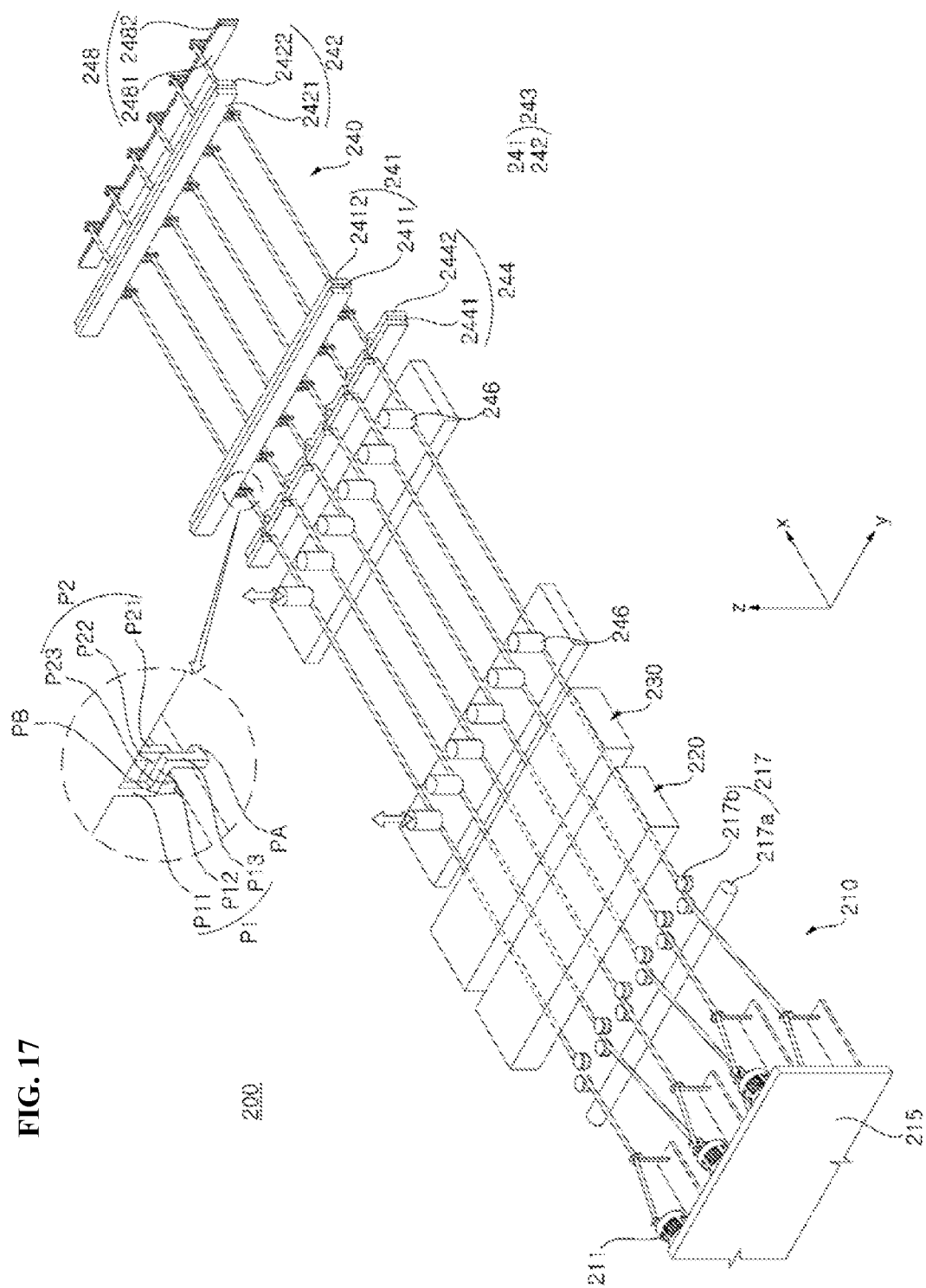
FIG. 17 is a view schematically illustrating the configuration of part of the interconnector attachment apparatus for the solar cell panel according to another embodiment of the present inventive concept.

FIG. 17 is a view schematically illustrating the configuration of part of the interconnector attachment apparatus for the solar cell panel according to another embodiment of the present inventive concept.

As illustrated in FIG. 17, in the present embodiment, in the state in which an interconnector fixing member 248 fixes the interconnector 142, which has moved in the processing direction by a predetermined length, the first and second fixing parts 241 and 242 of the jig 243 fix the interconnector 142 at the upper side of the interconnector fixing member 248 and move to the attachment unit 250.

The interconnector fixing member 248 may adopt any of various structures and any of various methods for fixing the interconnectors 142 at a predetermined position or for moving the interconnectors 142. In one example, in the present embodiment, the interconnector fixing member 248 may include a first part 2481 and a second part 2482, and the second part 2482 may move relative to the first part 2481 in the left-and-right direction (e.g. along the y-axis in FIG. 17), which is perpendicular to the direction in which the interconnector 142 extends. The first part 2481 may include a first clamp, which comes into close contact with one side of the interconnector 142, and a second clamp, which comes into close contact with the other side of the interconnector 142. The description related to the first and second clamps PA and PB of the first or second fixing part 241 or 242 or the first and second clamps PA and PB of the third fixing part 254 may be directly applied to the clamps of the first part 2481, and thus a detailed description thereof is omitted.

The interconnector fixing member 248 may be driven in various directions (e.g. along the x-axis, the y-axis and the z-axis in FIG. 17). In particular, the interconnector fixing member 248 may reciprocally move in the processing direction (along the x-axis in FIG. 17).

In the present embodiment, the interconnector fixing member 248 may move in the processing direction while clamping and holding the interconnector 142, thereby fixing one side of the interconnector 142 at a position spaced apart from the cutter 244 by a desired distance. At this time, the fixing member 246 may push the interconnector 142 so as to fix the position of the interconnector 142.

In this state, the first and second fixing parts 241 and 242 of the jig 243 approach the upper side of the interconnector 142. At this time, the first and second fixing parts 241 and 242 are spaced apart from each other by a predetermined distance between the fixing member 246 (or the cutter 244) and the interconnector fixing member 248. The first and second fixing parts 241 and 242 move downward to clamp and fix opposite ends of the interconnector 142, which is located between the fixing member 246 (or the cutter 244) and the interconnector fixing member 248, using the clamps PA and PB. That is, the first fixing part 241 fixes the interconnector 142 using the clamps PA and PB at a position close to the fixing member 246 or the cutter 244, and the second fixing part 242 fixes the interconnector 142 using the clamps PA and PB at a position close to the interconnector fixing member 248. In this state, when the interconnector 142 is cut using the cutter 244 and the interconnector fixing member 248 releases the interconnector 142, the interconnector 142 is fixed to the first and second fixing parts 241 and 242 to form an interconnector-jig coupling.

As described above, in the present embodiment, the interconnector fixing member 248 is provided in addition to the first and second fixing parts 241 and 242, thereby sharing the role of the first and second fixing parts 241 and 242. This may simplify the structure or driving of the interconnector attachment apparatus.

Figure 18:
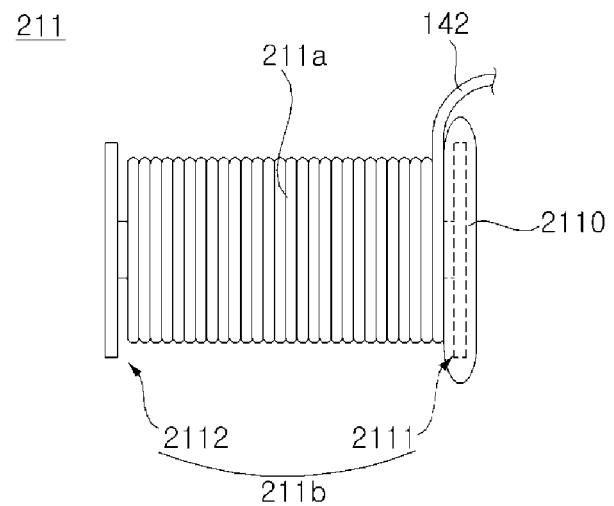
FIG. 18 is a side view illustrating each winding roll of the interconnector supply unit included in the interconnector attachment apparatus for the solar cell panel according to another embodiment of the present inventive concept.

FIG. 18 is a side view illustrating each winding roll of the interconnector supply unit included in the interconnector attachment apparatus for the solar cell panel according to another embodiment of the present inventive concept.

Referring to FIG. 18, the winding roll 211 may include the main body portion 211a, on which the interconnector 142 is located, and the end portion 211b, which is located on opposite ends of the main body portion 211a and prevents the interconnector 142 from being separated outward from the main body portion 211a. The end portion 211b may include a first end portion 2111, from which the interconnector 142 is unwound, and a second end portion 2112, which is located at the opposite side of the first end portion 2111.

At this time, the first end portion 2111, from which the interconnector 142 is unwound, may be shaped to have a rounded side surface. That is, the side surface (e.g. the circumferential surface of the first end portion 2111), through which the interconnector 142 passes, may be a convexly rounded surface. Thereby, when the interconnector 142 passes through the first end portion 2111, the interconnector 142 may be smoothly unwound along the rounded side surface, which may maximally prevent, for example, the interconnector 142 from becoming tangled.

In one example, the first end portion 2111 may be covered with a cap 2110, which is formed of an elastic material, such as, for example, rubber, or a resin (e.g. a silicon resin). This may minimize a shock that may be applied to the interconnector 142 when unwinding the interconnector 142. Although the present embodiment illustrates the cap 2110 that may be easily applied to the existing winding roll 211, the present inventive concept is not limited thereto. Thus, the end portion 211b of the winding roll 211 may be formed to have a rounded side surface.

FIG. 17 illustrates that the side surface of the second end portion 2112, which is at the opposite side of the first end portion 2111, is formed perpendicular to the outer surface of the second end portion 2112 and the opposite inner surface of the main body portion 211a. Thereby, the winding roll 211 of the present embodiment may be easily realized from a general winding roll by covering the first end portion 2111 with the cap 2110 or by changing only the structure of the first end portion 2111. However, the present inventive concept is not limited thereto, and the second end portion 2112 may have the same shape as the first end portion 2111.

The above description of the winding roll 211 may be directly applied to the other configurations of the main body portion 211a and the end portion 211b of the winding roll 211, and thus a detailed description thereto is omitted.

Figure 19:
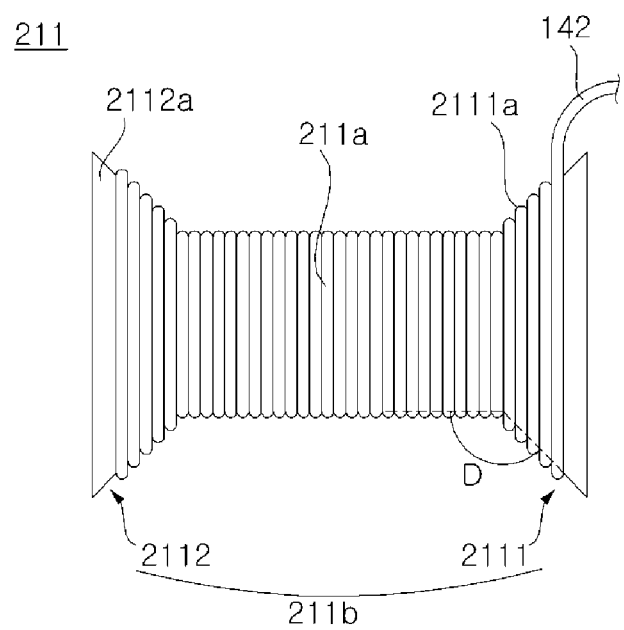
FIG. 19 is a side view illustrating each winding roll of the interconnector supply unit included in the interconnector attachment apparatus for the solar cell panel according to another embodiment of the present inventive concept.

FIG. 19 is a side view illustrating each winding roll of the interconnector supply unit included in the interconnector attachment apparatus for the solar cell panel according to another embodiment of the present inventive concept.

Referring to FIG. 19, the winding roll 211 may include the main body portion 211a, on which the interconnector 142 is located, and the end portion 211b, which is located on opposite ends of the main body portion 211a and prevents the interconnector 142 from being separated outward from the main body portion 211a. The end portion 211b may include the first end portion 2111, from which the interconnector 142 is unwound, and the second end portion 2112, which is located at the opposite side of the first end portion 2111.

At this time, slopes 2111a and 2112a, which have a conical or truncated conical shape, may be located respectively on ends of the end portions 2111 and 2112 close to the main body portion 211a. As such, when viewed in the cross section, the surfaces of the slopes 2111a and 2112a may be tilted (e.g. by an obtuse angle D) relative to the circumferential surface of the remaining portion excluding the slopes 2111a and 2112a. The winding roll 211 may generally have a bi-conical shape.

When the interconnector 142 is unwound from the slopes 2111a and 2112a, the slopes 2111a and 2112a may minimize variation in the unwinding angle of the interconnector 142 so as to prevent the interconnector 142 from undergoing rapid variation in angle when being unwound. Thereby, the interconnector 142 may be smoothly unwound from the end of the main body portion 211a along the surfaces of the slopes 2111a and 2111b, thereby preventing the interconnector 142 from becoming tangled.

Although FIG. 19 and the description thereof illustrate that the first and second end portions 2111 and 2112 may have a conical or truncated conical shape and thus may be freely used in an actual process, only the first end portion 2111 may have a conical or truncated conical shape and the second end portion 2112 may have any other shape. In one example, the second end portion 2112 may have a circular disc shape as in the other embodiments, and the inner surface of the second end portion 2112 may be located perpendicular to the circumferential surface of the main body portion 211a. Various other alterations are possible.

Figure 20:
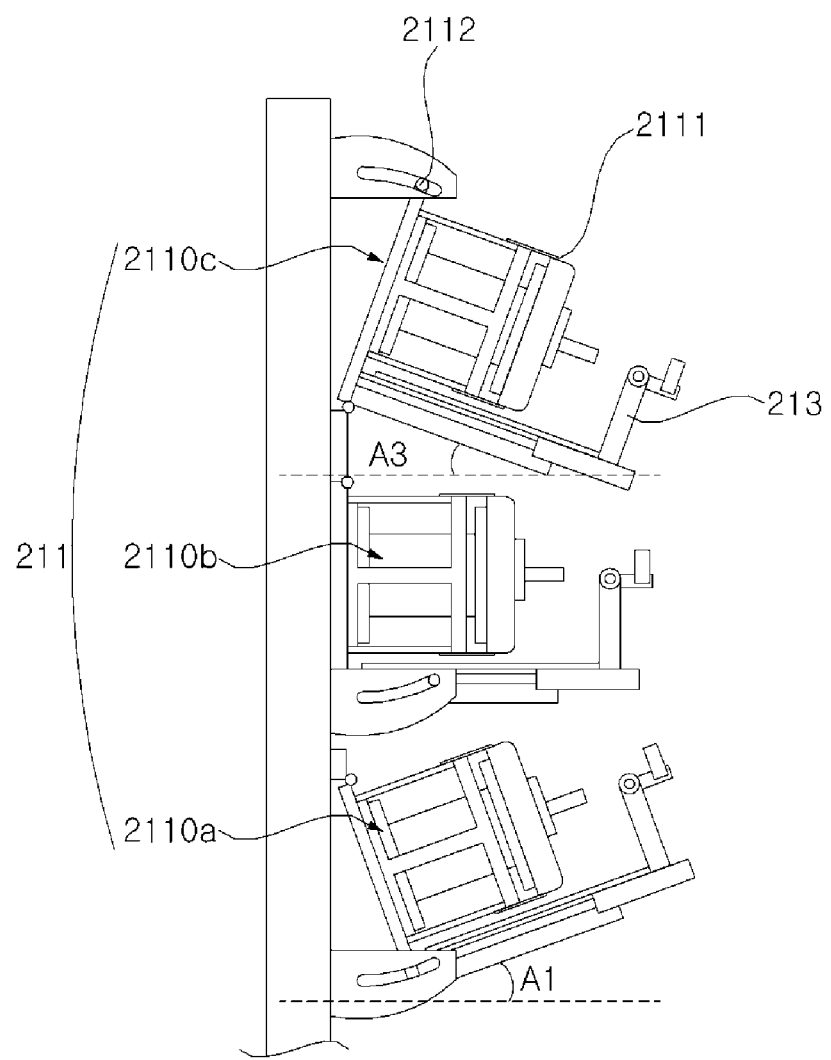
FIG. 20 is a side view illustrating the interconnector supply unit included in the interconnector attachment apparatus for the solar cell panel according to another embodiment of the present inventive concept.

FIG. 20 is a side view illustrating the interconnector supply unit included in the interconnector attachment apparatus for the solar cell panel according to another embodiment of the present inventive concept. For clear and simplified illustration, in FIG. 20, the illustration of the alignment member 217 is omitted.

Referring to FIG. 20, in the present embodiment, the winding rolls 211, which are located in different rows, may form different angles relative to the installation plane. For example, at least two of a first winding roll 2110a, which is located in a first row, which is the lowermost row in FIG. 20, a second winding roll 2110b, which is located in a second row above the first row, and a third winding roll 2110c, which is located in a third row above the second row, may have, for example, different angles and directions relative to the installation plane. The present embodiment illustrates that each of the first winding roll 2110a, the second winding roll 2110b and the third winding roll 2110c has, for example, a different angle and direction relative to the installation plane. Although FIG. 20 is a side view illustrating the first winding roll 2110a, the second winding roll 2110b and the third winding roll 2110c, each of which is provided in a number of 1, the first winding roll 2110a, the second winding roll 2110b, or the third winding roll 2110c in each row may be provided in a plural number.

For example, in the first winding roll 2110a, the longitudinal direction of the first winding roll 2110a may form an acute angle A1 relative to the installation plane, so that the first end portion 2111, from which the interconnector 142 is unwound, is located higher than the second end portion 2112, which is at the opposite side of the first end portion 2111. As such, the longitudinal direction of the first winding roll 2110a may be tilted to form an obtuse angle relative to the processing direction of the interconnector 142.

The longitudinal direction of the second winding roll 2110b may be parallel to the installation plane. The longitudinal direction of the second winding roll 2110b may be parallel to the processing direction of the interconnector 142.

In the third winding roll 2110c, the longitudinal direction of the third winding roll 2110c may form an acute angle A3 relative to the installation plane, so that the first end portion 2111 is located lower than the second end portion 2112, which is at the opposite side of the first end portion 2111. As such, the longitudinal direction of the third winding roll 2110c may be tilted to form an obtuse angle relative to the processing direction of the interconnector 142.

Thereby, when the winding rolls 211 are arranged in multiple rows, the interconnector 142 is unwound in the movement direction thereof, which may prevent the interconnector 142 from becoming tangled. When the winding rolls 211 are arranged in multiple rows (more particularly, in three or more rows), the winding rolls 211 may stably supply the interconnectors 142 in consideration of the difference between the vertical positions of the winding rolls 211 and the processing direction of the interconnector 142.

Although FIG. 20 illustrates that the first winding roll 2110a and the third winding roll 2110c are tilted in opposite directions and the second winding roll 2110b is parallel to the installation plane, the present inventive concept is not limited thereto. Thus, at least two of the first winding roll 2110a, the second winding roll 2110b and the third winding roll 2110c may be tilted in the same direction, but have a difference between the tilt angles thereof. For example, in the first to third winding rolls 2110a, 2110b and 2110c, when the first end portion 2111 is located higher than the second end portion 2112, the tilt angle of the second winding roll 2110b may be less than the tilt angle of the first winding roll 2110a, and the tilt angle of the third winding roll 2110c may be less than the tilt angle of the second winding roll 2110b.

Alternatively, in the first to third winding rolls 2110a, 2110b and 2110c, when the first end portion 2111 is located lower than the second end portion 2112, the tilt angle of the second winding roll 2110b may be greater than the tilt angle of the first winding roll 2110a, and the tilt angle of the third winding roll 2110c may be greater than the tilt angle of the second winding roll 2110b. Alternatively, the winding rolls 211 in some of the multiple rows may have the same tilt angle and direction, but may have a different tilt angle and direction from those in the other rows. Various other alterations are possible.

According to the interconnector attachment apparatus and method for the solar cell panel of the present embodiment, the interconnector may be unwound and attached to the solar cell in the state in which the yield strength of the interconnector is minimized. In addition, for example, the deformation and breakage of the interconnector may be prevented, which results in increased mass productivity.

In addition, the solar cell panel according to the present embodiment may minimize stress applied to the solar cell by the interconnector owing to the low yield strength of the interconnector, which may increase the structural stability and reliability of the solar cell panel.

Subsequently, the interconnector attachment apparatus for the solar cell panel according to a further embodiment of the present inventive concept will be described with reference to FIGS. 21 to 25.

Figure 21:
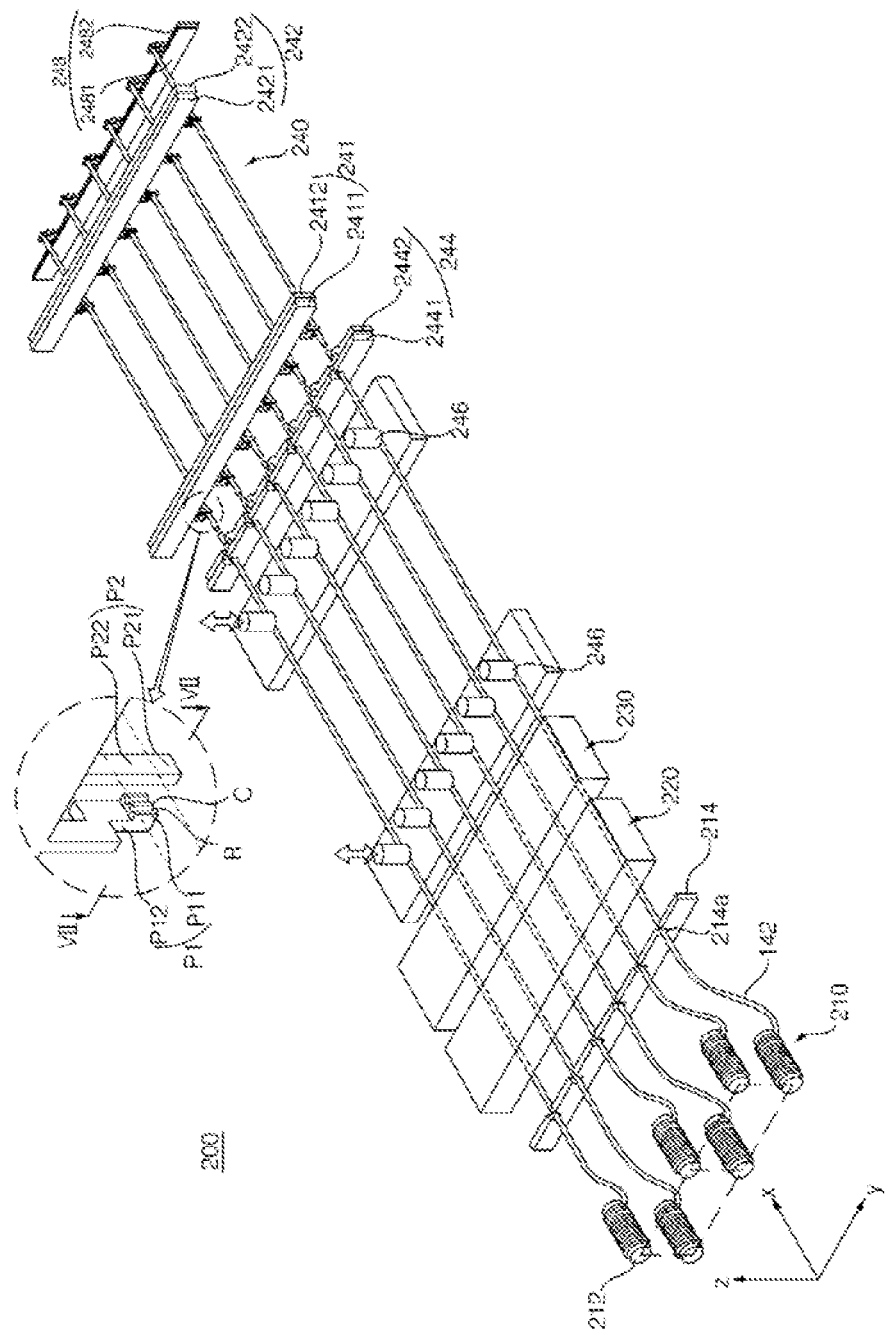
FIG. 21 is a view schematically illustrating the configuration of part of the interconnector attachment apparatus for the solar cell panel according to a further embodiment of the present inventive concept.
Figure 22:
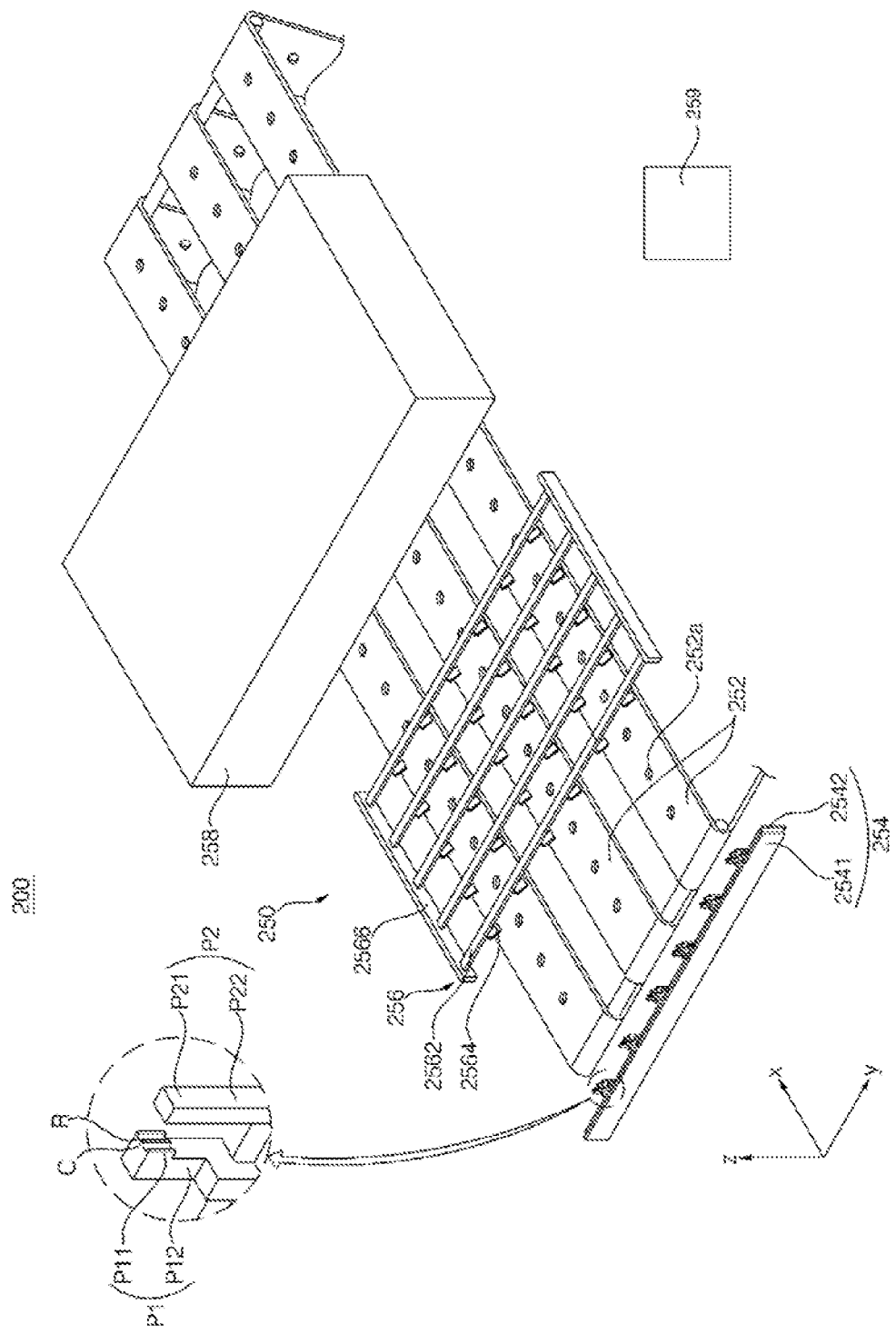
FIG. 22 is a view schematically illustrating the configuration of another part of the interconnector attachment apparatus for the solar cell panel according to the further embodiment of the present inventive concept.
Figure 23:
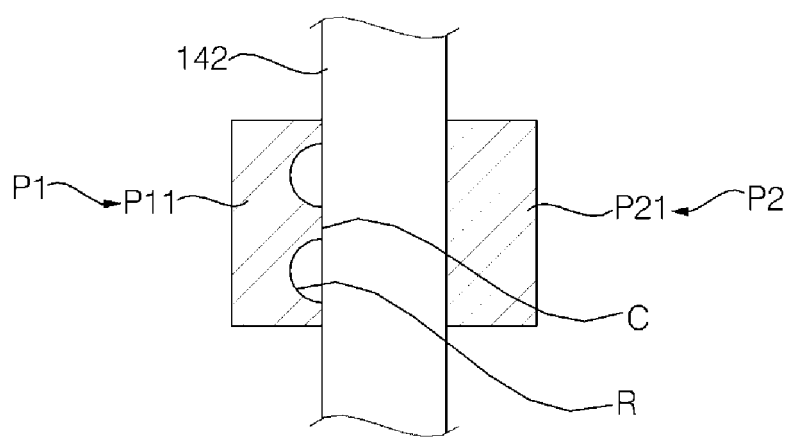
FIG. 23 is a sectional view taken along line VII-VII of FIG. 21.
Figure 24:
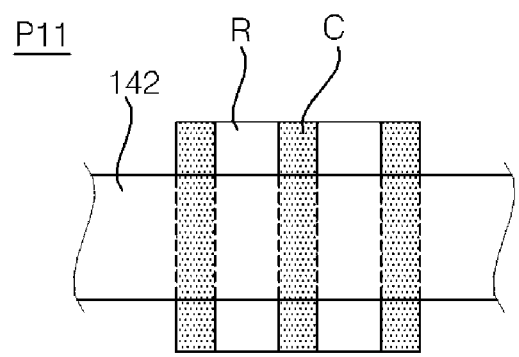
FIG. 24 is a side view illustrating a first contact portion and the interconnector in the interconnector attachment apparatus for the solar cell panel of FIG. 21.

FIG. 21 is a view schematically illustrating the configuration of part of the interconnector attachment apparatus for the solar cell panel according to a further embodiment of the present inventive concept. FIG. 22 is a view schematically illustrating the configuration of another part of the interconnector attachment apparatus for the solar cell panel according to the further embodiment of the present inventive concept. FIG. 23 is a sectional view taken along line VII-VII of FIG. 21. FIG. 24 is a side view illustrating a first contact portion and the interconnector in the interconnector attachment apparatus for the solar cell panel of FIG. 21. FIG. 25 is a side view illustrating the first contact portion and the interconnector in the interconnector attachment apparatus for the solar cell panel according to various alternative embodiments of the present inventive concept.

First, the jig 243, the interconnector fixing member 248, or the clamps P1 and P2 of the third fixing part 254 will be described in detail with reference to FIG. 21 and FIGS. 23 to 25. For example, with reference to FIG. 21 and FIGS. 23 to 25, the clamps P1 and P2 of the jig 243 will be described in detail, and then the interconnector fixing member 248 or the clamps P1 and P2 of the third fixing part 254 will be described.

FIG. 23 is a sectional view taken along line VII-VII of FIG. 21. FIG. 24 is a side view illustrating a first contact portion and the interconnector in the interconnector attachment apparatus for the solar cell panel of FIG. 21.

Referring to FIGS. 21, 23 and 24, the clamps P1 and P2 clamp each interconnector 142 so that the interconnector 142 is fixed at a predetermined position or is movable.

In one example, in the present embodiment, the first fixing part 241 may include the first part 2411 and the second part 2412, and the second part 2412 may move relative to the first part 2411 in the left-and-right direction (e.g. the y-axis in the drawings), which is perpendicular to the processing direction of the interconnectors 142. The first part 2411 includes a first clamp P1, which corresponds to each interconnector 142 and is located on and comes into contact with one side of the interconnector 142. The second part 2412 includes a second clamp P2, which corresponds to each interconnector 142 and is located on and comes into contact with the other side of the interconnector 142. As such, the second clamp P2 corresponds to the first clamp P1 on the other side of the interconnector 142, which is at the opposite side of the first clamp P1. As such, the interconnector 142 may be stably fixed between the first clamp P1 and the second clamp P2 when the first clamp P1 and the second clamp P2 apply force to the interconnector 142 located therebetween.

In one example, the first clamp P1 includes a first contact portion P11, which comes into contact with one side of the interconnector 142, and a first connection portion P12, which connects the first part 2411 and the first contact portion P11 to each other. At this time, the first contact portion P11 may protrude from the first connection portion P12 toward the second clamp P2 (or the interconnector 142). That is, the surface of the first contact portion P11, which is close to the second clamp P2, may protrude further toward the second clamp P2 than the surface of the first connection portion P12, which is close to the second clamp P2. Thereby, only the first contact portion P11 may come into contact with the interconnector 142, and force to be applied to the interconnector 142 may be concentrated, which may allow the interconnector 142 to be stably clamped.

The second clamp P2 includes a second contact portion P21, which comes into contact with the other side of the interconnector 142, and a second connection portion P22, which connects the second part 2412 and the second contact portion P12 to each other. The second contact portion P21 may be formed so as to be opposite the first contact portion P11 with the interconnector 142 interposed therebetween. That is, the first contact portion P11 and the second contact portion P21 may be located on opposite sides of a specific portion of the interconnector 142. The drawing illustrates that the second clamp P2 linearly extends downward and that the first connection portion P12 of the first clamp P1 extends in the longitudinal direction of the interconnector 142 so as to be located close to the second clamp P2 or the second part 2412, and subsequently is bent so as to extend downward. However, the present inventive concept is not limited thereto, and the first contact portion P11 and the second contact portion P21 may adopt any of various structures, methods, or shapes so as to be opposite each other.

In the state in which the interconnector 142 is located between the first clamp P1 and the second clamp P2, the first part 2411 and/or the second part 2412 may move to reduce the distance between the first clamp P1 and the second clamp P2 until the first clamp P1 and the second clamp P2 come into close contact with opposite sides of the interconnector 142. Thereby, the interconnector 142 may be stably fixed between the first clamp P1 and the second clamp P2. Contrary, when the first part 2411 and/or the second part 2412 move to increase the distance between the first clamp P1 and the second clamp P2 so that the distance between the first clamp P1 and the second clamp P2 becomes greater than the width or diameter of the interconnector 142, the interconnector 142 may be stably separated or released from the first clamp P1 and the second clamp P2.

At this time, in the present embodiment, the first contact portion P11 may have a recess R, which is formed so as to be spaced further apart from the second clamp P2 (for example, from the second contact portion P12) than a contact C. The recess R serves to reduce the area of the contact C in the first contact portion P11, which actually comes into contact with the interconnector 142. Thereby, the force applied to the interconnector 142 by the first contact portion P11 is concentrated on the contact C, which may increase the pressure (or stress) for clamping the interconnector 142. This is because the pressure may increase when the area is reduced under the application of the same amount of force.

The surface of the recess R, which is close to the second clamp P2 (or the interconnector 142), is spaced further apart from the second clamp P2 than the surface of the contact C, which is close to the second clamp P2, and the shape of the recess R is not limited thereto. Thus, the surface of the recess R that is close to the second clamp P2 may have any of various shapes including a curved surface, or a plurality of flat surfaces or slopes, and may have any of various shapes including semicircular, rectangular, and triangular shapes when viewed in cross section. When the surface (e.g. an inner surface) of the recess R that is close to the first clamp P1 is curved, the recess R has no portion on which the pressure is concentrated, and thus may have a stabilized structure. In one example, when viewed in cross section, the surface of the recess R that is close to the first clamp P1 may have an arc shape.

In addition, the contact C may be configured as a flat surface having a smaller curvature, a smaller bend, or a smaller slope than the recess R. Thereby, the force applied to the interconnector 142 may be sufficiently transferred to the contact C, and for example, damage to or deformation of the interconnector 142 due to the contact C may be prevented.

At this time, the ratio of the area of the contact C relative to the first contact portion P11 may range from 10% to 70%. When the ratio is below 10%, the area of the contact C may be too small to stably clamp the interconnector 142. When the ratio exceeds 70%, the area of the contact C is increased, causing force to be concentrated on the contact C, which may result in an insufficient increase in clamping pressure force.

A plurality of contacts C (e.g. two or more contacts) may be provided in the longitudinal direction of each interconnector 142 so as to come into contact with the interconnector 142, or may be located on opposite sides of at least one recess R interposed therebetween in the longitudinal direction of the interconnector 142. This is because the contact C may have difficulty in stably catching the interconnector 142 when only one contact C is provided or when the contact C is provided on only one side of the recess R. In one example, when three or more contacts C are provided in the longitudinal direction of the interconnector 142 so as to come into contact with the interconnector 142, the interconnector 142 may be more stably fixed. For example, when the contact C is located on either end of the first contact portion P11 and when one contact or a plurality of contacts C is provided on the center axis of the first contact portion P11, the interconnector 142 may be stably fixed.

Although the maximum number of contacts C that come into contact with the interconnector 142 is not limited, when the number of contacts C is ten or more, the area of one contact C is reduced, and thus the contact C may have difficulty in stably clamping the interconnector 142. In one example, the number of contacts C may range from three to five. However, the present inventive concept is not limited thereto.

In the present embodiment, the recess R is formed in the direction in which the interconnector 142 extends, or in the direction crossing the processing direction. When the recess R is formed in the direction parallel to the direction in which the interconnector 142 extends, the recess R may not transfer force for clamping the interconnector 142, which may prevent the interconnector 142 from being stably clamped. In particular, when the interconnector 142 has a rounded shape or a circular cross section as in the present embodiment, no contact may be located on the portion at which the interconnector 142 is located due to processing error or the like, which may cause the interconnector 142 to be unintentionally easily released. On the other hand, when the recess R is formed in the direction crossing the direction in which the interconnector 142 extends, even if the vertical position (e.g. the position in the z-axis of the drawing) of the interconnector 142 that comes into contact with the contact C slightly varies due to processing error or the like, a portion of the contact C may come into contact with the interconnector 142, and thus the interconnector 142 may be stably clamped. At this time, because the recess R may be elongated perpendicular to the direction in which the interconnector 142 extends, the recess R and the contact C may be stably formed.

As described above, when the recess R is elongated across both ends of the first contact portion P11 in the direction perpendicular to the direction in which the interconnector 142 extends or the processing direction, even if the vertical position of the interconnector 142 varies, the interconnector 142 may be stably clamped. Therefore, the ratio of the area of the contact C may be reduced so that the force applied to the interconnector 142 is concentrated on the contact C, which may ensure more effective clamping. Accordingly, in this case, the area of the contact C may be less than the area of the recess R in the first contact portion P11. The ratio of the area of the contact C relative to the first contact portion P11 may range from 10% to 45% (for example, from 10% to 30%). When the ratio is 45% or less (for example, 30% or less), the force applied to the interconnector 142 may be concentrated on the contact C so that the interconnector 142 may be more effectively clamped.

Various examples of the first contact portion P11 having the recess R will now be described with reference to FIG. 25. FIG. 25 is a side view illustrating the first contact portion P11 and the interconnector 142 in the interconnector attachment apparatus 200 for the solar cell panel 100 according to various alternative embodiments of the present inventive concept. For simplified illustration, in FIG. 25, only the first contact portion P11 and the interconnector 142 are illustrated.

As illustrated in (a) of FIG. 25, a plurality of recesses R may be longitudinally arranged side by side in a direction that is inclined relative to the direction in which the interconnector 142 extends or relative to the processing direction.

Alternatively, as illustrated in (b) of FIG. 25, a plurality of recesses R may be inclined at different first and second angles relative to the direction in which the interconnector 142 extends or relative to the processing direction, and may cross each other.

Alternatively, as illustrated in (c) of FIG. 25, a plurality of recesses R may take the form of islands that are spaced apart from one another. Even in this case, the interconnector 142 comes into contact with contacts C, which are located on opposite sides of the recess R interposed therebetween, in the longitudinal direction of the interconnector 142. Thereby, the contacts C may stably clamp the interconnector 142 even if they are integrally connected to one another in a portion excluding the recesses R.

Alternatively, as illustrated in (d) of FIG. 25, an integrally formed single recess R may be provided. Even in this case, the interconnector 142 comes into contact with contacts C, which are located on opposite sides of the recess R interposed therebetween, in the longitudinal direction of the interconnector 142. Thereby, the interconnector 142 may be stably clamped even if one recess R is provided.

The recess R may have any of various other plan shapes.

Referring again to FIGS. 21, 23 and 24, the second contact portion P21 may be configured as a flat surface having a smaller curvature, a smaller bend, or a smaller slope than the first contact portion P11. Thereby, when the interconnector 142 is clamped by the first contact portion P11 having the recess R and the second contact portion P21, the second contact portion P21 may stably come into contact with one side of the interconnector 142, and in this state, the other side of the interconnector 142 may apply pressure to the interconnector 142 in the state in which force is concentrated on a contact C of the second contact portion P21. That is, when the first contact P11 having the recess R and the second contact portion P21 having only a flat surface are used together, stability may be improved. In addition, damage to or deformation of the interconnector 142 in the second contact portion P21 may be prevented.

The drawings illustrate the clamps P1 and P2 provided on the first fixing part 241 by way of example. The description related to the first part 2411, the second part 2412, and the clamps P1 and P2 of the first fixing part 241 may be directly applied to the first part 2421, the second part 2422, and the clamps of the second fixing part 242, and thus, a detailed description thereof will be omitted.

As illustrated in the enlarged circle of FIG. 22, with the exception that clamps P1 and P2 of the third fixing part 254 protrude upward from the first part 2541 and the second part 2542 of the third fixing part 254, the description related to the first part 2411, the second part 2412, and the clamps P1 and P2 of the first fixing part 241 may be directly applied to the first and second parts 2541 and 2542 and the clamps P1 and P2 of the third fixing part 254. Similarly, the description related to the first part 2411, the second part 2412, and the clamps P1 and P2 of the first fixing part 241 may be directly applied to the first and second parts 2481 and 2482 of the interconnector fixing member 248.

In addition, the above description and the drawings illustrate that the clamps P1 and P2 protrude downward from the first and second fixing parts 241 and 242 and the clamps P1 and P2 protrude upward from the third fixing part 254 and the interconnector fixing member 248. Thereby, in the first, second and third fixing parts 241, 242 and 243 and the interconnector fixing member 248, which constitute the jig 243, the clamps P1 and P2 may be vertically symmetrical to each other. However, the present inventive concept is not limited thereto, and the direction in which the clamps P1 and P2 protrude from the jig 243, the third fixing part 254 and the interconnector fixing member 248 is not limited thereto.

In addition, the drawings illustrate that all of the first, second and third fixing parts 241, 242 and 243 and the interconnector fixing member 248, which constitute the jig 243, include the clamps P1 and P2 having the shape or structure described above. However, the present inventive concept is not limited thereto. Thus, at least one of the first, second and third fixing parts 241, 242 and 243 and the interconnector fixing member 248, which constitute the jig 243, may have the clamps P1 and P2 having the shape or structure described above, and the other clamps may have different shapes.

According to the interconnector attachment apparatus 200 of the present embodiment, the interconnector 142 having a rounded portion may be attached to the solar cell 150 using an automated system. At this time, the first contact portion P11 of the clamps P1 and P2 of the fixing parts 241, 242 and 254 or the interconnector fixing member 248 for fixing the interconnector 142 may have the recess R therein in order to maximize the amount of pressure that is applied to the interconnector 142, thereby stably clamping the interconnector 142. Thereby, the productivity of the interconnector attachment apparatus 200 may be improved by preventing, for example, defects and processing delay, which may occur when the interconnector 142 is unintentionally released at the time of attachment of the interconnector 142.

The above described features, configurations, effects, and the like are included in at least one of the embodiments of the present inventive concept, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the inventive concept as disclosed in the accompanying claims.

What is claimed is:

1. An apparatus for attaching an interconnector of a solar cell panel, the apparatus comprising:
    an interconnector supply unit for unwinding the interconnector wound around a winding roll and moving the interconnector in a processing direction; and
    an attachment unit for attaching the interconnector to a solar cell,
    wherein the interconnector supply unit includes:
    the winding roll, around which the interconnector is wound; and
    an unwinding control member for unwinding the interconnector from the winding roll,
    wherein the unwinding control member allows the interconnector to be unwound so as to pass through one end of the winding roll in a longitudinal direction, and
    wherein the winding roll includes a plurality of winding rolls, the interconnector includes a plurality of interconnectors, and the plurality of winding rolls for the plurality of interconnectors are spaced apart from one another by a constant distance in a same plane.

2. The apparatus according to claim 1, wherein at least one winding roll includes a main body portion, on which one interconnector is located, and an end portion located on each of opposite ends of the main body portion in the longitudinal direction so that the one interconnector is not separated outward.

3. The apparatus according to claim 1, wherein the unwinding control member includes a rotating member, which is fixed adjacent to the at least one winding roll, has an interconnector passage hole, through which one interconnector passes, and rotates in a direction opposite a direction in which the one interconnector is wound.

4. The apparatus according to claim 3, wherein the rotating member includes a rotatable fixing portion and an extension protruding outward from the rotatable fixing portion, the extension having therein the interconnector passage hole, and
wherein the interconnector passage hole is located outside an outer edge of the at least one winding roll.

5. The apparatus according to claim 1, further comprising:
an outer fixing piece for surrounding at least a portion of an exterior of at least one winding roll; and
a stopper member extending from the outer fixing piece so as to be located over an end portion of the at least one winding roll.

6. The apparatus according to claim 1, wherein at least one winding roll includes a main body portion, around which one interconnector is wound, a first end portion located on one side of the main body portion so that the one interconnector is unwound from the first end portion, and a second end portion located on a remaining side of the main body portion, which is at an opposite side of the first end portion, and
wherein the second end portion has a rounded side surface, or the main body portion has a side surface that is adjacent to the second end portion and is tilted to form an obtuse angle relative to the main body portion.

7. The apparatus according to claim 1, wherein the unwinding control member includes a guide member spaced apart from at least one winding roll by a predetermined distance, the guide member having an interconnector passage hole, through which one interconnector passes, or a path through which the one interconnector moves.

8. The apparatus according to claim 7, wherein the guide member includes a first guide member spaced apart from the at least one winding roll by a predetermined distance, the first guide member having therein the interconnector passage hole, through which the one interconnector passes, and a second guide member having the path through which the one interconnector moves.

9. The apparatus according to claim 1,
wherein the apparatus further comprises an alignment member for causing a plurality of interconnectors, unwound from the respective winding rolls by the unwinding control member.

10. The apparatus according to claim 9, wherein the alignment member includes a transfer roll for rotating in a state in which the plurality of interconnectors unwound from the plurality of winding rolls are placed thereon so as to allow the plurality of interconnectors to be arranged in the same plane, and a spacer for causing the plurality of interconnectors that have passed through the transfer roll to move through a side surface thereof so as to be spaced apart from one another by a predetermined distance.

11. The apparatus according to claim 1, wherein the plurality of winding rolls form a plurality of rows, and
wherein the plurality of winding rolls, located in at least two of the plurality of rows, have at least one of different tilt angles and directions relative to an installation plane of the same plane.

12. The apparatus according to claim 1, wherein, in the interconnector supply unit, at least one winding roll is fixed without rotation and is unwound in a direction opposite a direction in which the one interconnector is wound.

13. The apparatus according to claim 1, further comprising a fixing frame as the same plane on which the plurality of winding rolls are seated at the constant distance from each other,
wherein an axis of rotation of each winding roll is arranged to intersect the same plane of the fixing frame.

14. An apparatus for attaching an interconnector of a solar cell panel, the apparatus comprising:
an interconnector supply unit for unwinding the interconnector wound around a winding roll and moving the interconnector in a processing direction;
an attachment unit for attaching the interconnector to a solar cell;
an outer fixing piece for surrounding at least a portion of an exterior of the winding roll; and
a stopper member extending from the outer fixing piece so as to be located over an end portion of the winding roll,
wherein the interconnector supply unit includes:
the winding roll, around which the interconnector is wound; and
an unwinding control member for unwinding the interconnector from the winding roll, and
wherein the unwinding control member allows the interconnector to be unwound so as to pass through one end of the winding roll in a longitudinal direction.

15. An apparatus for attaching an interconnector of a solar cell panel, the apparatus comprising:
an interconnector supply unit for unwinding the interconnector wound around a winding roll and moving the interconnector in a processing direction; and
an attachment unit for attaching the interconnector to a solar cell,
wherein the interconnector supply unit includes:
the winding roll, around which the interconnector is wound; and
an unwinding control member for unwinding the interconnector from the winding roll, and
wherein the unwinding control member allows the interconnector to be unwound so as to pass through one end of the winding roll in a longitudinal direction,
wherein the unwinding control member includes a guide member spaced apart from the winding roll by a predetermined distance, the guide member having an interconnector passage hole, through which the interconnector passes, or a path through which the interconnector moves, and
wherein the guide member includes a first guide member spaced apart from the winding roll by a predetermined distance, the first guide member having therein the interconnector passage hole, through which the interconnector passes, and a second guide member having the path through which the interconnector moves.

* * * * *